(12) United States Patent
Kim et al.

(10) Patent No.: US 8,976,052 B2
(45) Date of Patent: Mar. 10, 2015

(54) MULTIPLE DATA RATE COUNTER, DATA CONVERTER INCLUDING THE SAME, AND IMAGE SENSOR INCLUDING THE SAME

(75) Inventors: Kyung-Min Kim, Suwon-si (KR); Kyoung-Min Koh, Hwaseong-si (KR); Yoon-Seok Han, Ulsan (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 926 days.

(21) Appl. No.: 12/653,945

(22) Filed: Dec. 21, 2009

(65) Prior Publication Data

US 2011/0074968 A1 Mar. 31, 2011

(30) Foreign Application Priority Data

Sep. 25, 2009 (KR) .................. 10-2009-0091132

(51) Int. Cl.
| | |
|---|---|
| *H04N 5/335* | (2011.01) |
| *H03K 23/00* | (2006.01) |
| *H03K 23/50* | (2006.01) |
| *H04N 5/378* | (2011.01) |
| *H03K 23/58* | (2006.01) |

(52) U.S. Cl.
CPC .............. *H04N 5/378* (2013.01); *H03K 23/58* (2013.01)
USPC ........... 341/155; 377/116; 377/118; 377/119; 341/166; 348/308

(58) Field of Classification Search
CPC ................................ H04N 5/378; G06F 9/3869
USPC ........... 341/166, 55, 164, 168, 169; 377/116, 377/44–46, 118–126, 166; 348/308
See application file for complete search history.

(56) References Cited

U.S. PATENT DOCUMENTS

| | | | | |
|---|---|---|---|---|
| 4,521,898 | A * | 6/1985 | Akram .......................... | 377/116 |
| 7,129,883 | B2 * | 10/2006 | Muramatsu et al. .......... | 341/164 |
| 7,629,914 | B2 | 12/2009 | Muramatsu et al. .......... | 341/164 |
| 7,952,510 | B2 | 5/2011 | Shimomura et al. .......... | 341/164 |
| 8,115,845 | B2 * | 2/2012 | Koh et al. ..................... | 348/303 |
| 8,330,635 | B2 | 12/2012 | Hisamatsu .................... | 341/155 |
| 2005/0242849 | A1 * | 11/2005 | Muramatsu et al. .......... | 327/151 |
| 2009/0060118 | A1 * | 3/2009 | Koh ................................ | 377/42 |
| 2009/0167586 | A1 * | 7/2009 | Shimomura et al. .......... | 341/169 |
| 2009/0195682 | A1 * | 8/2009 | Koh et al. ..................... | 348/308 |
| 2010/0194949 | A1 * | 8/2010 | Hisamatsu .................... | 348/302 |
| 2010/0207798 | A1 * | 8/2010 | Lim et al. ..................... | 341/155 |
| 2010/0225796 | A1 * | 9/2010 | Lim et al. ..................... | 348/308 |

OTHER PUBLICATIONS

Korean Patent Application No. 1019990024782 to Hong, having Publication date of Jan. 15, 2001 (w/English Abstract page).
Japanese Patent Application No. 2000-115820 to Tetsuya, having Publication date of Oct. 26, 2001 (w/English Abstract page).

(Continued)

*Primary Examiner* — Gary C Vieaux
(74) *Attorney, Agent, or Firm* — Monica H. Choi

(57) ABSTRACT

A counter includes a buffer unit and a ripple counter. The buffer unit generates at least one least significant signal of a count by buffering at least one clock signal until a termination time point. The ripple counter generates at least one most significant signal of the count by sequentially toggling in response to at least one of the least significant signal. The counter performs multiple data rate counting with enhance operation speed and reduced power consumption.

30 Claims, 47 Drawing Sheets

(56) References Cited

OTHER PUBLICATIONS

Japanese Patent Application No. 2005-011080 to Taiji et al., having Publication date of Aug. 3, 2006 (w/English Abstract page).
Japanese Patent Application No. 2007-092177 to Tomonori et al., having Publication date of Oct. 16, 2008 (w/English Abstract page).
Japanese Patent Publication No. 2005-311933 to Muramatsu et al., having Publication date of Apr. 11, 2005 (w/English Abstract page).
Japanese Patent Publication No. 2009-089066 to Hisamatsu, having Publication date of Apr. 23, 2009 (w/English Abstract page).
Japanese Patent Publication No. 2009-159331 to Shimomura et al., having Publication date of Jul. 16, 2009 (w/English Abstract page).

* cited by examiner

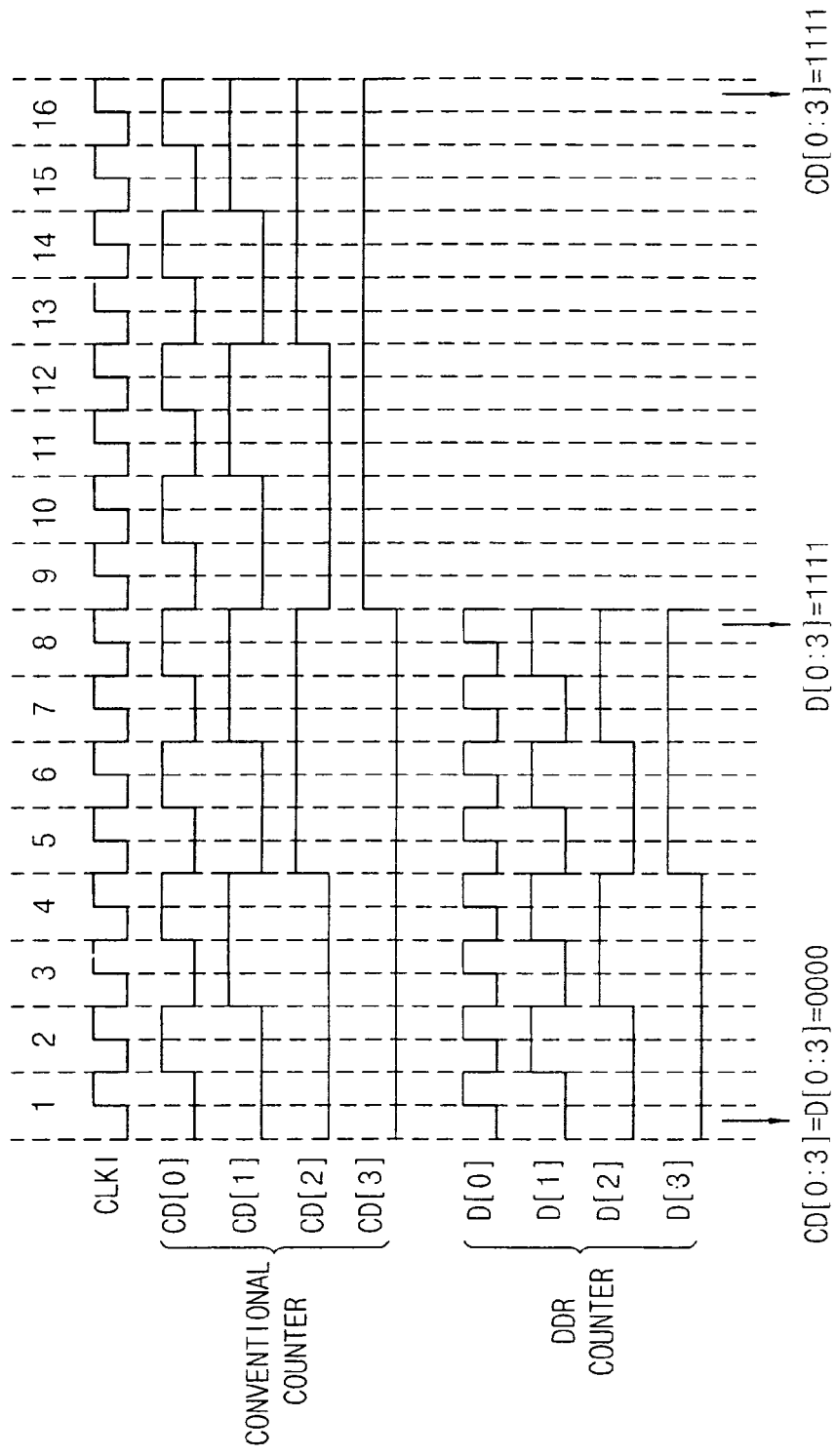

| TOGGLING NUMBER | CD[0] 15 | CD[1] 7 | CD[2] 3 | CD[3] 1 | TOTAL 26 |
|---|---|---|---|---|---|
| | D0 8 | D[1] 7 | D[2] 3 | D[3] 1 | TOTAL 19 |

FIG. 25
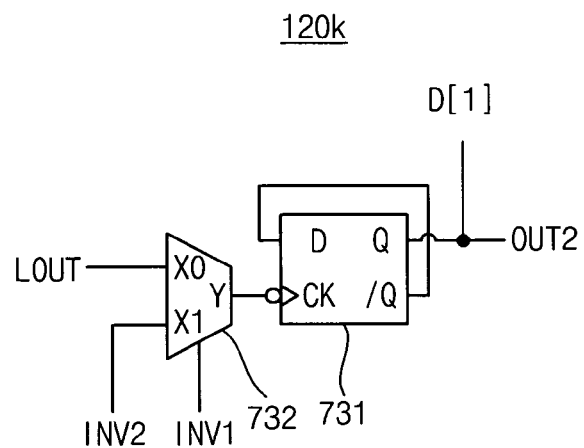
FIG. 26
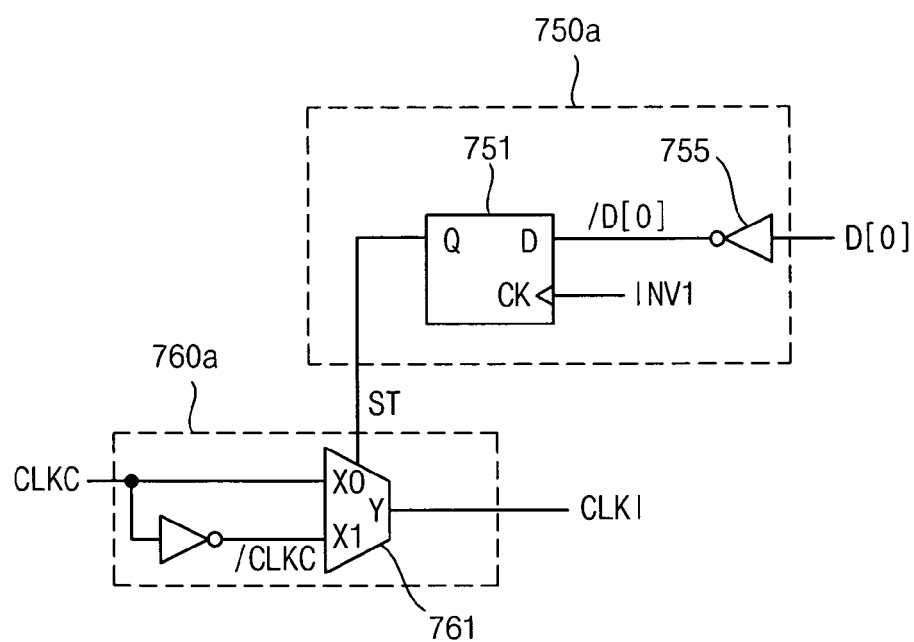
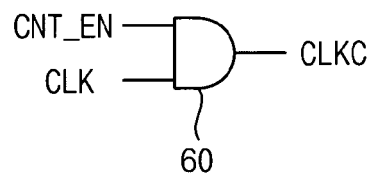

| 1ST COUNT RESULT | | INVERSION RESULT | | 1ST EDGE COUNTING OF 2ND COUNT | | 2ND EDGE COUNTING OF 2ND COUNT | |
|---|---|---|---|---|---|---|---|
| D[1] | D[0] | D[1] | D[0] | D[1] | D[0] | D[1] | D[0] |
| 0 | 0 | 1 | 1 | 0 | 0 | 0 | 1 |
| 0 | 1 | 1 | 0 | 1 | 1 | 0 | 0 |
| 1 | 0 | 0 | 1 | 1 | 0 | 1 | 1 |
| 1 | 1 | 0 | 0 | 0 | 1 | 1 | 0 |

| DOWN COUNT RESULT | | 1ST EDGE COUNTING OF UP COUNT | | 2ND EDGE COUNTING OF UP COUNT | |
|---|---|---|---|---|---|
| D[1] | D[0] | D[1] | D[0] | D[1] | D[0] |
| 0 | 0 | 0 | 1 | 1 | 0 |
| 1 | 1 | 0 | 0 | 0 | 1 |
| 1 | 0 | 1 | 1 | 0 | 0 |
| 0 | 1 | 1 | 0 | 1 | 1 |

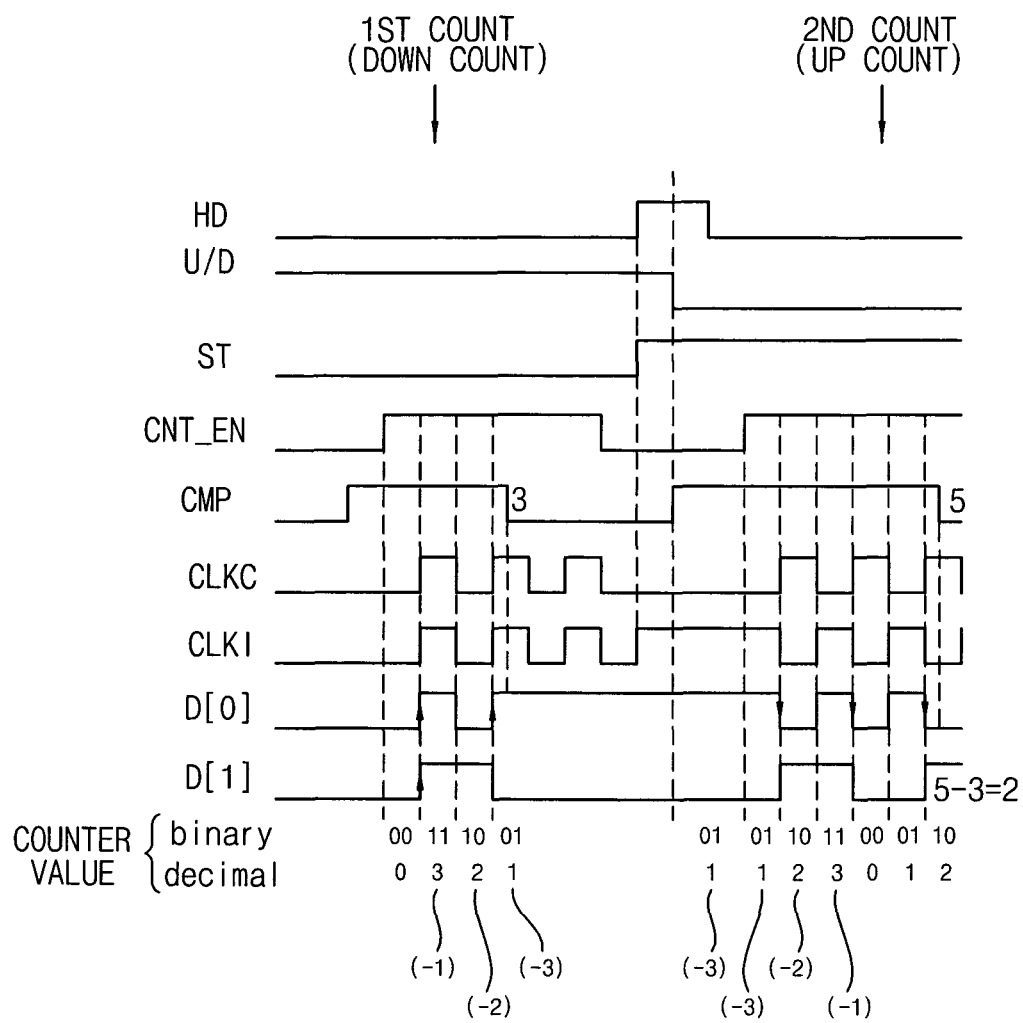

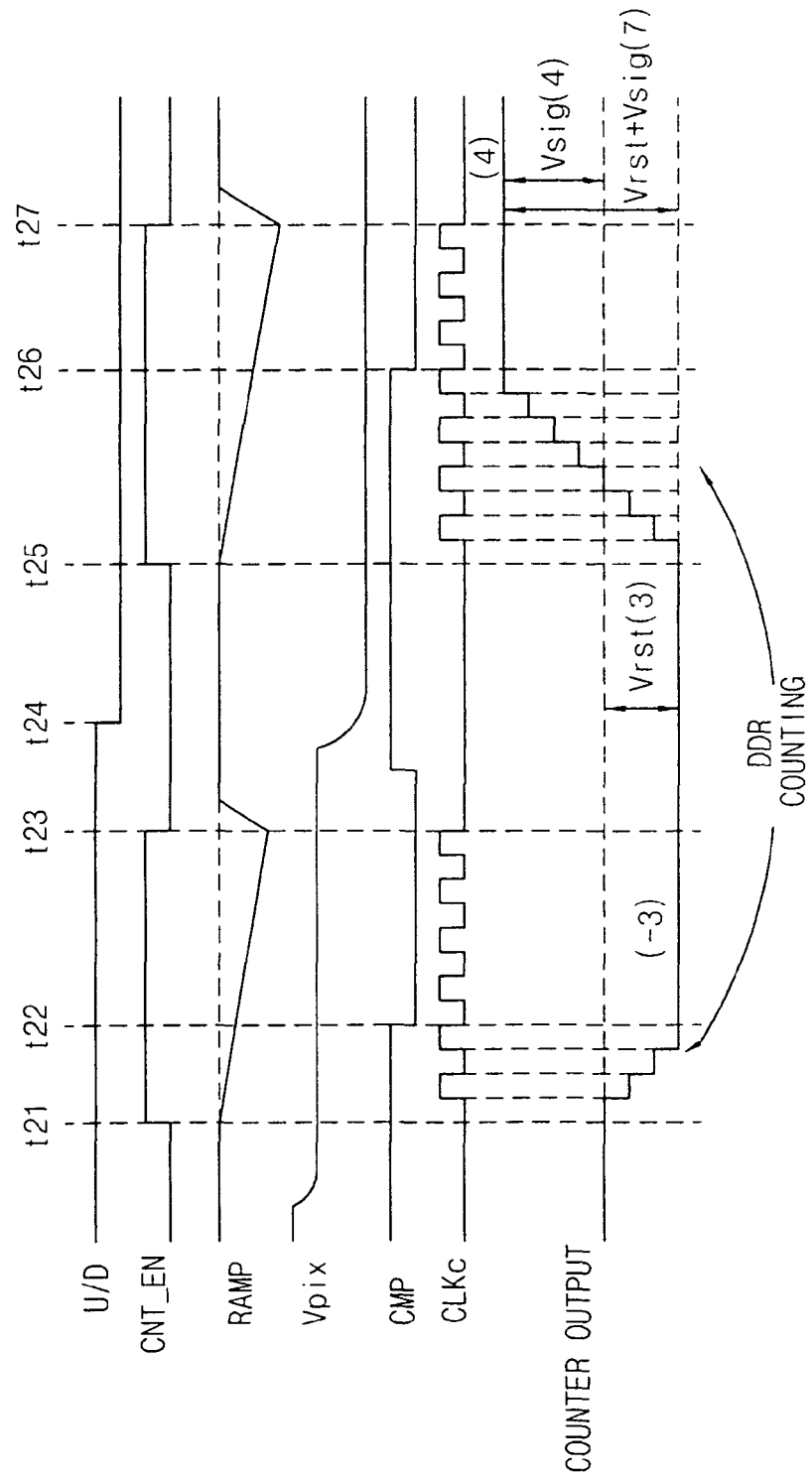

| 1ST COUNT RESULT | | | INVERSION RESULT | | | 1ST EDGE COUNTING OF 2ND COUNT | | | 2ND EDGE COUNTING OF 2ND COUNT | | |
|---|---|---|---|---|---|---|---|---|---|---|---|
| D[1] | D[0] | D0 | D[1] | D[0] | D0 | D[1] | D[0] | D0 | D[1] | D[0] | D0 |
| 0 | 0 | 0 | 1 | 1 | 0 | 0 | 0 | 0 | 0 | 1 | 1 |
| 0 | 1 | 1 | 1 | 0 | 1 | 1 | 1 | 0 | 0 | 0 | 0 |
| 1 | 0 | 1 | 0 | 1 | 1 | 1 | 0 | 1 | 1 | 1 | 0 |
| 1 | 1 | 0 | 0 | 0 | 0 | 0 | 1 | 1 | 1 | 0 | 1 |

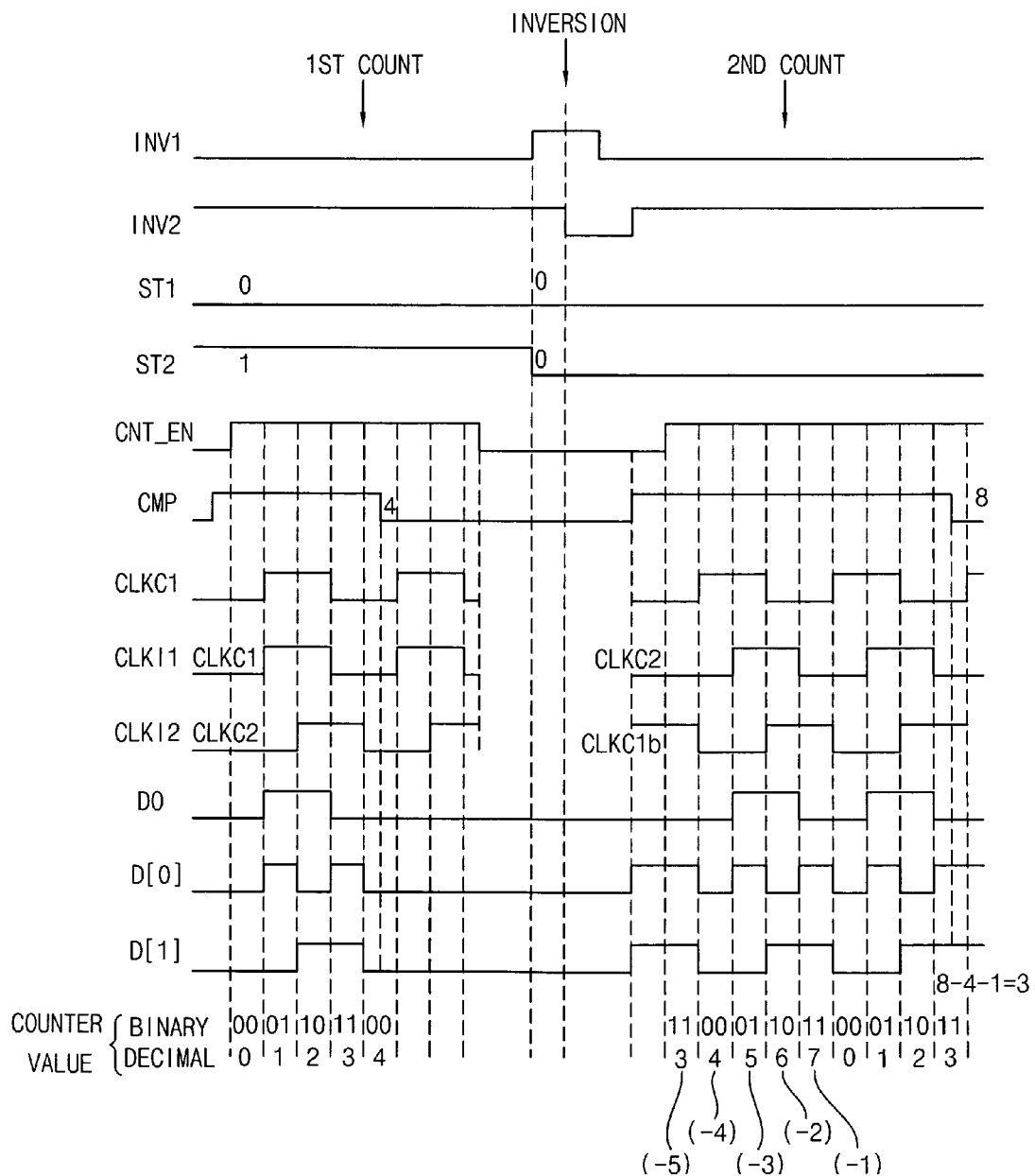

| DOWN COUNT RESULT | | | 1ST EDGE COUNTING OF UP COUNT | | | CLOCK SELECTION | | | |
|---|---|---|---|---|---|---|---|---|---|
| | | | | | | DOWN COUNT | | UP COUNT | |
| D[1] | D[0] | D0 | D[1] | D[0] | D0 | CLKI1 | CLKI2 | CLKI1 | CLKI2 |
| 0 | 0 | 0 | 0 | 1 | 1 | CLKC2 | CLKC1 | CLKC1 | CLKC2 |
| 1 | 1 | 0 | 0 | 0 | 0 | CLKC2 | CLKC1 | CLKC2 | CLKC1b |
| 1 | 0 | 1 | 1 | 1 | 0 | CLKC2 | CLKC1 | CLKC1b | CLKC2b |
| 0 | 1 | 1 | 1 | 0 | 1 | CLKC2 | CLKC1 | CLKC2b | CLKC1 |

MULTIPLE DATA RATE COUNTER, DATA CONVERTER INCLUDING THE SAME, AND IMAGE SENSOR INCLUDING THE SAME

CROSS-REFERENCE TO RELATED APPLICATION(S)

This application claims priority under 35 USC §119 to Korean Patent Application No. 2009-0091132, filed on Sep. 25, 2009 in the Korean Intellectual Property Office, the disclosure of which is incorporated herein in its entirety by reference.

TECHNICAL FIELD

The present invention relates generally to counters, and more particularly to a counter that counts according to a clock signal with a Multiple Data Rate (MDR), and to a data converter and an image sensor including such a counter.

BACKGROUND

Counters are used in various electronic devices for converting physical quantities such as light intensity, sound intensity, time, etc. into a digital signal. For example, an image sensor captures images from incident light and includes an analog-to-digital converter (ADC) for converting analog signals from a pixel array into digital signals. The ADC includes one or more counters that counts according to a clock signal.

Operation speed and power consumption of the counter affects the performance of a device and/or a system including the counter. For example, a complementary metal oxide semiconductor (CMOS) image sensor includes a relatively large number of counters to convert analog signals, output column by column from an active pixel sensor array, into digital signals. The number of counters increases with higher resolution of the image sensor. In that case, the configuration, operation speed, and power consumption of the counters determine the performance of the image sensor.

SUMMARY

Accordingly, a counter according to a general aspect of the present invention performs multiple data rate counting according to a clock signal for enhanced performance.

A counter according to an example embodiment of the present invention includes a buffer unit and a ripple counter. The buffer unit generates at least one least significant signal of a count by buffering at least one clock signal until a termination time point. The ripple counter generates at least one most significant signal of the count by sequentially toggling in response to at least one of the least significant signal.

In an example embodiment of the present invention, the buffer unit includes a clock buffer configured to buffer a clock signal to generate a least significant signal of the count.

In another embodiment of the present invention, the ripple counter includes at least one flip flop configured to sequentially toggle in response to the least significant signal to generate the at least one most significant signal. Each flip flop of the ripple counter is one of a negative edge-triggered flip flop or a positive edge-triggered flip flop. The count is one of up-counting or down-counting.

In a further example embodiment of the present invention, the buffer unit includes a first clock buffer configured to buffer a first clock signal to generate a first buffered clock signal. The buffer unit also includes a second clock buffer configured to buffer a second clock signal to generate a second buffered clock signal. The first clock signal is phase-shifted from the second clock signal. The counter further includes a logic unit configured to generate a first least significant signal from the first and second buffered clock signals, and one of the first and second buffered clock signals is a second least significant signal.

In another example embodiment of the present invention, the ripple counter includes at least one flip flop configured to sequentially toggle in response to the second least significant signal to generate the at least one most significant signal. Each flip flop of the ripple counter is one of a negative edge-triggered flip flop or a positive edge-triggered flip flop.

In a further example embodiment of the present invention, the count is up-counting with the second least significant signal lagging one of the first and second buffered clock signals. Alternatively, the count is down-counting with the second least significant signal preceding one of the first and second buffered clock signals.

A counter according to another example embodiment of the present invention includes a buffer unit configured to generate at least one least significant signal of a count by buffering at least one clock signal having a frequency. The counter also includes a ripple counter configured to generate at least one most significant signal of the count by sequentially toggling in response to at least one of the least significant signal with the count being updated multiple times every period of the clock signal to form a multiple data rate (MDR) counter.

In an example embodiment of the present invention, the buffer unit includes a clock buffer configured to buffer a clock signal to generate a least significant signal of the count. The ripple counter includes at least one flip flop configured to sequentially toggle in response to the least significant signal to generate the at least one most significant signal. In that case, the count is updated twice every period of the clock signal to form a double data rate (DDR) counter.

In another embodiment of the present invention, the buffer unit includes a first clock buffer configured to buffer a first clock signal to generate a first buffered clock signal. The buffer unit also includes a second clock buffer configured to buffer a second clock signal to generate a second buffered clock signal, with the first clock signal being phase-shifted from the second clock signal.

Furthermore, the counter further includes a logic unit configured to generate a first least significant signal from the first and second buffered clock signals, with one of the first and second buffered clock signals being a second least significant signal. Furthermore, the ripple counter includes at least one flip flop configured to sequentially toggle in response to the second least significant signal to generate the at least one most significant signal. For example, the first and second buffered clock signals are phase-shifted by 90° with the count being updated four-times every period of the clock signal to form a quadruple data rate (QDR) counter.

According to another aspect of the present invention, a data converter includes a reference generator for generating a reference signal, a comparator for comparing the reference signal with a measured image signal to generate a comparison signal indicating a termination time point, and a counter for counting from a start time point to the termination time point. The counter includes a buffer unit configured to generate at least one least significant signal of a count by buffering at least one clock signal from the start time point until the termination time point. The counter also includes a ripple counter configured to generate at least one most significant signal of the count by sequentially toggling in response to at least one of the least significant signal.

In an example embodiment of the present invention, the buffer unit of the data converter includes a clock buffer configured to buffer a clock signal to generate a least significant signal of the count. The ripple counter includes at least one flip flop configured to sequentially toggle in response to the least significant signal to generate the at least one most significant signal. In that case, the count is updated twice every period of the clock signal to form a double data rate (DDR) counter.

In a further embodiment of the present invention, the buffer unit includes a first clock buffer configured to buffer a first clock signal to generate a first buffered clock signal. The buffer unit also includes a second clock buffer configured to buffer a second clock signal to generate a second buffered clock signal. The counter further includes a logic unit configured to generate a first least significant signal from the first and second buffered clock signals, with one of the first and second buffered clock signals being a second least significant signal.

Furthermore, the ripple counter includes at least one flip flop configured to sequentially toggle in response to the second least significant signal to generate the at least one most significant signal. In that case, the first and second buffered clock signals are phase-shifted by 90° with the count being updated four-times every period of the clock signal to form a quadruple data rate (QDR) counter.

An image sensor according to another aspect of the present invention includes a pixel array having a plurality of pixels with each pixel generating a respective pixel signal. The image sensor also includes an analog-to-digital converter for converting the respective pixel signal into a digital signal. The image sensor further includes an image signal processor for processing the digital signal.

The analog-to-digital converter of the image sensor includes a reference generator for generating a reference signal, a comparator for comparing the reference signal with the pixel signal to generate a comparison signal indicating a termination time point, and a counter for counting from the start time point to the termination time point to generate the digital signal. The counter includes a buffer unit configured to generate at least one least significant signal of the digital signal by buffering at least one clock signal from a start time point until the termination time point. The counter further includes a ripple counter configured to generate at least one most significant signal of the digital signal by sequentially toggling in response to at least one of the least significant signal.

In an example embodiment of the present invention, the image sensor further includes an analog correlated double sampling (CDS) unit that generates the pixel signal that represents a difference between a respective reset signal and a respective measured image signal generated by the pixel. The image sensor further includes a latch that stores the digital signal output by the counter at the termination time point.

In another example embodiment of the present invention, the image sensor further includes a first latch that stores a first digital signal output by the counter at a first termination time point generated when the pixel signal is a reset signal. The image sensor also includes a second latch that stores a second digital signal output by the counter at a second termination time point generated when the pixel signal is a measured image signal. In that case, the image signal processor determines a difference between the first and second digital signals for digital correlated double sampling.

In a further embodiment of the present invention, the counter is formed for a respective column of the pixel.

In another example embodiment of the present invention, the counter is configured to count from a first start time point to a first termination time point to generate a first digital signal that is inverted after the first termination time point to generate a negative digital signal. In addition, the counter is configured to count during a second start time point to a second termination time point starting from the inverted digital signal to generate a second digital signal. In that case, the first termination time point corresponds to the pixel signal being a reset signal, and the second termination time point corresponds to the pixel signal being a measured image signal.

In a further example embodiment of the present invention, the image sensor includes a clock input circuit for generating the at least one clock signal to be buffered by the buffer unit depending on the least significant signal at the first termination time point for preventing bit error at the second start time point.

In an example embodiment of the present invention, the buffer unit of the image sensor includes a clock buffer configured to buffer a clock signal to generate a least significant signal of the count. The ripple counter includes at least one flip flop configured to sequentially toggle in response to the least significant signal to generate the at least one most significant signal. In that case, the count is updated twice every period of the clock signal to form a double data rate (DDR) counter.

In another example embodiment of the present invention, the buffer unit includes a first clock buffer configured to buffer a first clock signal to generate a first buffered clock signal. The buffer unit also includes a second clock buffer configured to buffer a second clock signal to generate a second buffered clock signal. The counter further includes a logic unit configured to generate a first least significant signal from the first and second buffered clock signals, with one of the first and second buffered clock signals being a second least significant signal.

Furthermore, the ripple counter includes at least one flip flop configured to sequentially toggle in response to the second least significant signal to generate the at least one most significant signal. The first and second buffered clock signals are phase-shifted by 90° with the count being updated four-times every period of the clock signal to form a quadruple data rate (QDR) counter.

In a further example embodiment of the present invention, the counter is configured to count up or down from a first start time point to a first termination time point to generate a first digital signal. In addition, the counter is configured to count in an opposite direction after the first termination time point to a second termination time point from the first digital signal to generate a second digital signal. The first termination time point corresponds to the pixel signal being a reset signal, and the second termination time point corresponds to the pixel signal being a measured image signal.

In another example embodiment of the present invention, the image sensor includes a clock input circuit that generates the at least one clock signal to be buffered by the buffer unit depending on the least significant signal at the first termination time point for preventing bit error at the second start time point.

In an example embodiment of the present invention, the buffer unit of the image sensor includes a clock buffer configured to buffer a clock signal to generate a least significant signal of the count. The ripple counter includes at least one flip flop configured to sequentially toggle in response to the least significant signal input by the ripple counter to generate the at least one most significant signal. The count is updated twice every period of the clock signal to form a double data rate (DDR) counter.

In another example embodiment of the present invention, the buffer unit of the image sensor includes a first clock buffer configured to buffer a first clock signal to generate a first buffered clock signal. The buffer unit also includes a second clock buffer configured to buffer a second clock signal to generate a second buffered clock signal. The counter further includes a logic unit configured to generate a first least significant signal from the first and second buffered clock signals, with one of the first and second buffered clock signals being a second least significant signal.

Furthermore, the ripple counter includes at least one flip flop configured to sequentially toggle in response to the second least significant signal to generate the at least one most significant signal. The first and second buffered clock signals are phase-shifted by 90° with the count being updated four-times every period of the clock signal to form a quadruple data rate (QDR) counter.

The present invention may be practiced to particular advantage when the image sensor is a CIS (CMOS image sensor). However, the present invention may be practice with other types of image sensors using counters.

In this manner, the Multiple Data Rate (MDR) counter counts multiple times every period of the clock signal for faster and more efficient operation of the counter.

BRIEF DESCRIPTION OF THE DRAWINGS

The above and other features and advantages of the present invention will become more apparent when described in detailed exemplary embodiments thereof with reference to the attached drawings in which:

FIG. 9 is a timing diagram of signals during a double data rate (DDR) counting operation of the counter of FIG. 2, according to an example embodiment of the present invention;

FIG. 25 is a circuit diagram of a second counting unit in the counter of FIG. 24, according to an example embodiment of the present invention;

FIG. 26 is a circuit diagram of a clock control circuit and a clock input circuit in the counter of FIG. 24, according to an example embodiment of the present invention;

FIGS. 34A and 34B are timing diagrams of signals during a counting operation with the up-down conversion function of the counter of FIG. 30, according to example embodiments of the present invention;

FIG. 35 is a timing diagram of signals during a CDS operation in the image sensor of FIG. 22 including the counter of FIG. 30, according to an example embodiment of the present invention;

FIGS. 41A, 41B, 41C and 41D are timing diagrams of signals during a counting operation with an inversion function of the counter of FIG. 36, according to example embodiments of the present invention;

The figures referred to herein are drawn for clarity of illustration and are not necessarily drawn to scale. Elements having the same reference number in FIGS. 1 through 50 as described above refer to elements having similar structure and/or function, unless stated other-wise.

DETAILED DESCRIPTION OF EXAMPLE EMBODIMENTS

Figure 1:
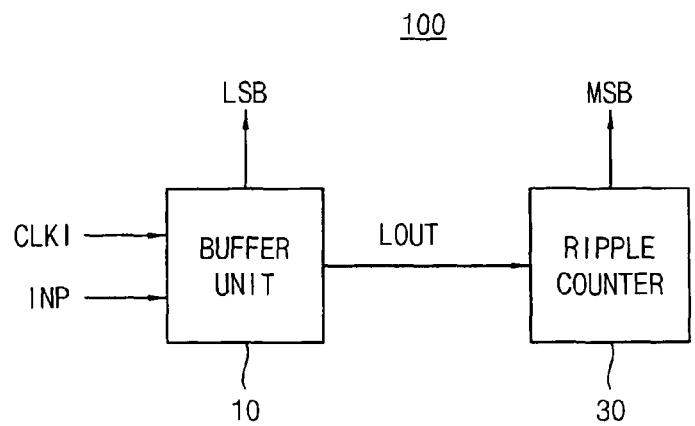
FIG. 1 is a block diagram of a counter according to an example embodiment of the present invention.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 48:
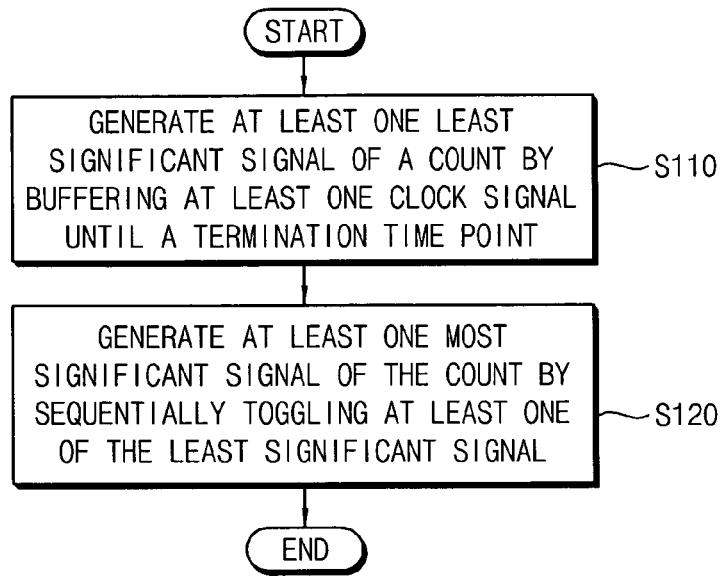
FIG. 48 is a flow chart of steps during a counting method, according to an example embodiment of the present invention.

FIG. 1 is a block diagram of a counter 100 according to an example embodiment of the present invention. FIG. 48 is a flow chart of steps during a counting operation of the counter of FIG. 1, according to an example embodiment of the present invention.

Referring to FIG. 1, the counter 100 includes a buffer unit 10 and a ripple counter 30, according to an example embodiment of the present invention. The buffer unit 10 generates at least one least significant signal of a count by buffering at least one clock signal until a termination time point (Step S110 of FIG. 48). For example, the buffer unit 10 generates one or more least significant bit signals LSB by buffering an input clock signal CLKI until the termination time point and by latching the input clock signal CLKI at the termination time point.

Also referring to FIG. 1, a logic level of an input signal INP indicates the termination time point of the counting operation, according to an example embodiment of the present invention. The ripple counter 30 generates at least one most significant signal of the count by sequentially toggling in response to at least one of the least significant signal (Step 120 of FIG. 48). For example, the ripple counter generates most significant bit signals MSB that are sequentially toggling in response to a latch output signal LOUT from the buffer unit 10. The latch output signal LOUT corresponds to one of the least significant bit signals LSB generated by the buffer unit 10, according to an example embodiment of the present invention.

According to an aspect of the present invention, the counter 100 performs multiple data rate (MDR) counting with the count being updated multiple times every period of the input clock signal CLKI. For example, a double data rate (DDR) counting is performed with the count being updated two times per cyclic period of the input clock signal CLKI. Alternatively, a quadruple data rate (QDR) counting is performed with the count being updated four times per cyclic period of the input clock signal CLKI. Such DDR and QDR counting are described herein, but the present invention may also be practiced for other multiple data rate counting.

Figure 2:
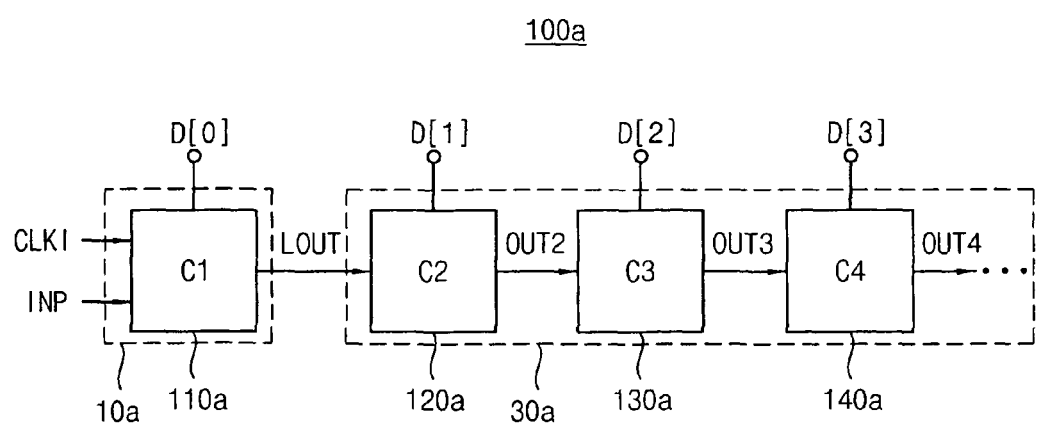
FIG. 2 is a block diagram of further components in the counter of FIG. 1 according to an example embodiment of the present invention.

FIG. 2 is a block diagram of further components of a counter 100a (similar to the counter 100 of FIG. 1), according to an example embodiment of the present invention.

Referring to FIG. 2, a buffer unit 10a (similar to the buffer unit 10 of FIG. 1) includes a first counting unit 110a. In addition, a ripple counter 30a (similar to the ripple counter 30 of FIG. 1) includes a second counting unit 120a, a third counting unit 130a, and a fourth counting unit 140a.

In FIG. 2, the least significant bit signal LSB in FIG. 1 includes a first bit signal D[0], and the most significant bit signals MSB in FIG. 1 includes a second bit signal D[1], a third bit signal D[2], and a fourth bit signal D[3]. The first counting unit 110a generates the first bit signal D[0] by buffering the input clock signal CLKI until a termination time point of a counting operation, and by latching the input clock signal CLKI at the termination time point.

The ripple counter 30a generates the second bit signal D[1], the third bit signal D[2], and the fourth bit signal D[3] as the most significant bit signals MSB that are sequentially toggling in response to the latch output signal LOUT (i.e., the first bit signal D[0]). The latch output signal LOUT is one of the first bit signal D[0] or an inversion /D[0] of the first bit signal D[0] depending on the configuration of the counter 110a.

In an example embodiment of the present invention, the first counting unit 110a buffers and latches the input clock signal CLKI in response to the input signal INP indicating the termination time point of the counting operation. In this manner, the first counting unit 110 generates the first bit signal D[0] having the same logic level as the input clock signal CLKI until the termination time point. Thus, the first bit signal D[0] that is the least significant bit of the count toggles similarly as the input clock signal CLKI during the counting operation and is latched to the input clock signal CLKI at the termination time point.

The ripple counter 30a includes a number of counting units depending on the desired number of bits of the count. Three counting units 120a, 130a and 140a are illustrated in FIG. 2 for simplicity of description. However, the present invention may be practiced with any number of counting units in the ripple counter 30a depending on the n-bits desired for the count D[0:n]. Hereinafter, configurations and operations of the counter 100a are described for the example of the counter unit 100a generating a four-bit count D[0], D[1], D[2] and D[3] that comprise a digital signal of the count generated by the counter 100a.

Further referring to FIG. 2, the ripple counter 30a has a cascade configuration with the plurality of counting units 120a, 130a and 140a being sequentially coupled in series to perform toggling in response to an output signal of the previous counting unit. In other words, the second counting unit 120a performs toggling in response to the latch output signal LOUT from the first counting unit 110a, the third counting unit 130a performs toggling in response to an output signal OUT2 from the second counting unit 120a, and the fourth counting unit 140a performs toggling in response to an output signal OUT3 from the third counting unit 130a. As a result, the most significant signals, D[1], D[2] and D[3] have respective cyclic periods that are sequentially doubled.

Figure 3A:
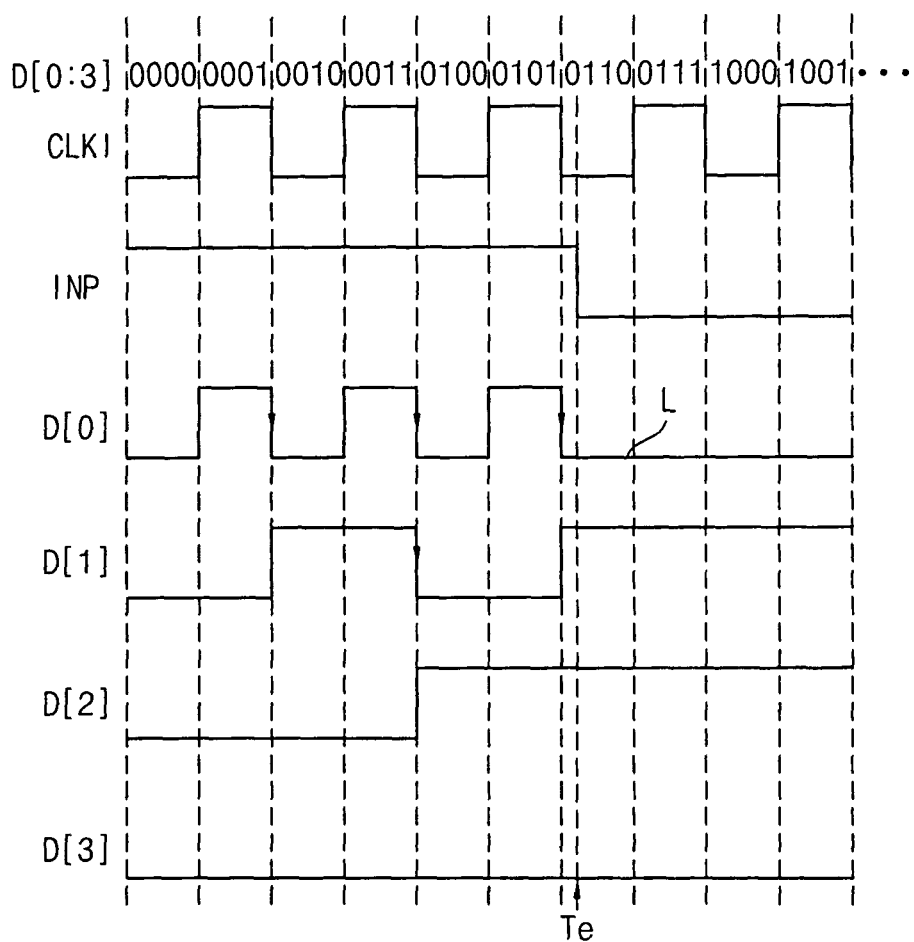
FIGS. 3A and 3B are timing diagrams of signals during a latching operation of the counter of FIG. 2 according to example embodiments of the present invention.
Figure 3B:
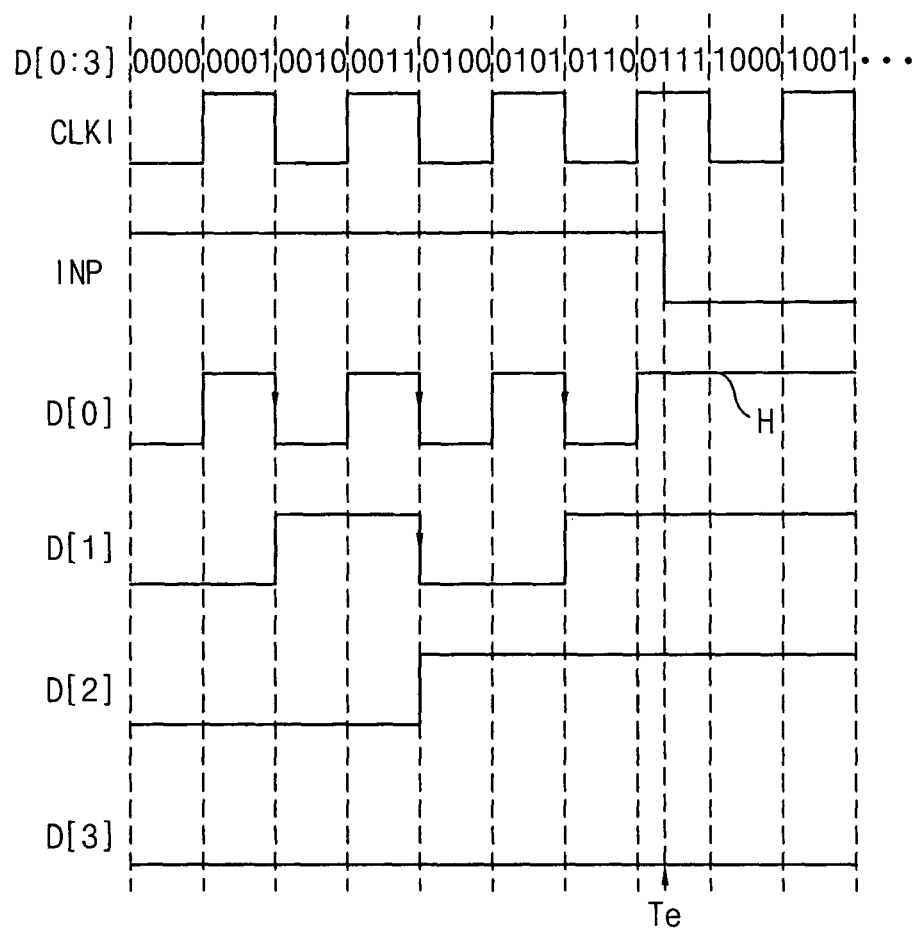

FIGS. 3A and 3B are timing diagrams of signals during a counting operation of the counter of FIG. 2, according to an example embodiment of the present invention. In the example of FIGS. 3A and 3B, a falling edge of the input signal INP indicates the termination time point Te of the counting operation. The first counting unit 110a buffers the input clock signal CLKI until the falling edge of the input signal INP and latches the input clock signal CLKI at the falling edge of the input signal INP to generate the first bit signal D[0].

FIG. 3A illustrates the example of the logic level of the input clock signal CLKI being a logic low 'L' at the termination time point Te of the counting operation. Alternatively, FIG. 3B illustrates the example of the logic level of the input clock signal CLKI being a logic high 'H' at the termination time point Te of the counting operation.

Referring to FIGS. 3A and 3B, the first bit signal D[0] toggles similarly as the input clock signal CLKI until the counting operation is terminated at the termination time point Te. Similar results of FIGS. 3A and 3B may also be obtained with the first counting unit 110a and the second counting unit 120a having buffers and/or latches directly receiving the same input clock signal CLKI. However in that case, additional components such as a feedback switch may be required to prevent bit errors at the termination time point Te by interrupting the toggling of the second bit signal D[1].

In FIG. 2, the second counting unit 120a toggles in response to the output of the first counting unit 110a instead of the input clock signal. Thus, the counter 100a is implemented with a relatively simple configuration without the feedback switch for interrupting the toggling of the second bit signal D[1].

The counter 100a of FIG. 2 performs one of an up-counting operation or a down-counting operation according to the configuration of the counter 100a. Hereinafter, the up-counting operation is described in reference to FIGS. 4, 5, and 6, and the down-counting operation is described in reference to FIGS. 7 and 8.

Figure 4:
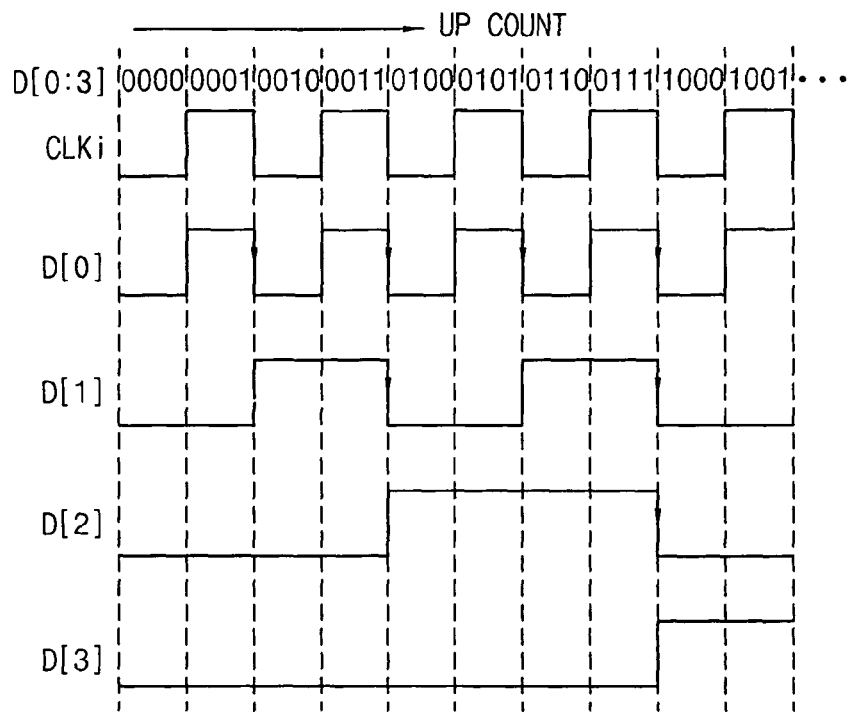
FIG. 4 is a timing diagram of signals during an up-counting operation of the counter of FIG. 2 according to an example embodiment of the present invention.

FIG. 4 is a timing diagram of signals during the up-counting operation of the counter 100a of FIG. 2, according to an example embodiment of the present invention. Referring to FIGS. 2 and 4, the first counting unit 110a operates as a buffer toggling similarly as the input clock signal CLKI during the counting operation until the termination time point Te to generate the first bit signal D[0]. The most significant signals D[1], D[2] and D[3] toggle respectively in response to falling edges of the output of the previous counting unit.

In other words, the second bit signal D[1] toggles in response to the falling edges of the latch output signal LOUT (i.e., the first bit signal D[0]). The third bit signal D[2] toggles in response to the falling edges of the second bit signal D[1], and the fourth bit signal D[3] toggles in response to the falling edges of the third bit signal D[2]. As a result, the most significant bit signals D[1], D[2] and D[3] have respective cyclic periods that are sequentially doubled as illustrated in FIG. 4. In this manner, the binary code D[0:3] of the resulting count of the counter 100a increases (for the up-counting operation) as 0000, 0001, 0010, 0011, every half of the period of the input clock signal CLKI.

Thus, the counter 100a has a doubled operation speed compared with the conventional ripple counter because the counter 100a performs counting two times per the cyclic period of the input clock signal CLKI. Such counting is referred to as Double Data Rate (DDR) counting, and the counter 100a is referred to as a DDR counter. With such doubled operation speed, the counter 100a generates a binary code having one more bit than the conventional ripple counter using the same clock signal in a given counting duration.

In other words, the counter 100a is capable of providing counting with higher precision for affecting a slope of a ramp signal in an image sensor. Alternatively, the counter 100a uses a clock signal having a half frequency with respect to the conventional ripple counter, but the counter 100a provides counting with the same number of bits during a same counting duration. Accordingly the DDR counter 100a has reduced power consumption with reduced frequency of the input clock signal, and the operation margin may be enhanced in the DDR counter 100a and a device including the DDR counter 100a.

Figure 5A:
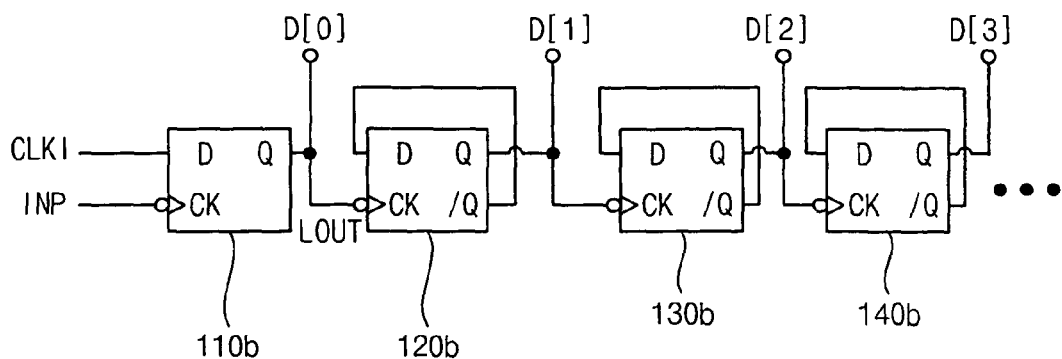
FIGS. 5A and 5B are circuit diagrams of the counter of FIG. 2 for performing an up-counting operation, according to example embodiments of the present invention.
Figure 5B:
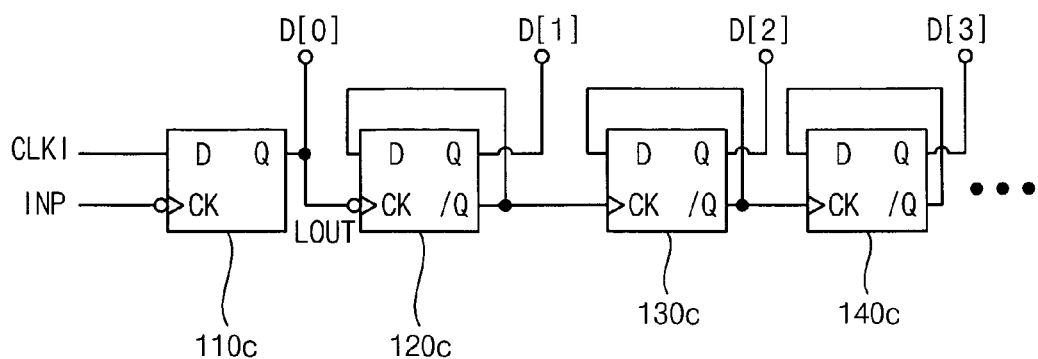

FIGS. 5A and 5B are circuit diagrams of counters 100b and 100c, respectively, (similar to the counter 100a of FIG. 2) each for performing an up-counting operation, according to example embodiments of the present invention.

As illustrated in FIG. 5A, the first counting unit 110a of FIG. 2 is implemented with a latch as a clock buffer 110b. The clock buffer 110b has a data terminal D receiving the input clock signal CLKI, a clock terminal CK receiving the input signal INP indicating the termination time point Te of the counting operation, and an output terminal Q outputting a first bit signal D[0]. The first counting unit 110b buffers the input clock signal CLKI until the termination time point Te, and latches the input clock signal CLKI at the termination time point Te to generate the first bit signal D[0].

As illustrated in FIGS. 5A and 5B, the ripple counter 30a of FIG. 2 is implemented with a plurality of flip-flops that are cascade-coupled to generate the most significant bit signals D[1], D[2] and D[3]. Referring to FIG. 5A, the second counting unit 120b, the third counting unit 130b, and the fourth counting unit 140b are implemented with negative-edge triggered flip-flops for generating the most significant bit signals D[1], D[2] and D[3] that are sequentially toggling. Referring to FIG. 5B, the second counting unit 120c, the third counting unit 130c and the fourth counting unit 140c are implemented with positive-edge triggered flip-flops for generating the most significant bit signals D[1], D[2] and D[3] that are sequentially toggling.

In FIG. 5A, the third counting unit 130b and the fourth counting unit 140b are implemented as negative-edge triggered flip-flops such that the non-inversion output terminal (Q) of the previous counting unit is coupled to the data terminal D of the next counting unit. In this case, the output signal OUTk provided to the next counting unit corresponds to the k-th bit signal D[k], where k is an integer greater than one.

In contrast, the third counting unit 130c and the fourth counting unit 140c of FIG. 5B are implemented as positive-edge triggered flip-flops such that the inversion output terminal (/Q) of the previous counting unit is coupled to the data terminal D of the next counting unit. In this case, the output signal OUTk provided to the next counting unit corresponds to the inversion /D[k] of the k-th bit signal D[k]. As a result, both of the counters 100b and 100c of FIGS. 5A and 5B perform the up-counting operation as illustrated in FIG. 4.

Figure 6A:
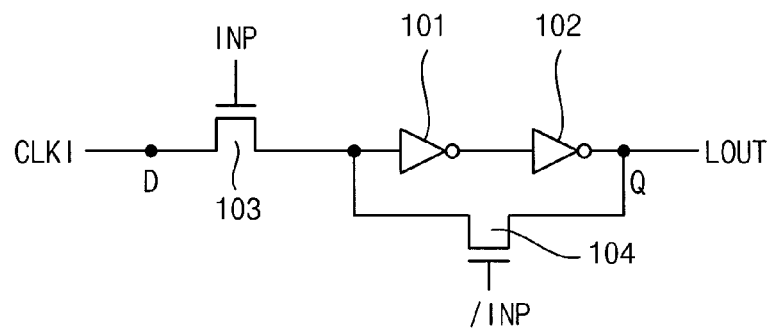
FIG. 6A is a circuit diagram of the clock buffer included in a buffer unit of the counter, according to an example embodiment of the present invention.

FIG. 6A is a circuit diagram of the clock buffer 110a, 110b, 110c, 110d, or 110e in FIG. 2, 5A, 5B, 8A or 8B or in the buffer unit 10 of FIG. 1, according to an example embodiment of the present invention. Referring to FIG. 6A, the clock buffer includes a first inverter 101, a second inverter 102, a first switch 103, and a second switch 104.

The output of the first inverter 101 is coupled to the input of the second inverter 102, and the output of the second inverter 102 is coupled to the input of the first inverter 101 via the second switch 104, thereby forming a latch configuration. In the example of FIG. 6A, the output of the second inverter 102 corresponds to the non-inversion output terminal Q. The first switch 103 is coupled between the data terminal D and the input of the first inverter 101. The input clock signal CLKI is applied on the data terminal D, the input signal INP indicating the termination time point is applied on the control terminal of the first switch 103, and an inversion /INP of the input signal is applied to the control terminal of the second switch 104.

In the example of FIGS. 3A and 3B, the falling edge of the input signal INP indicates the termination time point Te. In that case, the first switch 103 is turned on and the second switch 104 is turned off until the termination time point Te, and thus the buffer unit of FIG. 6A performs a buffering operation by buffering the input clock signal CLKI.

When the input signal INP transitions from logic high to logic low at the termination time point Te, the first switch 103 is turned off and the second switch 104 is turned on, thereby latching the logic level of the input clock signal CLKI at the termination time point Te. As a result, the latch output signal LOUT at the non-inversion output terminal Q toggles similarly as the input clock signal CLKI until the termination time point Te and maintains the latched logic level at the termination time point Te.

Figure 6B:
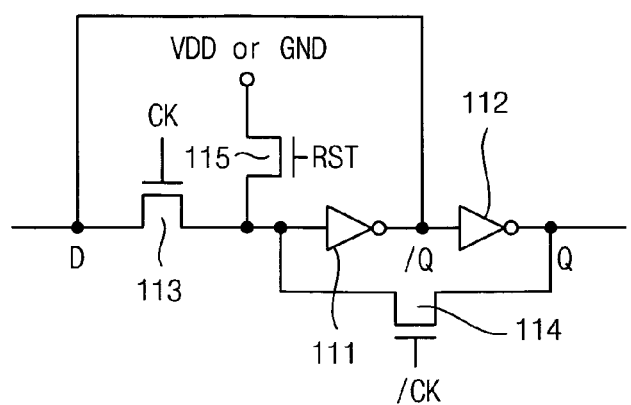
FIGS. 6B and 6C are each a circuit diagram of a respective flip-flop in a ripple counter of the counter, according to example embodiments of the present invention.
Figure 6C:
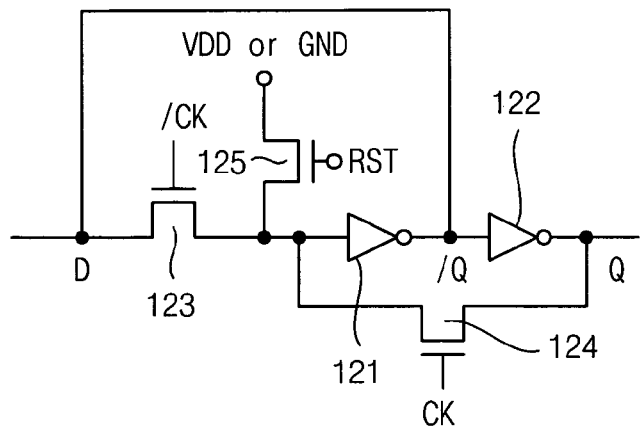

FIGS. 6B and 6C are circuit diagrams of flip-flops each performing a toggling operation. FIG. 6B is a circuit diagram of a positive-edge triggered flip-flop, and FIG. 6C is a circuit diagram of a negative-edge triggered flip-flop. Each of the flip-flops of FIGS. 6B and 6C may be used within the ripple counter 30a of FIG. 2 for example.

Referring to FIG. 6B, the positive-edge triggered flip-flop includes a first inverter 111, a second inverter 112, a first switch 113, and a second switch 114. The output of the first inverter 111 is coupled to the input of the second inverter 112, and the output of the second inverter 112 is coupled to the input of the first inverter 111 via the second switch 114, thereby forming a latch configuration.

In the example of FIG. 6B, the output of the first inverter 111 corresponds to an inversion output terminal /Q, and the output of the second inverter 112 corresponds to a non-inversion output terminal Q. The first switch 113 is coupled between the data terminal D and the input of the first inverter 111, and the control terminal CK of the first switch 113 corresponds to a clock terminal. A clock signal CLK is applied on the control terminal CK of the first switch 113, and an inversion /CLK of the clock signal is applied on the control terminal /CK of the second switch 114.

The positive-edge triggered flip-flop of FIG. 6B further includes a reset switch 115 for initializing a state of the flip-flop. When the reset switch 115 is turned on in response to a reset signal RST, the inversion output terminal /Q and the output terminal Q are initialized respectively to logic low or logic high depending on the reset voltage VDD or GND.

When the clock signal CLK applied to the control terminal CK is logic low, the flip-flop of FIG. 6B is in a storage state that does not change the output even though the logic level of the data terminal D is changed. When the clock signal CLK transitions from logic low to logic high, that is, at the rising edge of the clock signal CLK, the logic level of the data terminal D is transferred to the non-inversion output terminal Q.

The positive-edge triggered flip-flop of FIG. 6B performs toggling when the inversion output terminal /Q is coupled to the data terminal D. When the clock signal CLK applied to the control terminal CK transitions to logic low, the second switch 114 is turned on, and the data terminal D is set to a logic level opposite to that at the non-inversion output terminal Q. In addition, the state of the flip-flop is not changed since the first switch 113 is turned off.

When the clock signal CLK in FIG. 6B transitions to logic high, the first switch 113 is turned on, and the logic level of the inversion output terminal is applied to the input of the first inverter 111, thereby inverting the logic state of the non-inverting output terminal Q. As such, the positive-edge triggered flip-flop performs toggling by inverting the storage state from logic high to logic low or from logic low to logic high at each rising edge of the clock signal CLK applied to the control terminal CK.

Referring to FIG. 6C, the negative-edge triggered flip-flop has a configuration similar to the positive-edge triggered flip-flop of FIG. 6B, but the inversion /CLK of the clock signal is applied to the control gate /CK of the first switch 123, and the clock signal CLK is applied to the control gate CK of the second switch 124. That is, the flip-flops of FIGS. 6B and 6C are different in that the control terminals CK and /CK are exchanged.

The negative-edge triggered flip-flop of FIG. 6C performs toggling in response to the falling edges of the clock signal CLK whereas the positive-edge triggered flip-flop of FIG. 6B performs toggling in response to the rising edges of the clock signal CLK. When the clock signal CLK applied to the control terminal CK transitions to logic high, the second switch 124 is turned on, and the data terminal D is set to the logic level opposite to that of the non-inversion output terminal Q. In addition, the state of the flip-flop is not changed since the first switch 123 is turned off.

When the clock signal CLK transitions to logic low in FIG. 6C, the first switch 123 is turned on, and the logic level of the inversion output terminal /Q is applied to the input of the first inverter 111, thereby inverting the logic state of the non-inverting output terminal Q. As such, the negative-edge triggered flip-flop performs toggling by inverting the storage state from logic high to logic low or from logic low to logic high at each falling edge of the clock signal CLK applied to the control terminal CK. The counter 100 includes such positive-edge triggered flip-flops and/or negative-edge triggered flip-flops of FIGS. 6B and 6C for performing the up-counting operations as described above and the down-counting operation as described below.

Figure 7:
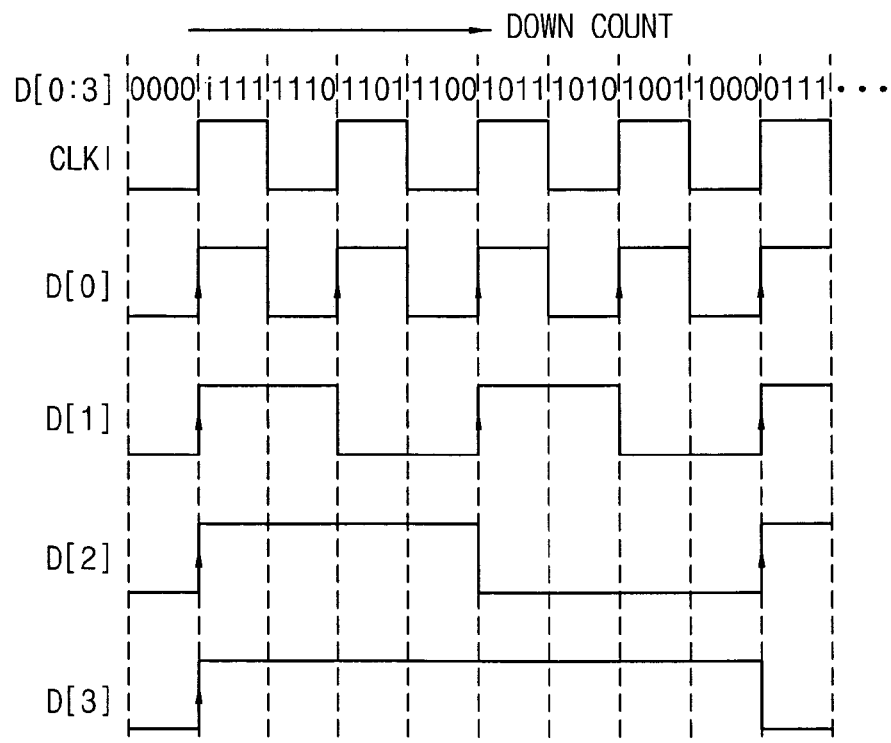
FIG. 7 is a timing diagram of signals during a down-counting operation of the counter of FIG. 2, according to an example embodiment of the present invention.

FIG. 7 is a timing diagram of signals during a down-counting operation of the counter of FIG. 2, according to an example embodiment of the present invention. Referring to FIGS. 2 and 7, the first counting unit 110a operates as a buffer during the counting operation, and thus generates the first bit signal D[0] toggling similarly as the input clock signal CLKI until the termination time point Te and being latched to the input clock signal at the termination time point Te. The most significant signals D[1], D[2] and D[3] toggle respectively in response to rising edges of the output of the previous counting unit.

In other words in FIG. 7, the second bit signal D[1] toggles in response to the rising edges of the latch output signal LOUT (i.e., the first bit signal D[0]). The third bit signal D[2] toggles in response to the rising edges of the second bit signal D[1]. The fourth bit signal D[3] toggles in response to the rising edges of the third bit signal D[2]. As a result, the most significant bit signals D[1], D[2] and D[3] have respective cyclic periods that are sequentially doubled as illustrated in FIG. 7.

Referring to FIG. 7, the count D[0:3] decreases as 0000, 1111, 1110, 1101, every half period of the input clock signal CLKI. In both cases of FIGS. 4 and 7, the counter 100a has a doubled operation speed compared with the conventional ripple counter because the counter 100a performs counting two times per the cyclic period of the input clock signal CLKI.

Figure 8A:
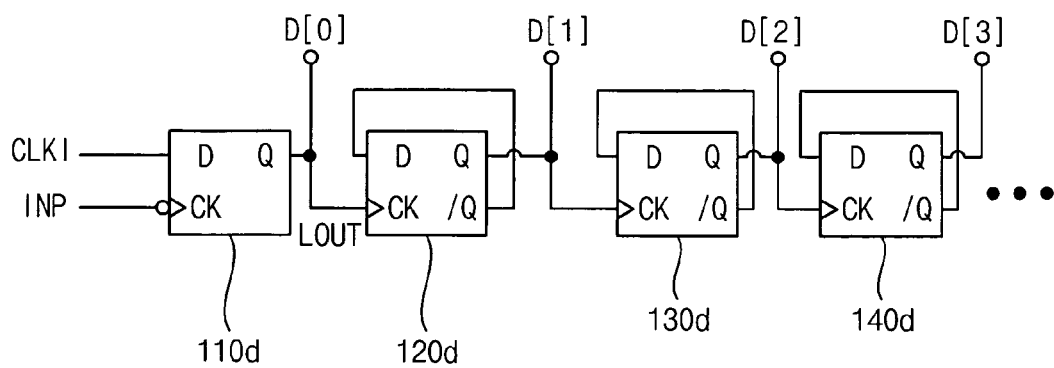
FIGS. 8A and 8B are circuit diagrams of the counter of FIG. 2 for performing a down-counting operation, according to example embodiments of the present invention.
Figure 8B:
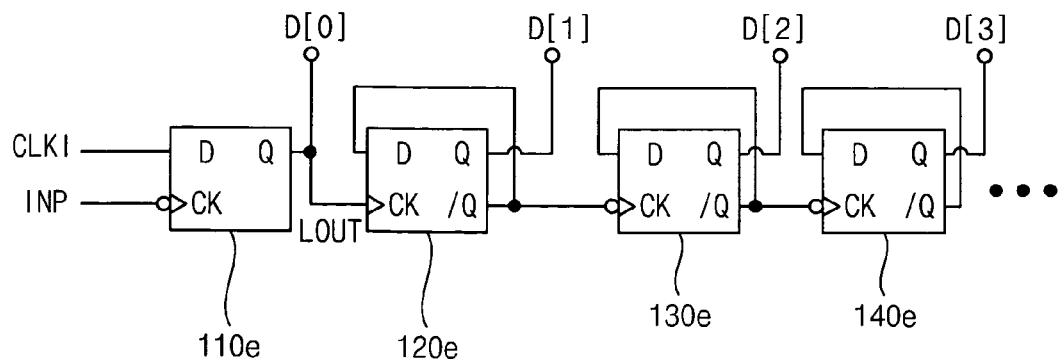

FIGS. 8A and 8B show circuit diagrams of counters 100d and 100e that are each an implementation of the counter 100a of FIG. 2 for performing a down-counting operation, according to example embodiments of the present invention.

Referring to FIG. 8A, the first counting unit 110a of FIG. 2 is implemented with a clock buffer 110d having a data terminal D receiving the input clock signal CLKI, a clock terminal CK receiving the input signal INP indicating the termination time point Te of the counting operation, and an output terminal Q outputting the first bit signal D[0]. Accordingly, the first counting unit 110d buffers the input clock signal CLKI until the termination time point Te, and latches the input clock signal CLKI at the termination time point Te to generate the first bit signal D[0].

Referring FIGS. 8A and 8B, the ripple counter 30a of FIG. 2 is implemented with a plurality of flip-flops that are cascade-coupled to generate the most significant bit signals D[1], D[2] and D[3]. Referring to FIG. 8A, the second counting unit 120d, the third counting unit 130d, and the fourth counting unit 140d are implemented as positive-edge triggered flip-flops for generating the sequentially toggling most significant bit signals D[1], D[2] and D[3]. Referring to FIG. 8B, the second counting unit 120e is implemented as a positive-edge triggered flip-flop, and the third and fourth counting units 130e and 140e are implemented as negative-edge triggered flip-flops for generating the sequentially toggling most significant bit signals D[1], D[2] and D[3].

In FIG. 8A, the third and fourth counting units 130d and 140d are implemented as positive-edge triggered flip-flops such that the non-inversion output terminal (Q) of the previous counting unit is coupled to the data terminal D of the next counting unit. Accordingly, the output signal OUTk provided to the next counting unit corresponds to the k-th bit signal D[k], where k is an integer greater than one.

In contrast, the third and fourth counting units 130e and 140e of FIG. 8B are implemented as negative-edge triggered flip-flops such that the inversion output terminal (/Q) of the previous counting unit is coupled to the data terminal D of the next counting unit. Accordingly, the output signal OUTk provided to the next counting unit corresponds to the inversion signal /D[k] of the k-th bit signal D[k]. Thus, both of the counters 100d and 100e of FIGS. 8A and 8B perform the down-counting operation as illustrated in FIG. 7. Each of the positive-edge triggered flip-flops and the negative-edge triggered flip-flops of FIGS. 5A, 5B, 8A, and 8B may be implemented similarly as in FIGS. 6B and 6C.

FIG. 9 is a timing diagram of signals during a double data rate (DDR) counting operation of the counter of FIG. 2 according to an example embodiment of the present invention, compared with the operation of a conventional counter. Referring to FIG. 9, the conventional ripple counter generates bit signals CD[0], CD[1], CD[2] and CD[3] for counting values from 0000 to 1111 during sixteen cycles of the input clock signal CLKI. In contrast, the DDR counter 100a according to example embodiments of the present invention counts from 0000 to 1111 during eight cycles of the same input clock signal CLKI since the counter 100a counts two times per the cyclic period of the input clock signal CLKI.

Accordingly, the DDR counter 100a has a doubled operation speed compared with the conventional ripple counter. Thus, the DDR counter 100a provides counting with a same number of bits during a same counting duration even though the DDR counter 100a uses a clock signal having a half frequency with respect to the conventional ripple counter. The DDR counter 100a also has reduced power consumption with reduced frequency of the clock signal with enhanced operation margin of the DDR counter 100a and a device including the DDR counter 100a.

In addition, the DDR counter 110a according to example embodiments of the present invention does not require an additional glitch filter for removing glitch noise that may cause bit errors, included in the input signal INP indicating the termination time point Te. The first counting unit 110b, 110c, 110d, or 110e is implemented with a latch capable of performing glitch filtering.

Figure 10:
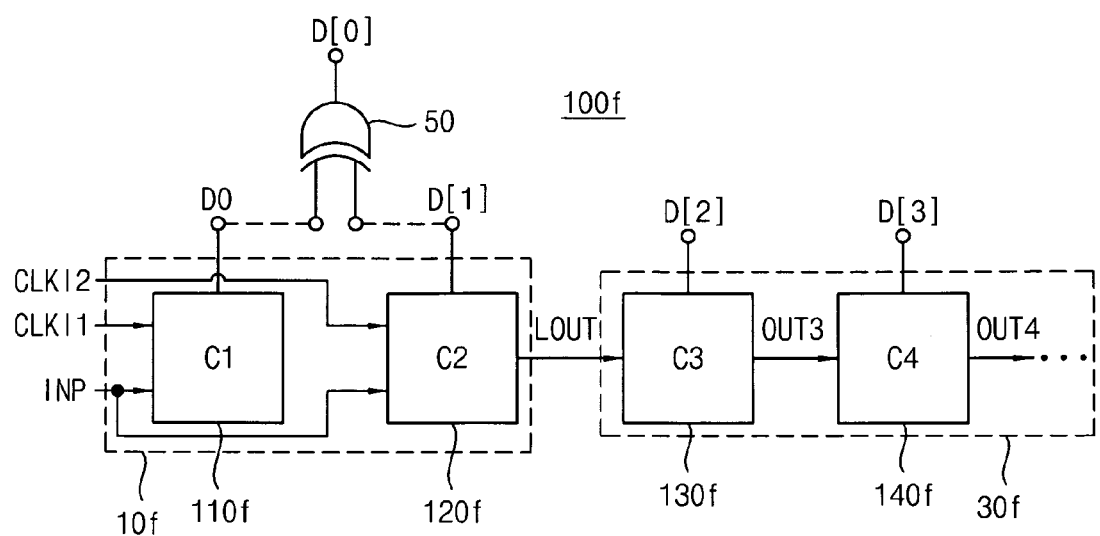
FIG. 10 is a block diagram of further components of the counter of FIG. 1, according to an example embodiment of the present invention.

FIG. 10 is a block diagram of a counter 100f (similar to the counter 100 of FIG. 1), according to an example embodiment of the present invention. Referring to FIG. 10, a buffer unit 10f (similar to the buffer unit 10 of FIG. 1) includes a first counting unit 110f and a second counting unit 120f. Also referring to FIG. 10, a ripple counter 30f (similar to the ripple counter 30 of FIG. 1) includes a third counting unit 130f and a fourth counting unit 140f.

In the example of FIG. 10, the least significant bit signals LSB of FIG. 1 generated by the buffer unit 10f of FIG. 10 include a first bit signal D[0] and a second bit signal D[1]. Additionally, the most significant bit signals MSB in FIG. 1 generated by the ripple counter 30f of FIG. 10 include a third bit signal D[2] and a fourth bit signal D[3]. The first counting unit 110f generates a first buffered clock signal D0 by buffering a first input clock signal CLKI1 until the termination time point Te and by latching the first input clock signal CLKI1 at the termination time point of a counting operation.

The second counting unit 120f of FIG. 10 generates the second bit signal D[1] that is a second buffered clock signal by buffering a second input clock signal CLKI2 until the termination time point Te and by latching the second input clock signal CLKI2 at the termination time point of the counting operation. The first and second input clock signals CLKI1 and CLKI2 are phase-shifted from each other.

The ripple counter 30f generates, in response to the latch output signal LOUT that is the second bit signal D[1], the most significant bit signals MSB D[2] and D[3] that are sequentially toggling. The present invention may be practiced with the latch output signal LOUT being one of the second bit signal D[1] or an inversion /D[1] of the second bit signal depending on the configuration of the counter 110f.

In an example embodiment of the present invention, the first counting unit 110f buffers the first input clock signal CLKI1 until the termination time point indicated by the input signal INP, and latches the first input clock signal CLKI1 at the termination time point to generate the first buffered clock signal D0. The second counting unit 120f buffers the second input clock signal CLKI2 until the termination time point, and latches the second input clock signal CLKI2 at the termination time point to generate the second buffered clock signal D[1]

The ripple counter 30f of FIG. 10 may include an arbitrary number of counting units depending on the number of bits of the count generated by the counter 100f. FIG. 10 shows two counting units 130f and 140f for convenience of description. However, the present invention may be practiced with a variable number of counting units in the ripple counter 30f depending on the desired number of bits of the count D[0:n]. Hereinafter, configurations and operations of the counter 100f are described for generating four-bits D[0], D[1], D[2] and D[3] (i.e., a four-bit binary code D[0:3]).

The ripple counter 30f has a cascade configuration with the plurality of counting units 130f and 140f being sequentially coupled to perform toggling in response to an output signal of the previous counting unit. In other words, the third counting unit 130f performs toggling in response to the latch output signal LOUT (i.e., D[1]) from the second counting unit 120f. The fourth counting unit 140f performs toggling in response to the output signal OUT3 from the third counting unit 130f. As a result, the most significant signals D[2] and D[3] have respective cyclic periods that are sequentially doubled.

The counter 100f also includes a logic unit 50 that is a code converter for performing a logical operation on the first and second buffered clock signals D0 and D[1] to generate a least significant bit D[0] of the count of the counter 100f. For example, the code converter 50 is an exclusive-OR gate in the example embodiment of FIG. 10.

The first and second buffered clock signals D0 and D[1] may be used for the least significant bits of the count when the counter 100f counts according to a gray code. In the example of FIG. 10, the least significant bit signal D[0] of the count is generated from the first and second buffered clock signals D0 and D[1]. In an example embodiment of the present invention, the logic unit 50 may be disposed outside of the counter 100f such as off-chip of the counter 100f that is fabricated on an integrated circuit chip.

FIGS. 11A, 11B, 11C and 11D are timing diagrams of signals during a counting operation of the counter 100f of FIG. 10, according to an example embodiment of the present invention. In FIGS. 11A, 11B, 11C and 11D, a falling edge of the input signal INP indicates the termination time point Te of the counting operation. The first counting unit 110f buffers the first input clock signal CLKI1 until the termination time point Te, and latches the first input clock signal CLKI1 at the termination time point Te to generate the first buffered clock signal D0.

Figure 11A:
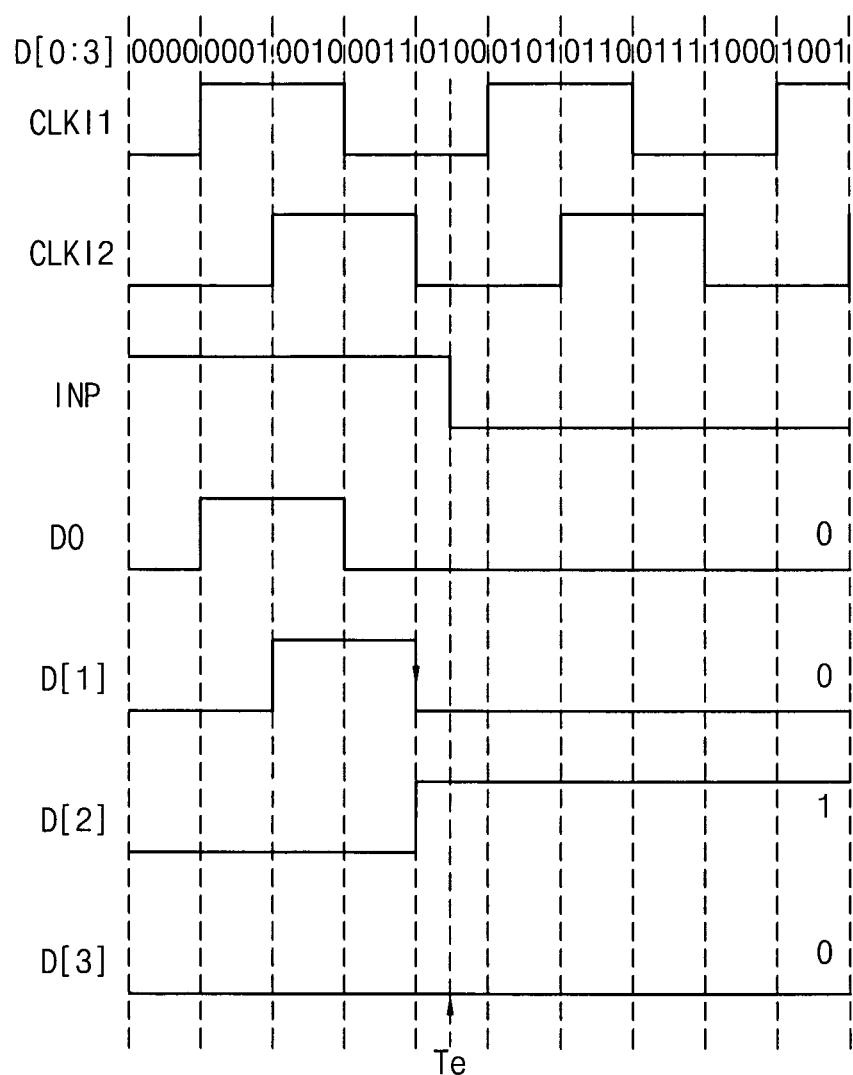
FIGS. 11A, 11B, 11C and 11D are timing diagrams of signals during a latching operation of the counter of FIG. 10, according to example embodiments of the present invention.
Figure 11B:
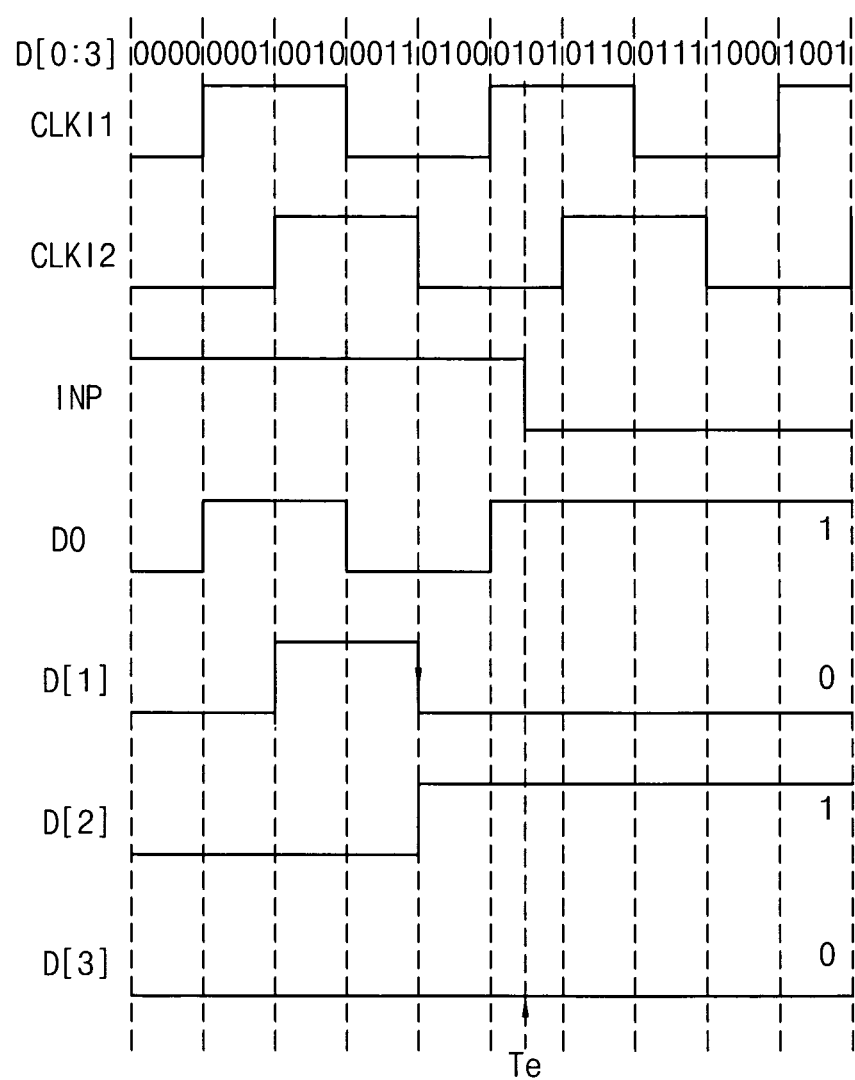
Figure 11C:
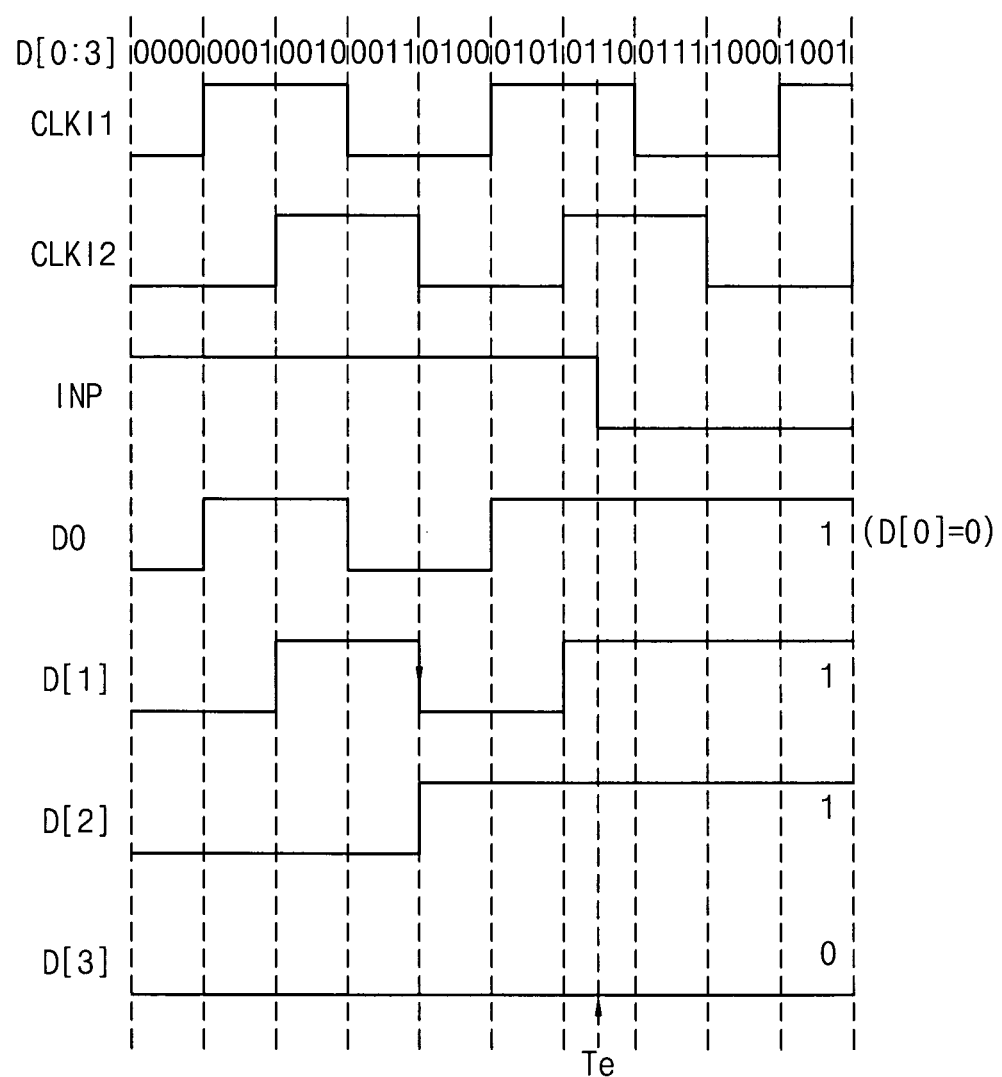
Figure 11D:
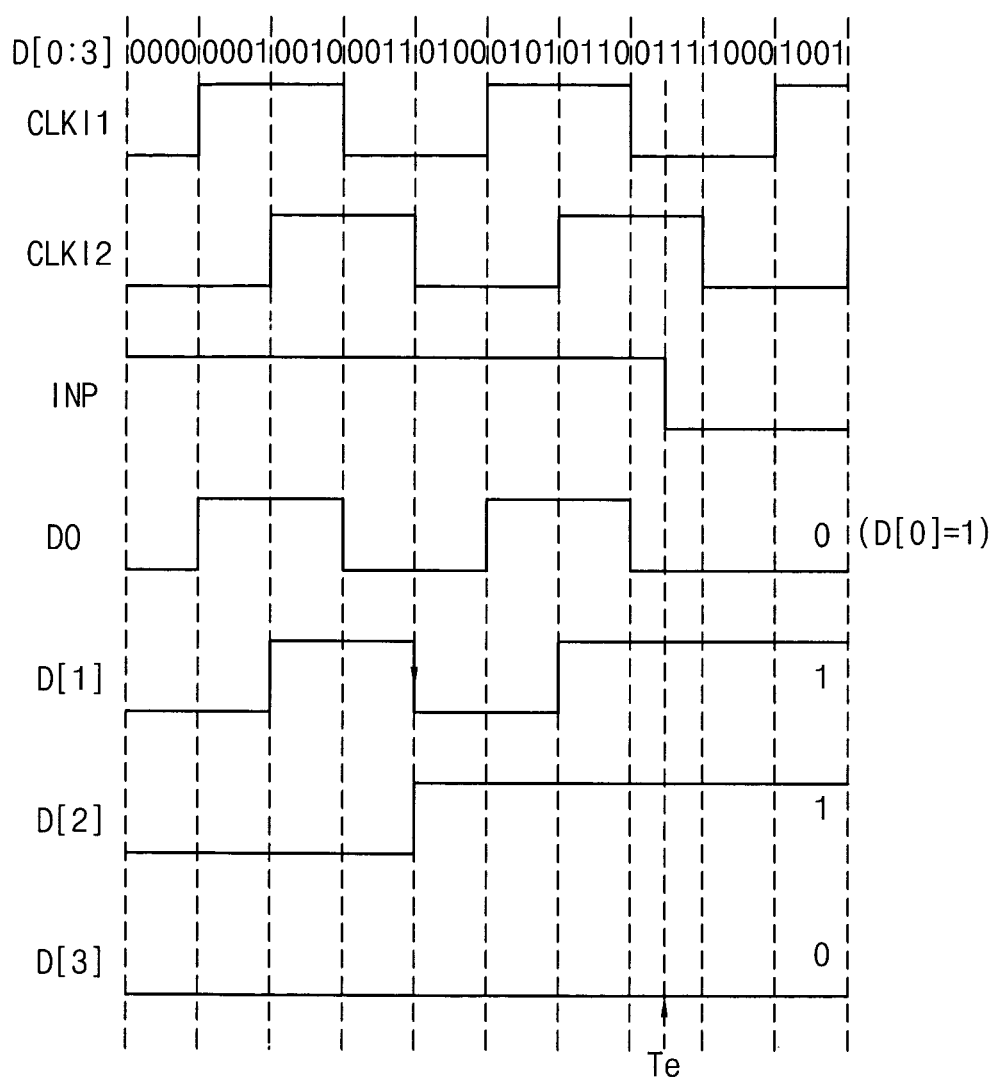

The second counting unit 120f buffers the second input clock signal CLKI2 until the termination time point Te, and latches the second input clock signal CLKI2 at the termination time point Te to generate the second buffered clock signal D[1]. FIG. 11A illustrates an example of the two gray-code bits D0 and D[1] corresponding to 00. FIG. 11B illustrates an example of the two gray-code bits D0 and D[1] corresponding to 01. FIG. 11C illustrates an example of the two gray-code bits D0 and D[1] corresponding to 11. FIG. 11D illustrates an example of the two gray-code bits D0 and D[1] corresponding to 10.

Referring to FIGS. 11A, 11B, 11C, and 11D, the first buffered clock signal D0 toggles similarly as the first input clock signal CLKI1, and the second buffered clock signal D[1] toggles similarly as the second input clock signal CLKI2, until the termination time point Te. As described referring to FIG. 10, the third counting unit 130f toggles in response to the output of the second counting unit 120f instead of an input clock signal such that the counter 100f is implemented with a relatively simple configuration without a feedback switch.

The counter 100f of FIG. 10 performs one of an up-counting operation or a down-counting operation according to the configuration of the counter 100f. Hereinafter, the up-counting operation of the counter 100f is described in reference to FIGS. 12 and 13, and the down-counting operation of the counter 100f is described in reference to FIGS. 14 and 15.

Figure 12:
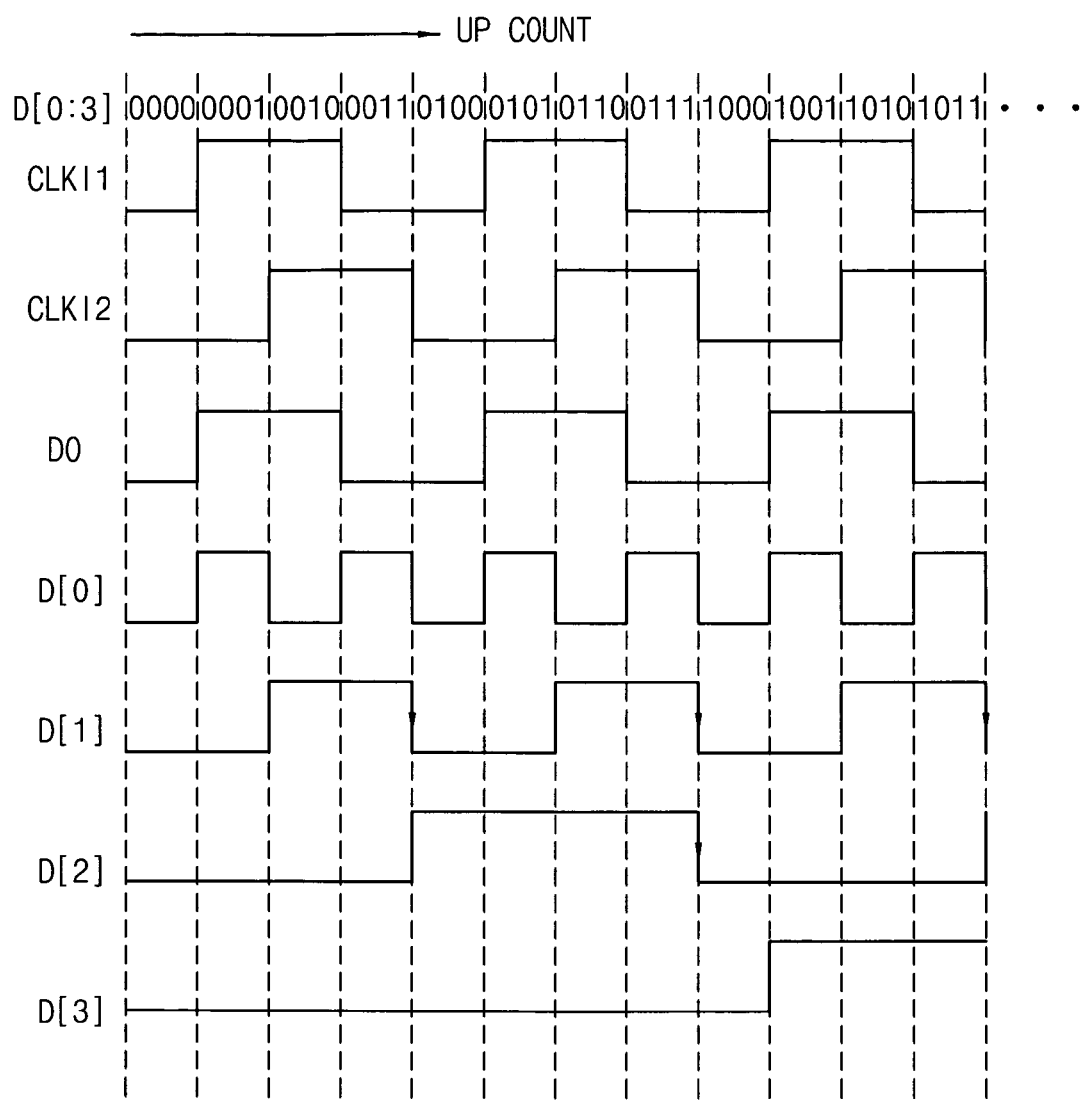
FIG. 12 is a timing diagram of signals during an up-counting operation of the counter of FIG. 10, according to an example embodiment of the present invention.

FIG. 12 is a timing diagram of signals during an up-counting operation of the counter 100f of FIG. 10, according to an example embodiment of the present invention. Referring to FIGS. 10 and 12, the first and second counting units 110f and 120f operate as buffers during the counting operation until the termination time point Te. For performing the up-counting operation, the phase of the first input clock signal CLKI1 precedes the phase of the second input clock signal CLKI2 by 90 degrees as illustrated in FIG. 12. As mentioned above, the least significant bit D[0] is generated by performing a logic operation on the first and second buffered clock signals D0 and D[1]. The second buffered clock signal D[1] is the second least significant bit of the count D[0:3].

The most significant signals D[2] and D[3] toggle respectively in response to falling edges of the output of the previous counting unit. In other words, the third bit signal D[2] toggles in response to the falling edges of the latch output signal LOUT (i.e., D[1]). The fourth bit signal D[3] toggles in response to the falling edges of the third bit signal D[2]. As a result, the two most significant bit signals D[2] and D[3] have respective cyclic periods that are sequentially doubled as illustrated in FIG. 12.

Referring to FIG. 12, the count D[0:3] of the counter 100f increases as 0000, 0001, 0010, 0011, and so on, every quarter of the period of the clock signals CLKI1 and CLKI2. Thus, the counter 100f has a quadrupled operation speed compared with the conventional ripple counter because the counter 100f increments the count four times every the cyclic period of the input clock signal CLKI1 or CLK2.

Accordingly, such counting is referred to as Quadruple Data Rate (QDR) counting, and the counter 100f is referred to as a QDR counter. Due to the quadrupled operation speed, the counter 100f provides a count having two more bits using the clock signal of the same cyclic period in a same counting duration with respect to a conventional ripple counter. In other words, the counter 100a provides more minute counting, for example, such that a slope of a ramp signal in an image sensor may be adjusted for higher operating speed of the image sensor.

Alternatively, even when the counter 100a uses clock signals having a quarter frequency with respect to the conventional ripple counter, the counter 100a provides a count with a same number of bits during a same counting duration as the conventional ripple counter. Accordingly, the QDR counter 100f has reduced power consumption with reduced frequency of the clock signals resulting in enhanced operation margin of the QDR counter 100f and a device including the QDR counter 100f.

Figure 13A:
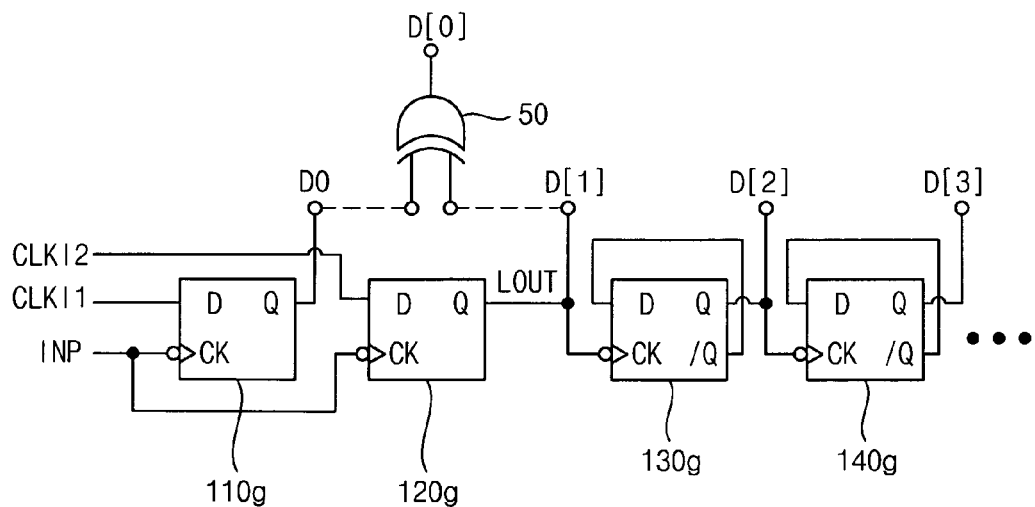
FIGS. 13A and 13B are circuit diagrams of the counter of FIG. 10 for performing an up-counting operation, according to example embodiments of the present invention.
Figure 13B:
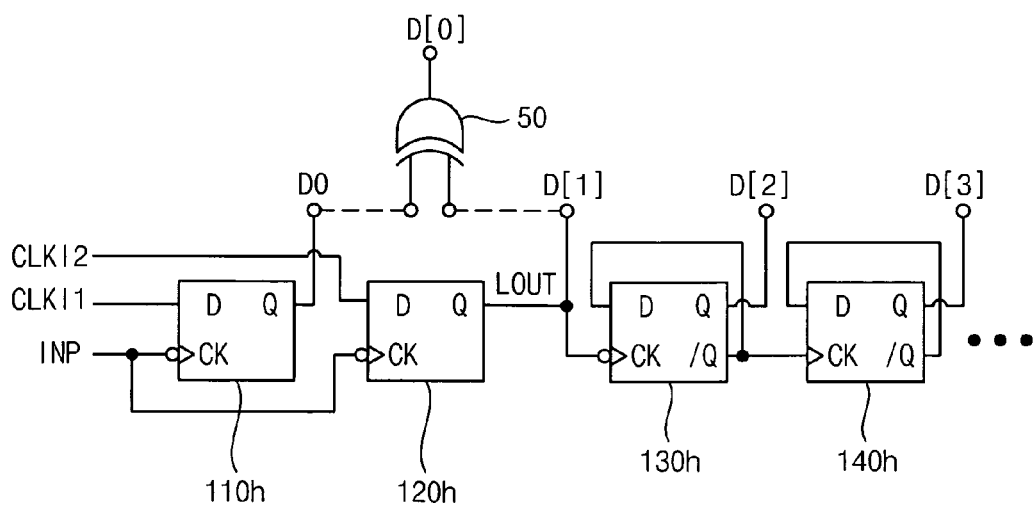

FIGS. 13A and 13B show circuit diagrams of counters 100g and 100h, respectively, as example implementations of the counter 100f of FIG. 10 for performing an up-counting operation, according to example embodiments of the present invention. In FIG. 13A, the first counting unit 110f includes a first clock buffer 110g implemented with a latch, and the second counting unit 120f includes a second clock buffer 120g implemented with another latch.

The first clock buffer 110g has a data terminal D receiving the first input clock signal CLKI1, a clock terminal CK receiving the input signal INP indicating the termination time point Te of the counting operation, and an output terminal Q outputting the first buffered clock signal D0. The second clock buffer 120g has a data terminal D receiving a second input clock signal CLKI2, a clock terminal CK receiving the input signal INP indicating the termination time point Te, and an output terminal Q outputting the second buffered clock signal D[1].

As illustrated in FIGS. 13A and 13B, the ripple counter 30f of FIG. 10 is implemented with a plurality of flip-flops that are cascade-coupled to generate the most significant bit signals D[2] and D[3]. Referring to FIG. 13A, the third and fourth counting units 130g and 140g are implemented as negative-edge triggered flip-flops for generating the most significant bit signals D[2] and D[3]. Referring to FIG. 13B, the third counting unit 130h is implemented as a negative-edge triggered flip-flop and the fourth counting unit 140h is implemented as a positive-edge triggered flip-flop for generating the sequentially toggling most significant bit signals D[2] and D[3] that are sequentially toggling.

In FIG. 13A, the third and fourth counting units 130g and 140g are implemented with the negative-edge triggered flip-flops such that the non-inversion output terminal (Q) of the previous counting unit is coupled to the data terminal D of the next counting unit. In that case, the output signal OUTk provided to the next counting unit corresponds to the k-th bit signal D[k], where k is an integer greater than two.

In contrast, the third counting unit 130h of FIG. 13B is implemented with the negative-edge triggered flip-flop, and the fourth counting unit 140h of FIG. 13B is implemented with the positive-edge triggered flip-flop, such that the inversion output terminal (/Q) of the previous counting unit is coupled to the data terminal D of the next counting unit. In that case, the output signal OUTk provided to the next counting unit corresponds to the inversion signal /D[k] of the k-th bit signal D[k]. As a result, both of the counters 100g and 100h of FIGS. 13A and 13B perform the up-counting operation as illustrated in FIG. 12.

Figure 14:
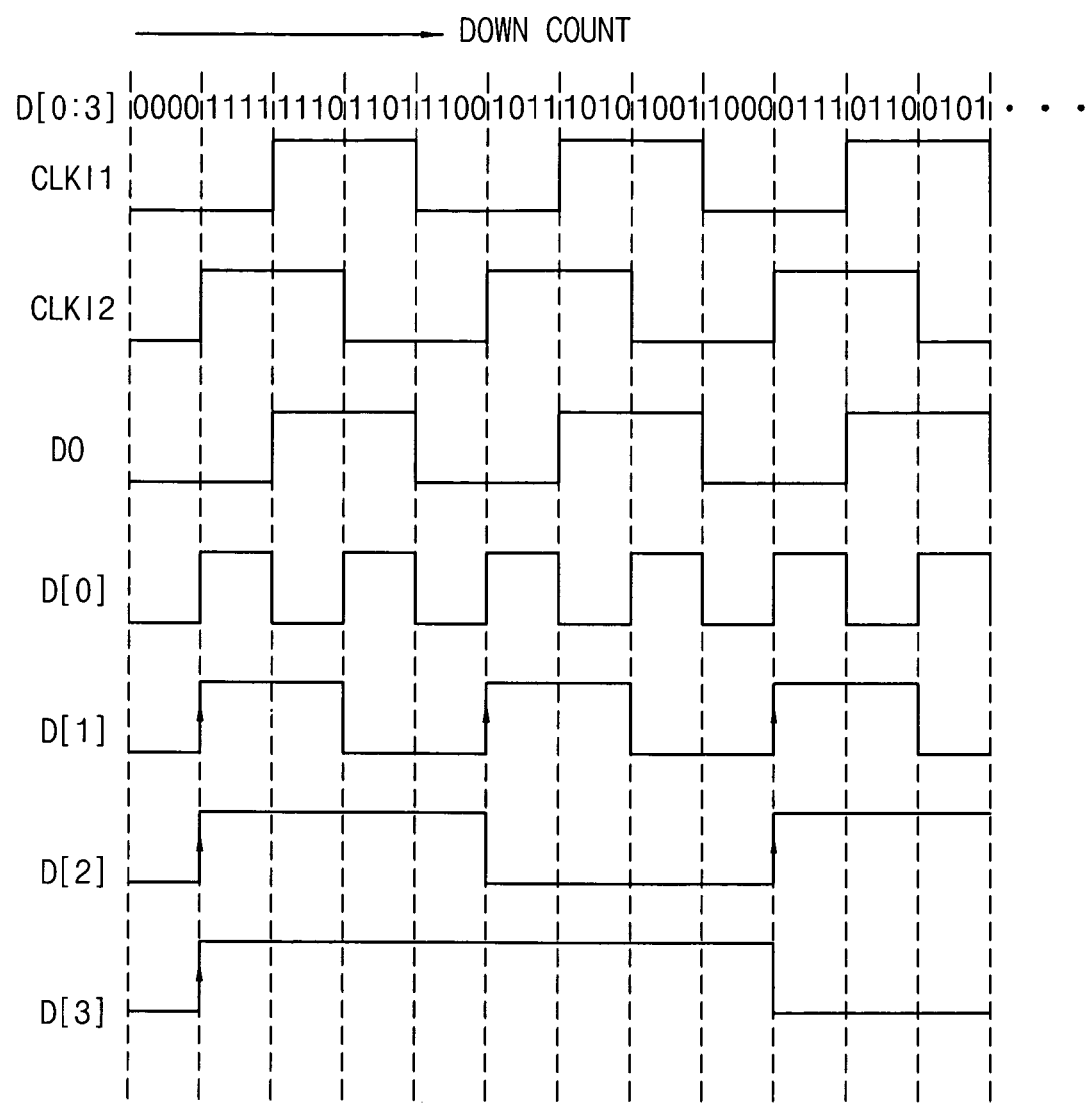
FIG. 14 is a timing diagram of signals during a down-counting operation of the counter of FIG. 10, according to an example embodiment of the present invention.

The positive-edge triggered flip-flops and the negative-edge triggered flip-flops of FIGS. 13A and 13B may be implemented similarly as in FIGS. 6B and 6C, in an example embodiment of the present invention. FIG. 14 is a timing diagram of signals during a down-counting operation of the counter of FIG. 10, according to an example embodiment of the present invention.

Referring to FIGS. 10 and 14, the first and second counting units 110f and 120f operate as buffers during the counting operation for generating the first buffered clock signal D0 toggling with the first input clock signal CLKI1 and the second buffered clock signal D[1] toggling with the second input clock signal CLKI2 until the termination time point Te. For performing the down-counting operation, the phase of the first input clock signal CLKI1 lags the phase of the second input clock signal CLKI2 by 90 degrees as illustrated in FIG. 14. In contrast for performing the up-counting operation, the phase of the first input clock signal CLKI1 precedes the phase of the second input clock signal CLKI2 by 90 degrees as illustrated in FIG. 12.

Similarly as described above in reference to FIG. 10, the least significant bit D[0] is generated from a logic operation of the first and second buffered clock signals D0 and D[1]. The most significant signals D[2] and D[3] toggle respectively in response to rising edges of the output of the previous counting unit. In other words, the third bit signal D[2] toggles in response to the rising edges of the latch output signal LOUT (i.e., the second bit signal D[1]). The fourth bit signal D[3] toggles in response to the rising edges of the third bit signal D[2].

Thus, the most significant bit signals D[2] and D[3] have respective cyclic periods that are sequentially doubled as illustrated in FIG. 14 and represent the two most significant bits of the count D[0:3]. The count D[0:3] in FIG. 14 decreases as 0000, 1111, 1110, 1101, and so on, for down-counting every quarter of the period of the clock signal CLKI1 or CLKI2.

In any case of FIGS. 12 and 14, the counter 100f of FIG. 10 performs the up-counting operation or the down-counting operation with quadrupled operation speed compared with the conventional ripple counter. The counter 100f updates the count four times per the cyclic period of the input clock signal CLKI1 or CLKI2.

Figure 15A:
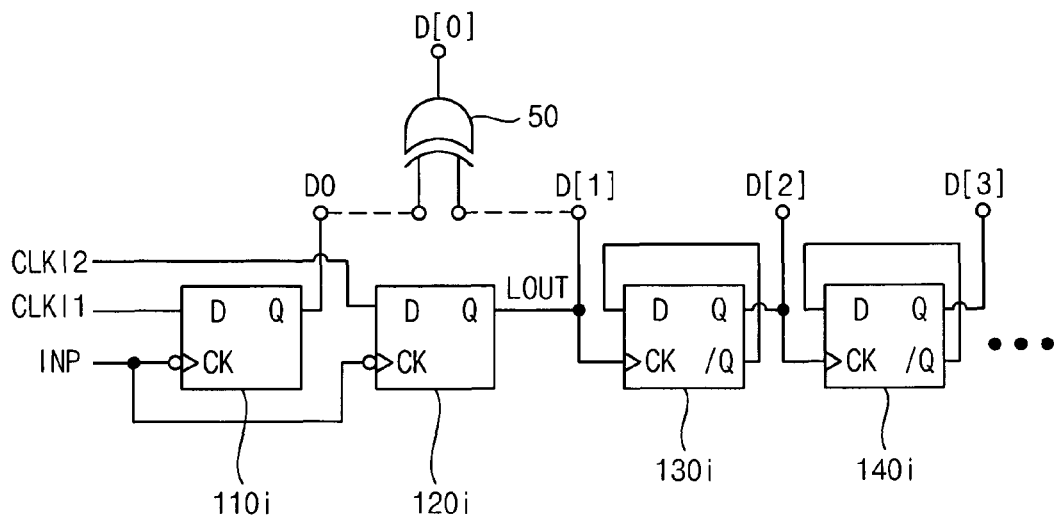
FIGS. 15A and 15B are circuit diagrams of the counter of FIG. 10 for performing a down-counting operation, according to example embodiments of the present invention.
Figure 15B:
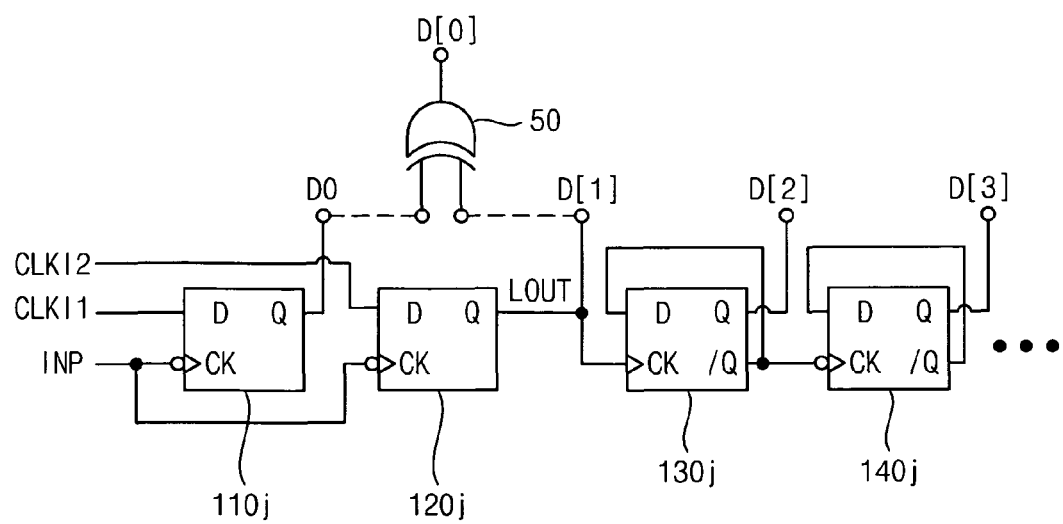

FIGS. 15A and 15B show circuit diagrams of counters 100i and 100j, respectively, as example implementations of the counter 100f of FIG. 10 for performing a down-counting operation, according to an example embodiment of the present invention. In FIG. 15A, the first clock buffer 110i is implemented with a latch, and the second clock buffer 120i is implemented with another latch. The ripple counter 30f of FIG. 10 is implemented with a plurality of flip-flops 130i and 140i that are cascade-coupled to generate the most significant bit signals D[2] and D[3].

In FIG. 15A, the third and fourth counting units 130i and 140i are implemented as positive-edge triggered flip-flops for generating the most significant bit signals D[2] and D[3] that are sequentially toggling. In FIG. 15B, third counting unit 130j is implemented as a positive-edge triggered flip-flop and the fourth counting unit 140j is implemented as a negative-edge triggered flip-flop for generating the most significant bit signals D[2] and D[3] that are sequentially toggling.

In FIG. 15A, the third and fourth counting units 130i and 140i are implemented with the positive-edge triggered flip-flops such that the non-inversion output terminal (Q) of the previous counting unit is coupled to the data terminal D of the next counting unit. In that case, the output signal OUTk provided to the next counting unit corresponds to the k-th bit signal D[k], where k is an integer greater than two.

In contrast in FIG. 15B, the third counting unit 130j is implemented with the positive-edge triggered flip-flop, and the fourth counting unit 140j is implemented with the negative-edge triggered flip-flop, such that the inversion output terminal (/Q) of the previous counting unit is coupled to the data terminal D of the next counting unit. In that case, the output signal OUTk provided to the next counting unit corresponds to the inversion signal /D[k] of the k-th bit signal D[k]. As a result, both of the counters 100i and 100j of FIGS. 15A and 15B perform the down-counting operation as illustrated in FIG. 14.

The positive-edge triggered flip-flops and the negative-edge triggered flip-flops of FIGS. 15A and 15B may be implemented similarly as described in reference to FIGS. 6B and 6C, in an example embodiment of the present invention.

Figure 16:
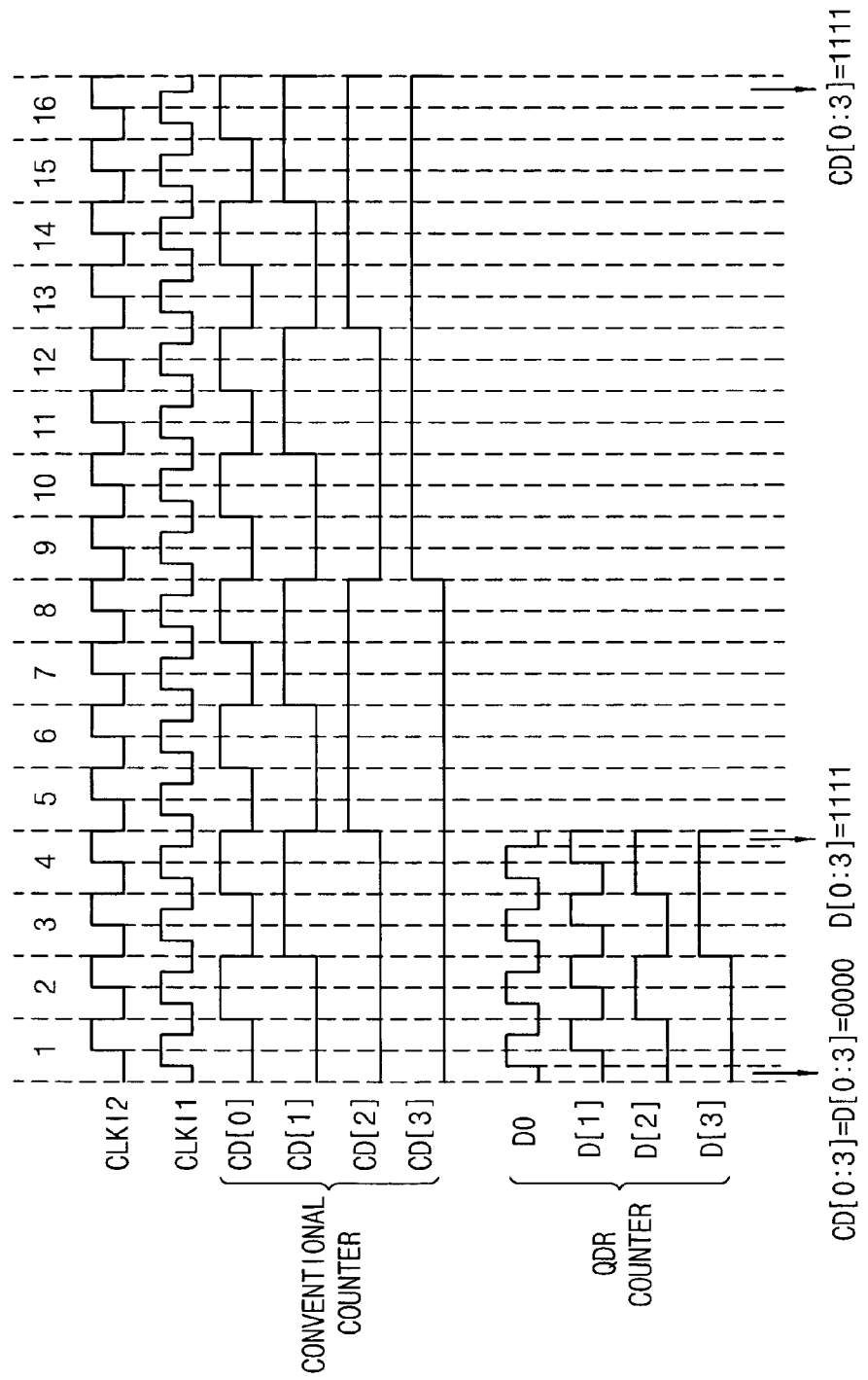
FIG. 16 is a timing diagram of signals during a quadruple data rate (QDR) counting operation of the counter of FIG. 10, according to an example embodiment of the present invention.

FIG. 16 is a timing diagram of signals during a quadruple data rate (QDR) counting operation of the counter of FIG. 10 compared with a counting operation of the conventional counter. Referring to FIG. 16, the conventional ripple counter generates bit signals CD[0], CD[1], CD[2] and CD[3] that count from 0000 to 1111 during sixteen cycles of the input clock signal CLKI. In contrast, the QDR counter 100f according to example embodiments of the present invention counts from 0000 to 1111 during four cycles of the same input clock signal CLKI since the counter 100f counts four times per the cyclic period of the input clock signal CLKI.

Accordingly, the QDR counter 100f has a quadrupled operation speed compared with the conventional ripple counter. Thus, the QDR counter 100f provides a count of a same number of bits in a same counting duration even using a clock signal having a quarter frequency with respect to the conventional ripple counter. Thus, the QDR counter 100f has reduced power consumption with the reduced frequency of the clock signal with enhanced operation margin of the QDR counter 100f and in a device including the QDR counter 100f.

In addition, the first clock buffer 110g, 110h, 110i, or 110j and the second clock buffer 120g, 120h, 120i, or 120j are implemented with latches capable of performing a glitch filtering. Thus, the QDR counter 110f does not require an additional glitch filter for removing glitch noise in the input signal that may cause bit errors.

Figures 17, 18:
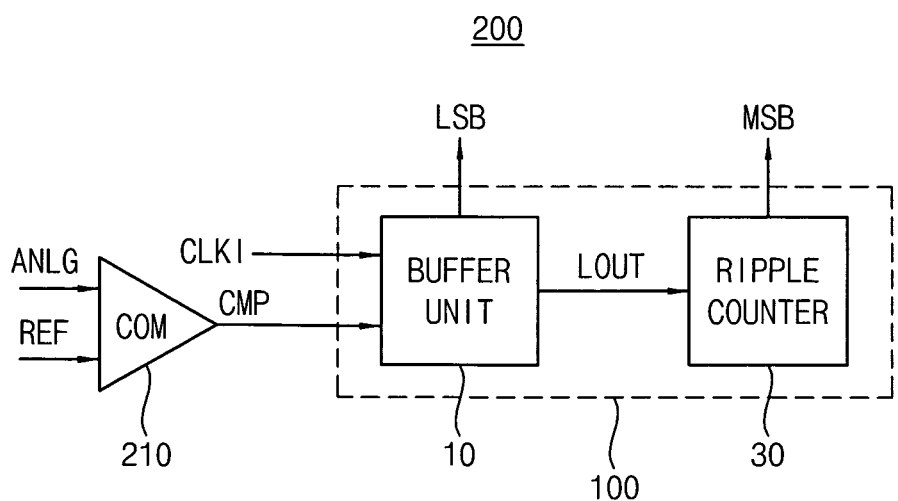
FIG. 17 shows a table of toggling numbers compared for a conventional counter and the counter of FIG. 10, according to an example embodiment of the present invention.
FIG. 18 is a block diagram of a data converter including a multiple data rate counter, according to an example embodiment of the present invention.

FIG. 17 shows a table of a number of togglings for the bits of the count for the counter 100f of FIG. 10 compared with for a conventional counter, for the example of counting from 0000 to 1111 as illustrated in FIG. 16. Referring to FIG. 17, the number of toggling for the first bit signal D0 is reduced to 8 in the QDR counter 100f compared with 15 for the first bit signal CD[0] of the conventional counter. As such, the QDR counter 100f has further reduced power consumption by decreasing the number of toggling of the least significant bit signal, in addition to from the reduced frequency of the clock signal.

Figure 49:
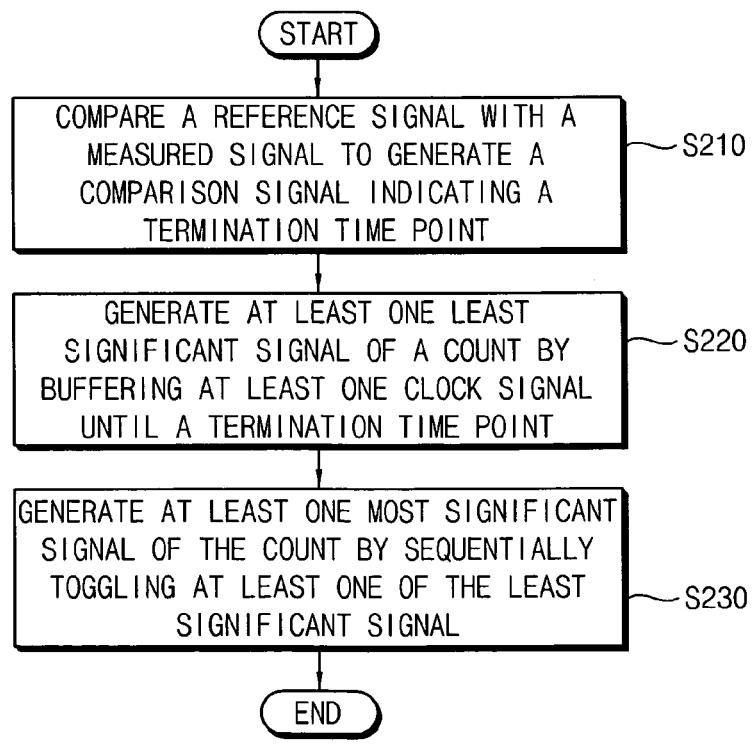
FIG. 49 is a flow chart of steps during a data converting method, according to an example embodiment of the present invention.

FIG. 18 is a block diagram of an analog-to-digital converter (ADC) 200 that is an example data converter including a multiple data rate (MDR) counter according to an example embodiment of the present invention. FIG. 49 is a flow chart of steps during a data converting method according to an example embodiment of the present invention.

Referring to FIGS. 18 and 49, the data converter 200 includes a comparator 210 and a multiple data rate (MDR) counter 100 (similar to the counter 100 of FIG. 1) for performing a MDR (multiple data rate) counting operation. The comparator 210 compares a measured signal, for example, an analog signal ANLG with a reference signal REF to generate a comparison signal CMP (Step S210 of FIG. 49). The analog signal ANLG indicates a physical quantity such as light intensity, sound intensity, time, etc.

For example, the physical quantity corresponds to an analog voltage level ANLG. Additionally in this example, the reference signal REF is a ramp signal that gradually increases or decreases with a predetermined slope to detect the voltage level of the analog signal ANLG. For instance, the reference signal REF is generated by a reference generator 440 in an image sensor 400 of FIG. 20.

The comparator 210 generates the comparison signal that transitions in logic level when the voltage levels of the analog signal ANLG and the ramp signal become equal to each other. As a result, the physical quantity represented by the voltage level of the analog signal ANLG is converted into a time amount corresponding to the transition of the comparison signal CMP. For example, the falling edge of the comparison signal CMP indicates a termination time point of a counting operation in the counter 100.

Figure 29:
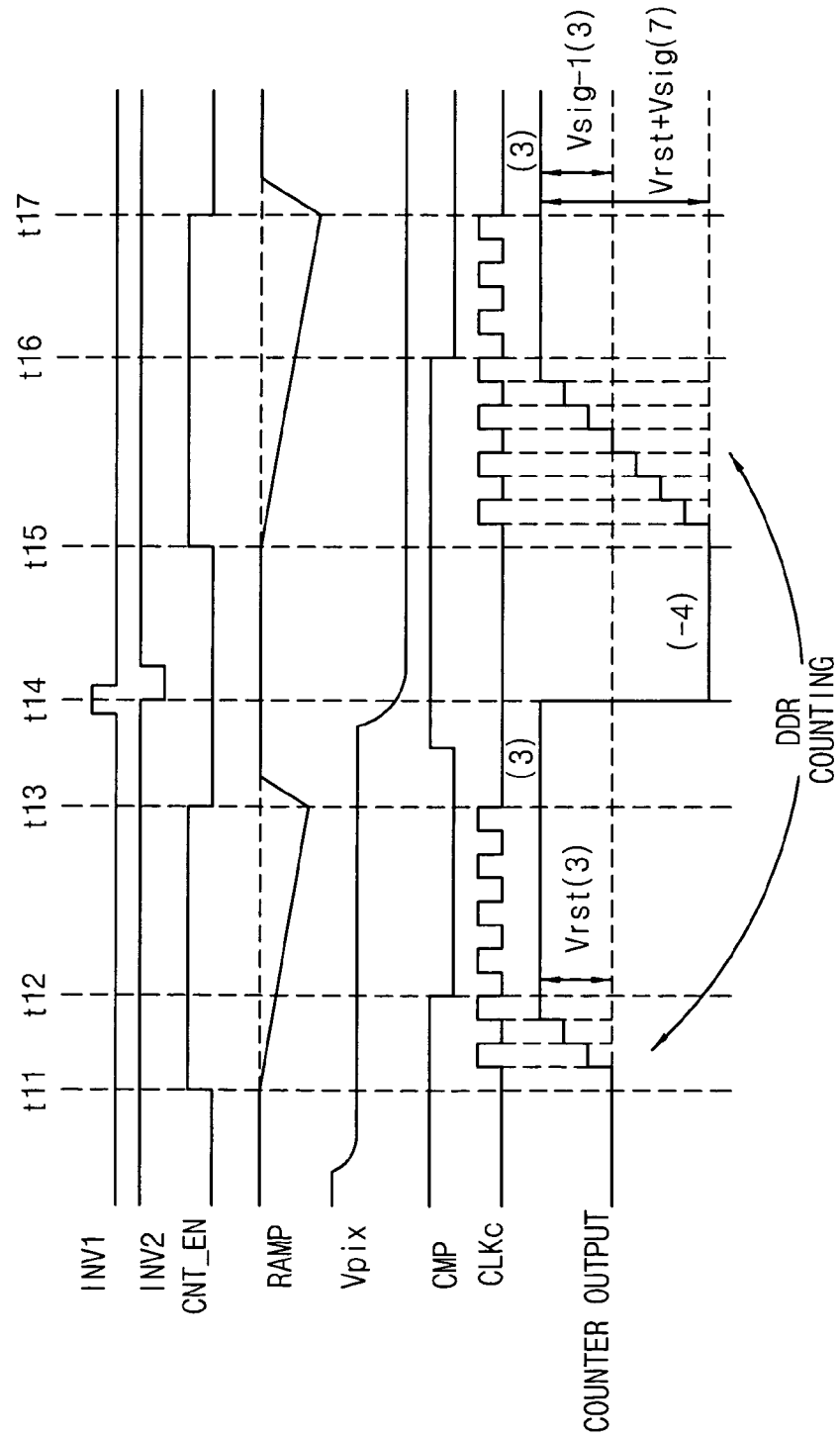
FIG. 29 is a timing diagram of signals during a correlated double sampling (CDS) operation in the image sensor of FIG. 22 including the counter of FIG. 24, according to an example embodiment of the present invention.

The counter 100 counts from a start time point to the termination time point. For example, the start time point is indicated by the input clock signal CLKI beginning to toggle in response to an activated count enable signal CNT_EN as shown in FIG. 29. The counter 100, similarly as described in reference to FIGS. 1 through 17, includes a buffer unit 10 and a ripple counter 30 for performing DDR counting or QDR counting.

The buffer unit 10 generates at least one least significant signal LSB by buffering at least one clock signal CLKI until a termination time point (Step S220 of FIG. 49). As mentioned above, the comparison signal CMP indicates the termination time point of the counting operation, and the buffer unit 10 latches the clock signal CLKI at the termination time point as indicated by the comparison signal CMP. The ripple counter 30 generates at least one most significant signal MSB by sequentially toggling in response to a latch output signal LOUT that is at least one of the least significant signal LSB from the buffer unit (Step S230 of FIG. 49).

As described above for the example of the DDR counter 100a of FIG. 1, the latch output signal LOUT is the first bit signal D[0]. Alternatively as described above for the QDR counter 100f of FIG. 10, the latch output signal LOUT is the second bit signal D[1].

In case of the DDR counter 100a of FIG. 1, the buffer unit 10 includes a clock buffer having a data terminal receiving the input clock signal CLKI, a clock terminal receiving the comparison signal CMP indicating the termination time point of the counting operation, and an output terminal outputting the first bit signal D[0]. In this case, the ripple counter 30 generates the most significant bit signals D[1], D[2] and D[3] that are sequentially toggling.

In case of the QDR counter 100f of FIG. 10, the buffer unit 10 includes a first clock buffer and a second clock buffer. The first clock buffer has a data terminal receiving the first input clock signal CLKI1, a clock terminal receiving the comparison signal CMP indicating the termination time point of the counting operation, and an output terminal outputting the first buffered clock signal D0. The second clock buffer has a data terminal receiving the second input clock signal CLKI2, a clock terminal receiving the comparison signal CMP, and an output terminal outputting the second bit signal D[1] as the second buffered clock signal. In this case, the ripple counter 30 generates the most significant bit signals D[2] and D[3] that are sequentially toggling.

In addition as described above, the counter 100 of FIG. 18 may be variously implemented to perform the up-counting operation or the down-counting operation. In the QDR counter, the first and second buffered clock signals D0 and D[1] may represent the two least significant bits of a count generated in gray code, not in binary code.

Figure 19:
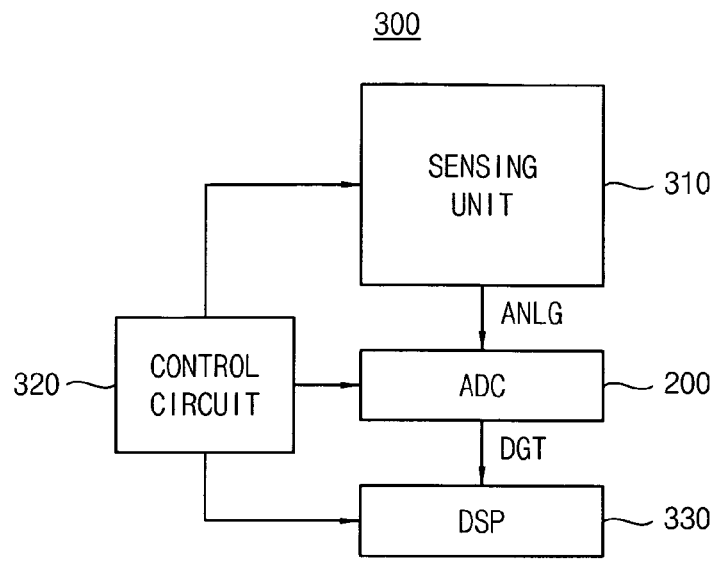
FIG. 19 is a block diagram of an apparatus such as an image sensor including an analog to digital converter (ADC), according to an example embodiment of the present invention.

FIG. 19 is a block diagram of an apparatus 300 including a data converter such as the (analog-digital-converter) ADC 200 of FIG. 18 for example, according to an example embodiment of the present invention. Referring to FIG. 19, the apparatus 300 includes a sensing unit 310, the ADC 200, a control circuit 320, and a DSP (digital signal processor) 330 as an example image signal processor.

The sensing unit 310 measures a physical quantity to generate an analog signal ANLG corresponding to the measured physical quantity. The ADC 200 compares the analog signal ANLG with a reference signal. The ADC 200 includes at least one counter to generate a digital signal DGT corresponding to the analog signal ANLG. The control circuit 320 controls operations of the sensing unit 310, the ADC 200, and the DSP 330.

The ADC 200 similarly as described in reference to FIG. 18 performs data conversion using a DDR counter or a QDR counter, according to an example embodiment of the present invention. The sensing unit 310 measures a physical quantity such as light intensity, sound intensity, time, etc. and converts the measured physical quantity into the analog signal ANLG that is output of the ADC 200.

The apparatus 300 is one of a charge coupled device (CCD) image sensor, a complementary metal oxide semiconductor (CMOS) image sensor, a digital camera including an image sensor, an acoustimeter, a computing system, etc. The apparatus 300 includes the digital signal processor (DSP) 330 for processing the digital signal DGT, and may be disposed in or out of the apparatus 300. The apparatus 300 has enhanced operation speed and reduced power consumption by using at least one DDR or QDR counter as already described herein.

Figure 20:
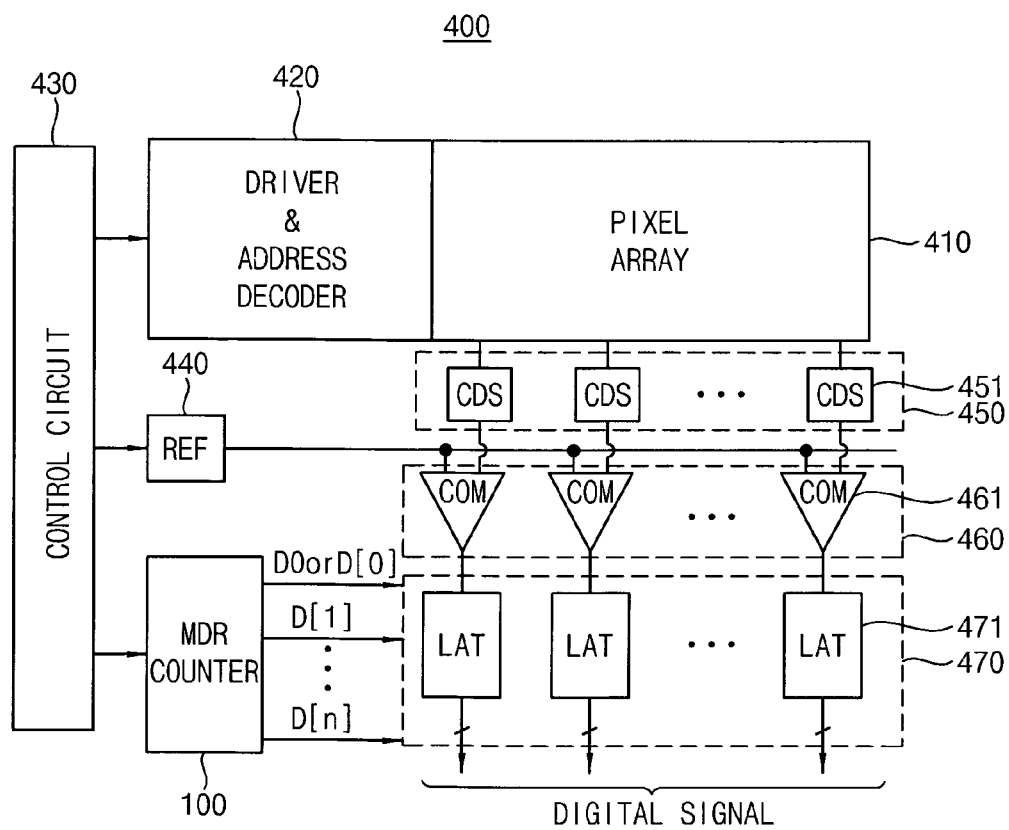
FIGS. 20 and 21 are block diagrams each of an image sensor including a common counter, according to example embodiments of the present invention.
Figure 21:
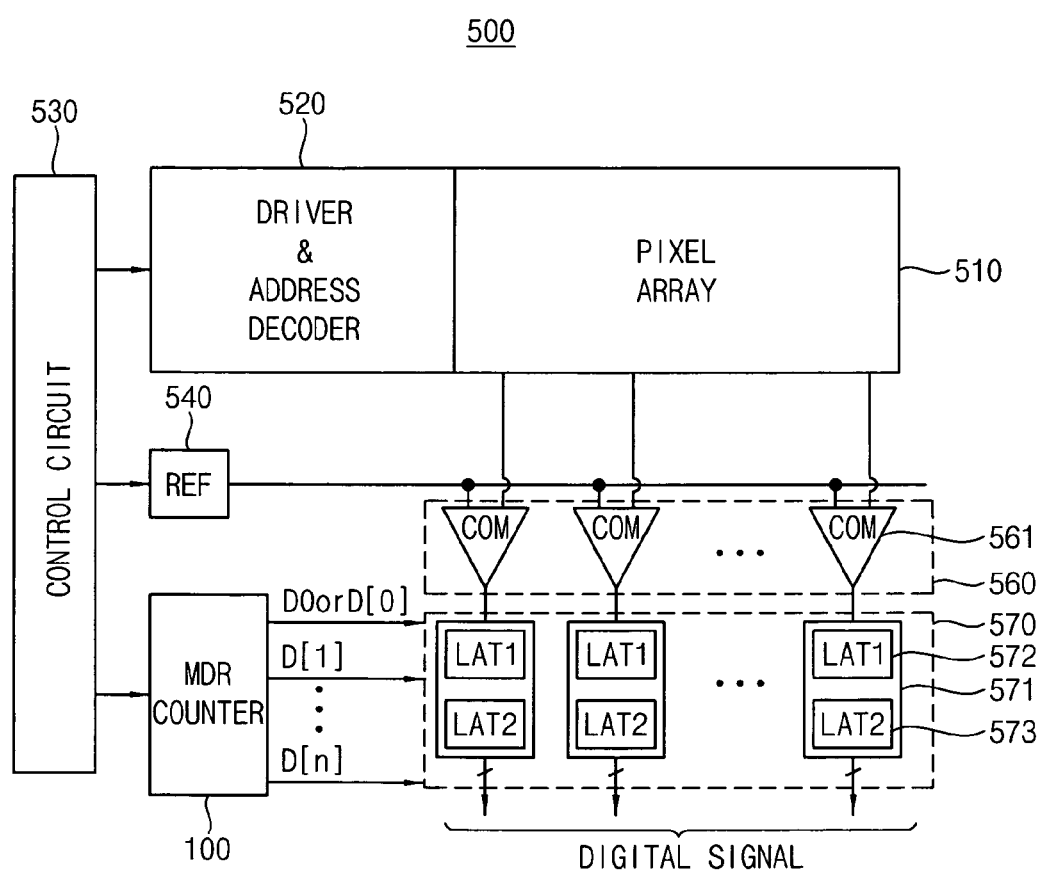

Hereinafter, the example of the apparatus 300 being an image sensor with correlated double sampling is described in further detail. FIGS. 20 and 21 are block diagrams of an image sensor 400 and 500 each including a common counter, according to example embodiments of the present invention. The image sensors 400 and 500 of FIGS. 20 and 21 may each be one of a CCD image sensor or a CMOS image sensor, according to example embodiments of the present invention.

Referring to FIG. 20, the image sensor 400 includes a pixel array 410, a driver/address decoder 420, a control circuit 430, a reference signal generator 440, a correlated double sampling (CDS) unit 450, a comparison unit 460, and a latch unit 470. When the image sensor 400 is a CMOS image sensor, the pixel array 410 includes a plurality of pixels for converting incident light into electrical analog signals.

When the image sensor includes unit cells referred to as active pixels or gain cells, a respective signal from each pixel is detected by address control of the pixels. The active pixel sensor 410 is an address-controlled image sensor, and the driver/address decoder 420 controls operation of the pixel array 410 by each column and/or row. The control circuit 430 generates control signals for controlling operations of the components of the image sensor 400.

The analog signals detected by the pixel array 410 are converted into digital signals by the ADC including the comparison unit 460, the latch unit 470, and the MDR counter 100. The analog signals are output typically column by column. Thus, the CDS unit 450, the comparison unit 460, and the latch unit 470 include a plurality of CDS circuits 451, a plurality of comparators 461, and a plurality of latches 471 corresponding to the columns of the pixel array 410.

The analog signals output from the pixel array include a respective reset signal and a respective measured image signal for each pixel. The respective reset signal represents respective fixed pattern noise (FPN) for the pixel and a respective logic circuit of the pixel. The respective measured image signal is generated from the pixel sensing incident light. A final image signal representing the intensity of incident light at each pixel is indicated by a subtraction of the respective reset signal from the respective measured image signal. Such a final image signal is generated from the CDS procedure.

The CDS unit 450 performs analog double sampling (ADS) by generating a difference between the reset signal and the measured image signal using capacitors and switches. The CDS unit 450 generates analog signals, each being a respective final image signal representing such a difference for each column. The comparison unit 460 compares the analog image signals for the columns of pixel from the CDS unit 450 with the reference signal (e.g., a ramp signal RAMP) from the reference signal generator 440 to generate respective comparison signals for the columns.

Each comparison signal has a respective transition time point that represents the level of the respective analog image signal. The bit signals D[0](or D0), D[1], D[2] and D[3] from the counter 100 are commonly provided to all of the latches 471. Each latch 471 latches the bit signals D[0](or D0), D[1], D[2] and D[3] from the counter 100 at the respective transition time point of the respective comparison signal to generate a respective latched digital signal of the respective final image signal for the respective column.

The counter 100 performs the MDR counting operation according to example embodiments as already described herein. For example, the counting circuit 100 includes a buffer unit and a ripple counter for performing a DDR counting operation or a QDR counting operation as already described herein.

In that case, the buffer unit in FIG. 20 generates one or more least significant bit signals LSB by buffering at least one input clock signal until a termination time point of the counting operation. In addition, the ripple counter in FIG. 20 generates most significant bit signals MSB sequentially toggling in response to a latch output signal that corresponds to one of the least significant bit signals LSB from the buffer unit. The ripple counter is implemented with a plurality of cascade-coupled flip-flops.

The image sensor 400 has enhanced operation speed and operation margin, and reduced power consumption, by performing the analog-to-digital conversion using at least one DDR or QDR counter as described above for example embodiments of the present invention. The MDR counter 100 is adopted in the image sensor 400 of FIG. 20 for performing ADS as described above.

Figure 22:
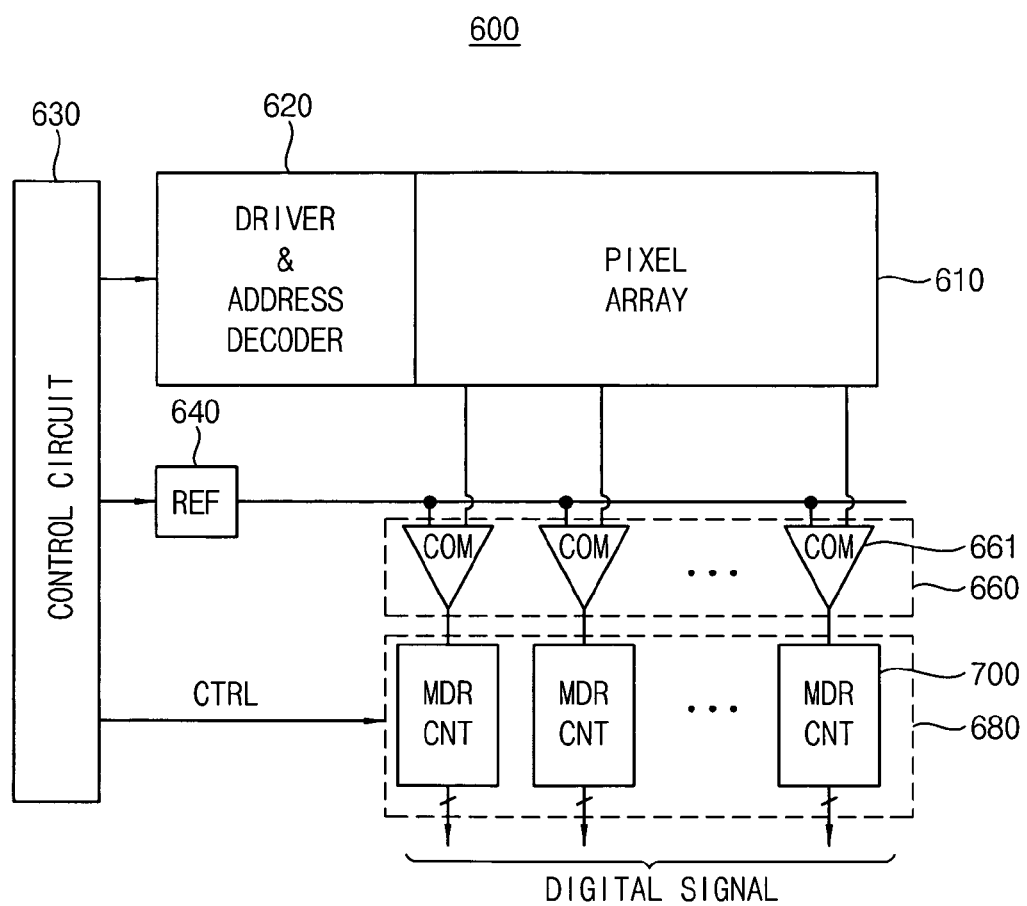
FIG. 22 is a block diagram of an image sensor including a plurality of counters, according to an example embodiment of the present invention.

The MDR counter 100 also may be adopted in an image sensor for performing a digital double sampling (DDS) as the CDS as now described in reference to FIGS. 21 and 22. For DDS, the reset signal and the measured image signal are both converted to respective digital signals. The final image signal is determined from a difference of such respective digital signals.

In the image sensor 500 of FIG. 21, each respective latch 571 for a column includes a respective first latch 572 and a respective second latch 573. The pixel array 510 generates a respective reset signal and a respective measured image signal for each column. In a first sampling, each comparator 561 compares the respective reset signal with a ramp reference signal from the reference signal generator 540 to generate a respective comparison signal having a transition time point corresponding to the level of the reset signal.

The bit signals D[0](or D0), D[1], D[2], D[3] of the count from the MDR counter 100 are commonly provided to all of the latches 572 and 273. The respective first latch 572 latches the bit signals D[0](or D0), D[1], D[2], D[3] from the MDR counter 100 at the transition time point of the respective comparison signal.

In a second sampling, each comparator 561 compares the respective measured image signal with the ramp reference signal to generate a respective comparison signal having a transition time point corresponding to level of the measured image signal. The respective second latch 573 latches the bit signals D[0](or D0), D[1], D[2], D[3] from the MDR counter 100 at the transition time point of the respective comparison signal during the second sampling.

Such first and second count values latched by the first and second latches 572 and 573 during the first and second samplings are provided to internal logic circuits that determines a difference of such count values to determine the final image signal in digital form for DDS in the image sensor 500.

The counter 100 in FIG. 21 performs the MDR counting operation according to example embodiments already described herein. In that case, the counter 100 includes a buffer unit and a ripple counter for performing a DDR counting operation or a QDR counting operation. Thus, the image sensor 500 has enhanced operation speed and operation margin with reduced power consumption, by performing the analog-to-digital conversion using a DDR or QDR counter.

The image sensors 400 and 500 of FIGS. 20 and 21 each include the common counter 100 for performing CDS. Alternatively, an image sensor may include a plurality of counters (referred to as column counters) coupled to the multiple columns. Hereinafter, the image sensor using the column counters each being implemented as a MDR counter having an inversion function or an up-down conversion function for performing DDS is now described.

FIG. 22 is a block diagram of an image sensor 600 including a plurality of MDR counters according to an example embodiment of the present invention. The image sensor 600 includes a pixel array 610, a driver/address decoder 620, a control circuit 630, a reference signal generator 640, a comparison unit 660, and a counting block 680.

The pixel array 610 includes a plurality of pixels for converting incident light into electrical analog signals. The driver/address decoder 620 controls operation of the pixel array 410 by each column and/or row. The control circuit 630 generates control signals CTRL for controlling operation of the components of the image sensor 600. The control signals CTRL may include signals INV1 and INV2 for controlling an inversion operation of the counting block 680 or signals HD and U/D for controlling an up-down conversion operation of the counting block 680 as will be described.

The analog signals generated by the pixel array 610 are converted into digital signals by an ADC (analog-to-digital converter) including the comparison unit 660 and the counting block 680. The analog signals are output column by column. Thus, the comparison unit 660 and the counting block 680 include a respective comparator 661 and a respective MDR counter 700 for each column. Accordingly, the image sensor 600 simultaneously processes the analog signals for the columns of one row for enhanced operation speed and reduced noise.

The pixel array 610 sequentially outputs a respective reset signal and a respective measured image signal from a pixel for CDS. The ADC including the comparison unit 660 and the counting block 680 performs CDS digitally on such reset and measured image signals for performing DDS for the columns of the pixel array 610.

Figure 50:
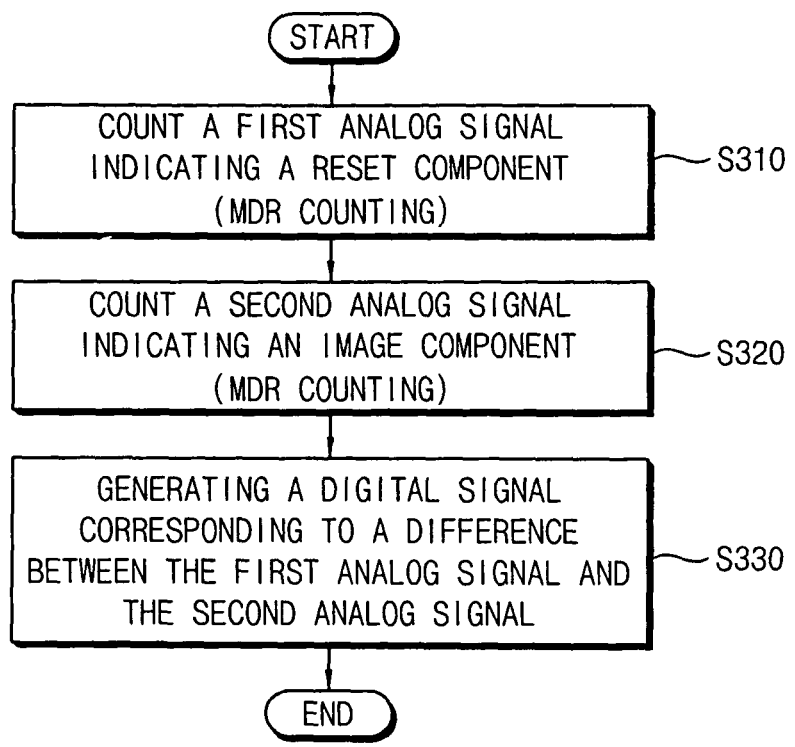
FIG. 50 is a flow chart of steps during a CDS method, according to an example embodiment of the present invention.

FIG. 50 shows a flow chart of steps during a CDS method according to an example embodiment of the present invention. Referring to FIGS. 22 and 50, the ADC including the comparison unit 660 and the counting block 680 counts for the reset signal to generate a first count (Step 310 of FIG. 50) and counts for the measured image signal to generate a second count (Step 320 of FIG. 50). Thereafter, a digital signal corresponding to a difference between the reset and measured image signals is determined by the MDR counters 700 having an inversion function or an up-down conversion function (Step S330 of FIG. 50). Each MDR counter 700 is implemented with a buffer unit and a ripple counter as already described herein for example embodiments of the present invention.

Each MDR counter 700 stores the first count for the reset signal, performs an inversion operation or an up-down conversion operation on such a first count as will be described below, and then performs the second count for the measured image signal. Accordingly the MDR counter 700 generates the final image signal according to CDS. In this manner, the image sensor 600 has enhanced operation speed and operation margin with reduced power consumption, by performing the analog-to-digital conversion using the DDR or QDR counter that operates similarly as already described herein.

Each counter 700 has the inversion function or the up-down conversion function for DDS, in addition to performing the MDR counting operation as described above. Hereinafter, the inversion function or the up-down conversion function of the counter 700 is described.

Figure 23:
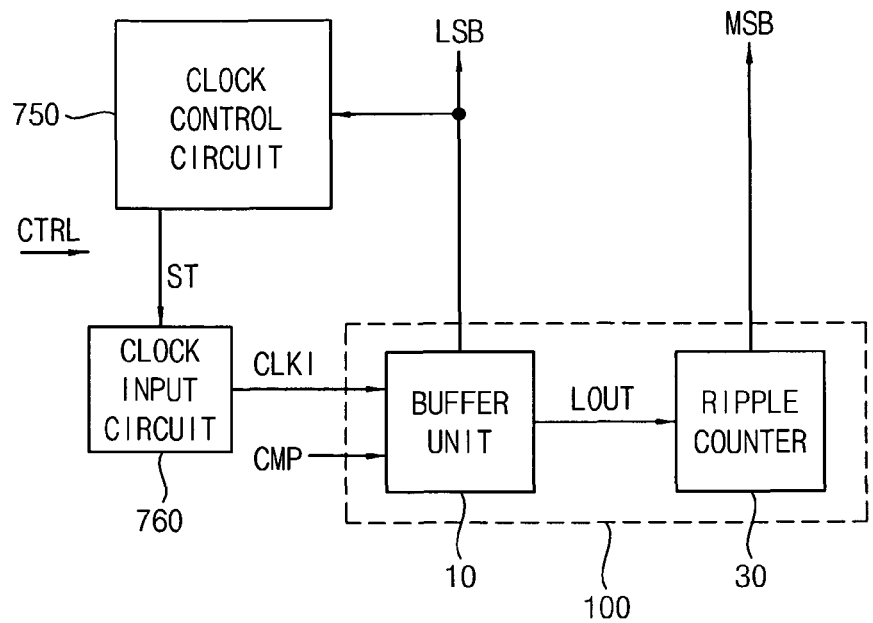
FIG. 23 is a block diagram of a counter used in an image sensor, according to an example embodiment of the present invention.

FIG. 23 is a block diagram of the counter 700 according to an example embodiment of the present invention. The counter 700 includes a buffer unit 10, a ripple counter 30, a clock control circuit 750, and a clock input circuit 760. The buffer unit 10 and the ripple counter 30 are similar as described above in reference to FIG. 1 but also includes inversion or up-down conversion capabilities.

Thus, the buffer unit 10 generates one or more least significant bit signals LSB by buffering the input clock signal CLKI until a termination time point and by latching the input clock signal CLKI at the termination time point. The ripple counter 30 generates most significant bit signals MSB by sequentially toggling in response to a latch output signal LOUT that corresponds to one of the least significant bit signals LSB from the buffer unit 10.

Compared with the counter 100 of FIG. 1, the counter 700 of FIG. 23 further includes the clock control circuit 750 and the clock input circuit 760. The clock control circuit 750 generate a clock control signal ST in response to the least significant bit signals LSB. The clock input circuit 760 inverts the input clock signal CLKI or selects the input clock signal CLKI among a plurality of clock signals, in response to the clock control signal ST.

Bit errors in the MDR counter may occur from the inversion operation or the up-down conversion operation for DDS. The input clock signal CLKI is adjusted (inverted or selected) after terminating the first count for the reset signal and before starting the second count for the measured image signal for preventing such bit errors.

Figure 24:
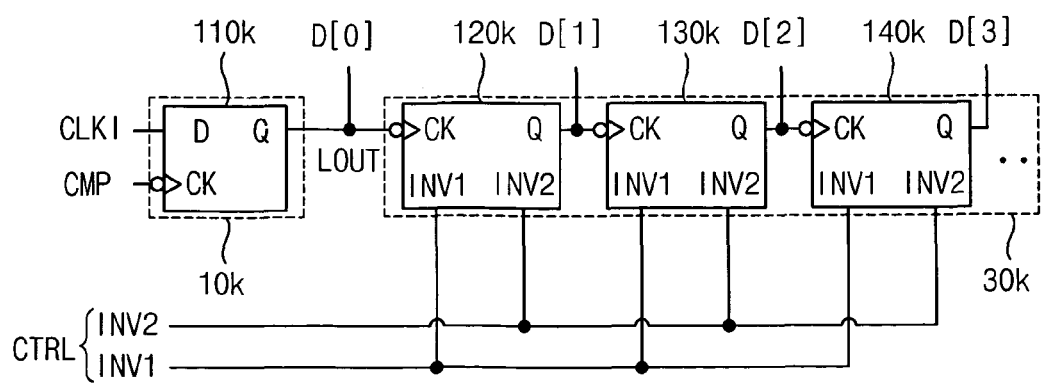
FIG. 24 is a circuit diagram of the counter of FIG. 23 having an inversion function, according to an example embodiment of the present invention.
Figure 30:
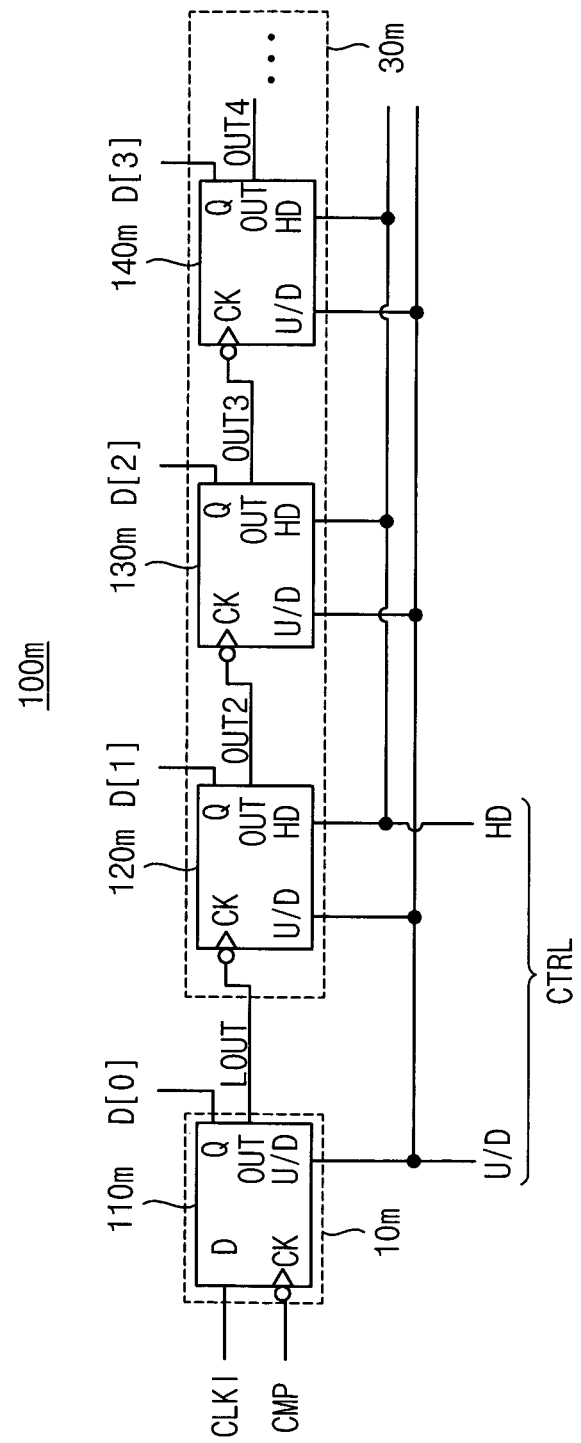
FIG. 30 is a circuit diagram of the counter of FIG. 23 having an up-down conversion function, according to an example embodiment of the present invention.

DDS of the image sensor 600 of FIG. 22 may be performed using a DDR counter 100$k$ of FIG. 24 having an inversion function or a DDR counter 100$m$ of FIG. 30 having an up-down conversion function. Also DDS of the image sensor 600 may be performed using a QDR counter 100$n$ of FIG. 36 having an inversion function or a QDR counter 100$p$ of FIG. 44 having an up-down conversion function.

FIG. 24 is a circuit diagram of the counter 100$k$ (similar to the counter 23 of FIG. 23) having an inversion function according to an example embodiment of the present invention. The counter 100$k$ includes a first counting unit 110$k$, a second counting unit 120$k$, a third counting unit 130$k$, and a fourth counting unit 140$k$. The first counting unit 110$k$ corresponds to a buffer unit 10$k$, and the subsequent counting units 120$k$, 130$k$ and 140$k$ correspond to a ripple counter 30$k$.

For convenience of description, the clock control circuit 750 and the clock input circuit 760 of FIG. 23 are omitted in FIG. 24, and will be described later in reference to FIG. 26.

The first counting unit 110$k$ is implemented with a first latch having a data terminal D receiving an input clock signal CLKI, a clock terminal CK receiving a comparison signal CMP indicating the termination time point Te of the counting operation, and an output terminal Q outputting a first bit signal D[0]. The ripple counter 30$k$ including the subsequent counting units 120$k$, 130$k$ and 140$k$ generates the most significant bit signals D[1], D[2] and D[3] that are sequentially toggling.

The second, third, and fourth counting units 120$k$, 130$k$ and 140$k$ are implemented with a plurality of flip-flops that are cascade-coupled and have similar configurations. As an example, FIG. 25 shows a circuit diagram of an example implementation of the second counting unit 120$k$. The third and fourth counting units 130$k$ and 140 may be similarly implemented.

Referring to FIG. 25, the second counting unit 120$k$ includes a flip-flop 731 and an inversion multiplexer 732. The inversion multiplexer 732 selects one of an output of the previous counting unit (that is, the latch output signal LOUT) and a second inversion control signal INV2 in response to a first inversion control signal INV1 to generate an output signal OUT2 to the next counting unit (that is, the third counting unit 130$k$).

The flip-flop 731 performs the above-mentioned toggling operation when the output of the previous counting unit is selected, and performs an inversion operation whereby the logic level of its output is inverted when the second inversion control signal INV2 is selected. As such, the second counting unit 120$k$, the third counting unit 130$k$, and the fourth counting unit 140$k$ each includes a respective inversion multiplexer 732 and a respective flip-flop 731. Such inversion multiplexers form an inversion control unit that inverts the most significant bit signals D[1], D[2] and D[3] based on the inversion control signals INV1 and INV2.

The flip-flop 731 of FIG. 25 is negative-edge triggered, and the output signal OUT2 corresponds to the second bit signal D[1]. The present invention may also be practiced with the flip-flop being positive-edge triggered such that the output signal OUT2 corresponds to an inversion /D[1] of the second bit signal.

FIG. 26 is a circuit diagram of a clock control circuit 750$a$ (similar to 750 of FIG. 23) and a clock input circuit 760$a$ (similar to 760 of FIG. 23) in the counter 100$k$ of FIG. 24. The clock control circuit 750$a$ generates a clock control signal ST based on the first bit signal D[0]. The clock input circuit 760$a$ inverts the input clock signal CLKI in response to the clock control signal ST.

The clock control circuit 750$a$ is implemented with a latch 751 and an inverter 755 that inverts the first bit signal D[0] to output the inversion signal /D[0]. The latch 751 has a data terminal D receiving the output of the inverter 755, a clock terminal CK receiving the first inversion control signal INV1, and an output terminal Q outputting the clock control signal ST. The latch 751 performs a latch operation in response to the first inversion signal INV1 such that the logic level of the clock control signal ST is determined according to the logic level of the first bit signal D[0] after the first counting for the reset signal is terminated and before the inversion operation is performed.

The clock input circuit 760$a$ includes a multiplexer 761 that generates the input clock signal CLKI by selecting a clock signal CLKC or an inversion /CLKC of the clock signal depending on the logic level of the clock control signal ST.

The clock signal CLKC is activated in response to the count enable signal CNT_EN. Referring to FIG. 26, an AND gate 60 is also included in the control circuit 630 of FIG. 22 for generating the clock signal CLKC that is activated to toggle as another clock signal CLK when the count enable signal CNT_EN is activated to logic high.

Figures 27, 28A:
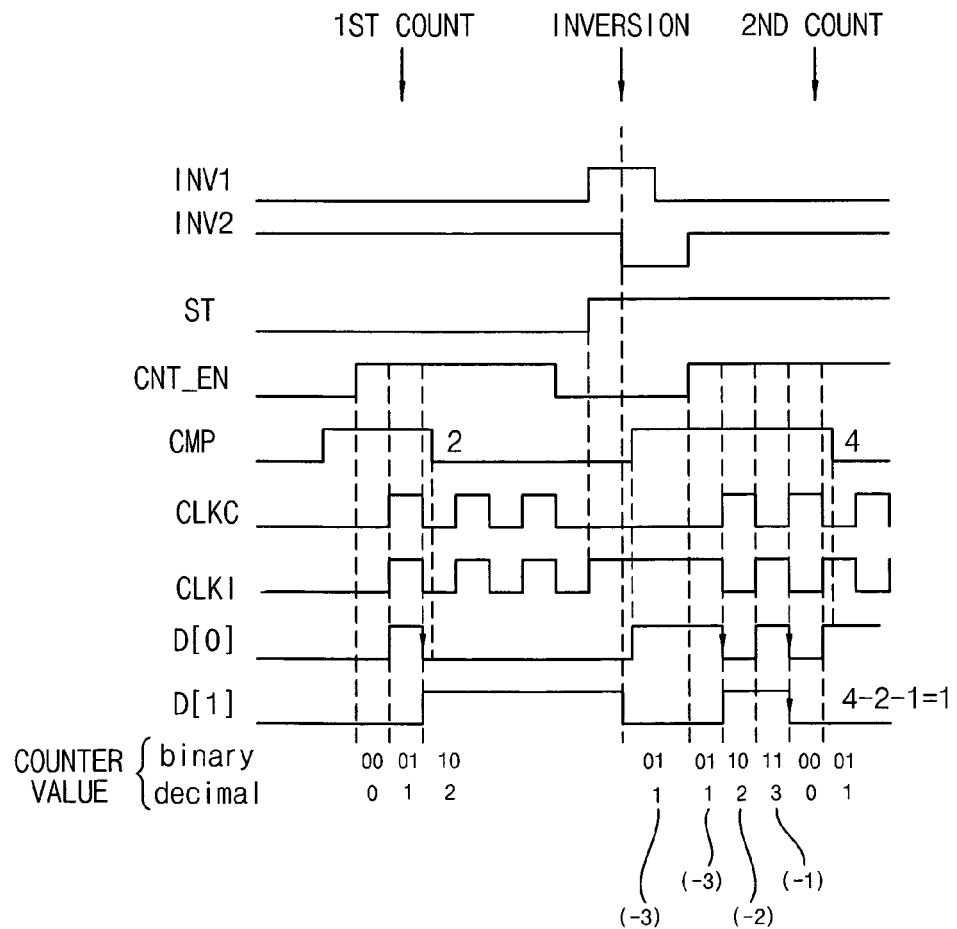
FIG. 27 shows a table of bit values of the count during counting with the inversion function in the counter of FIG. 24, according to an example embodiment of the present invention.
FIGS. 28A and 28B are timing diagrams of signals during the counting operation with the inversion function of the counter of FIG. 24, according to example embodiments of the present invention.
Figure 28B:
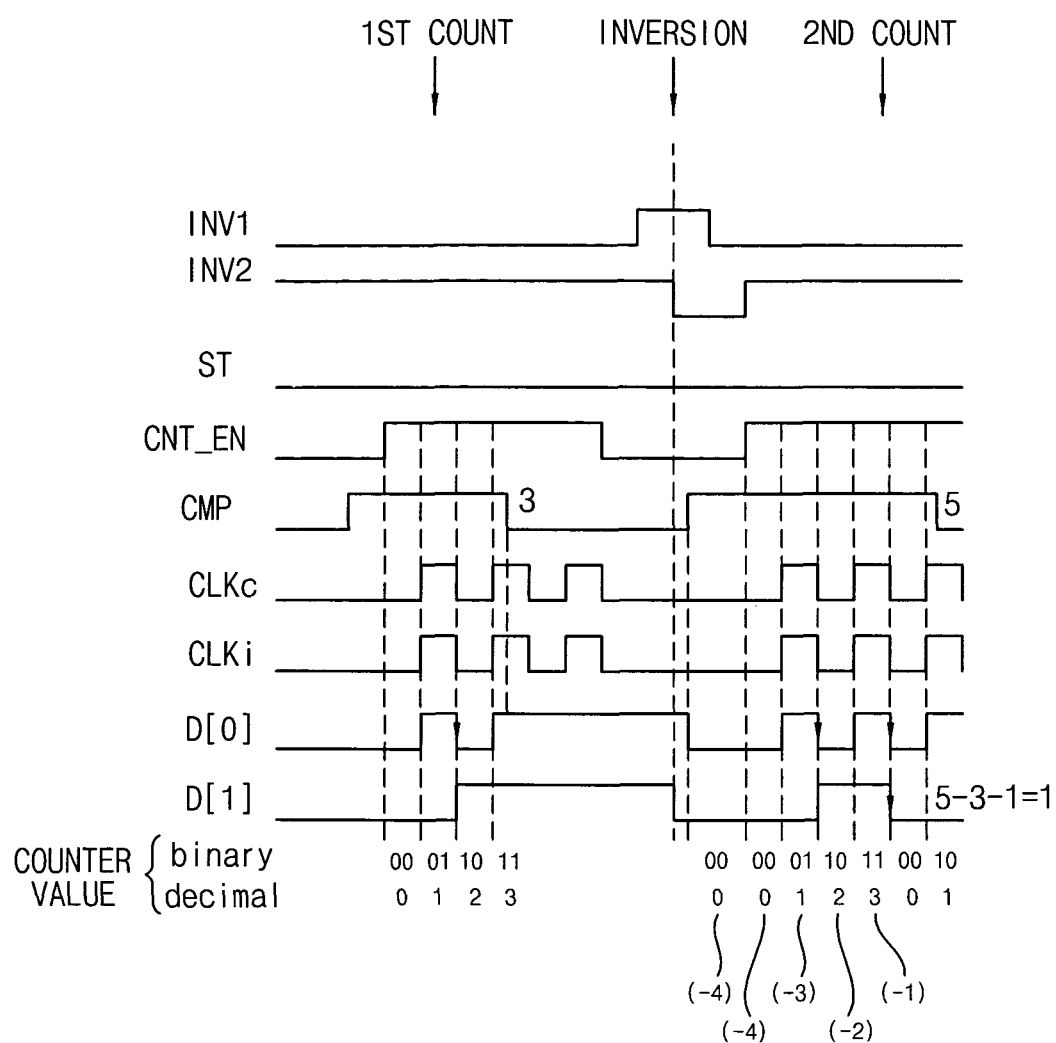

FIGS. 28A and 28B are timing diagrams of signals during the counting operation with the inversion function in the counter 100k of FIG. 24. Referring to FIGS. 28A and 28B, the counter 100k having the inversion function first performs a first counting operation for converting the analog reset signal into a first cont that digitally represents the reset signal. Thereafter, an inversion operation is performed for inverting the first count.

Subsequently, a second counting operation is performed for counting with the analog measured image signal from the inversion of the first count to generate a second count that represents the final image signal that is a difference of the reset signal and the measured image signal. For example, the first and second counting are up-counting operations as illustrated in FIGS. 28A and 28B.

FIG. 27 shows a table for describing the counting operation with the inversion function of the counter 100k of FIG. 24. FIG. 27 shows bit values of the first bit signal D[0] and the second bit signal D[1] from the first count operation, the inversion operation, and the second counting operation for a first edge counting or a second edge counting as described further below.

Bit errors may occur in the DDR counter 100k if the second count is performed merely on the inversion of the first count. To prevent such bit errors, the first counting unit 110k of FIG. 24 does not include the inversion multiplexer 732 as illustrated in FIG. 25. Instead of direct inversion of the first bit signal D[0], the input clock signal CLKI applied to the first counting unit 110k is inverted depending on the first count so that the second counting operation starts by counting according to the first edge of the input clock signal CLKI for all cases of the first count.

Referring to FIG. 27, when the first bit signal D[0] of the first count is logic low (i.e., "0"), the second bit signal D[1] is toggled at the first edge of the input clock signal CLKI in the second counting operation. When the first bit signal D[0] of the first count is logic high (i.e., "1"), the second bit signal D[1] is toggled at the second edge of the input clock signal CLKI in the second counting operation.

The clock control signal ST is initialized to logic low before the first counting operation is performed. The latch 751 of FIG. 26 includes a reset switch as illustrated in FIG. 6B for such an initialization.

FIG. 28A illustrates DDS for the example of the first bit signal D[0] of the first count being logic low. In that case, the clock control signal ST transitions to logic high in response to the rising edge of the first inversion control signal INV1, since the inversion signal /D[0] is applied to the data terminal D of the clock control circuit 750a of FIG. 26.

In response to the clock control signal ST that is logic high, the inverted clock signal /CLKC is selected as the input clock signal CLKI by the clock input circuit 760a for the second counting operation. Accordingly, the second counting operation begins by toggling the second bit signal D[1] at the second edge (i.e., the falling edge) of the input clock signal CLKI occurring after the inversion operation.

For convenience of illustration and description, the two least significant bits D[0] and D[1] of the count and the corresponding decimal values are shown in the bottom of FIG. 28A. An example of the count with a 6-bit binary code is shown in Table 1 below.

In Table 1 below, a first value CV1 is an initialized value, and second and third values CV2 and CV3 represent up-counting two times from the initialized value during the first count operation. A fourth value CV4 represents the inversion operation of the third value CV3. Fifth through eighth values CV5 through CV8 represent up-counting four times from the fourth value CV4 during the second count operation.

TABLE 1

|  | decimal | binary | | | | | |
| --- | --- | --- | --- | --- | --- | --- | --- |
|  |  | D[5] | D[4] | D[3] | D[2] | D[1] | D[0] |
| CV1 | 0 | 0 | 0 | 0 | 0 | 0 | 0 |
| CV2 | 1 | 0 | 0 | 0 | 0 | 0 | 1 |
| CV3 | 2 | 0 | 0 | 0 | 0 | 1 | 0 |
| CV4 | −3 | 1 | 1 | 1 | 1 | 0 | 1 |
| CV5 | −2 | 1 | 1 | 1 | 1 | 1 | 0 |
| CV6 | −1 | 1 | 1 | 1 | 1 | 1 | 1 |
| CV7 | 0 | 0 | 0 | 0 | 0 | 0 | 0 |
| CV8 | 1 | 0 | 0 | 0 | 0 | 0 | 1 |

In the Table 1 above, the final result of DDS (i.e., the count CV8=4−2−1=1) is the case for the reset signal being 2 and the measured image signal being 4. The final count CV8 (4−2−1−1) represents the final image signal derived from CDS but is offset by 1. However, the offset of 1 is common to all cases of the reset and image signals that may be corrected during post-processing of the digital signal CV8 by the digital signal processor (DSP) 330 for example.

As shown in Table 1, the count may be considered as a positive value when the most significant bit D[5] is 0, and as a negative value when the most significant bit D[5] is 1. For example, a negative final count may be considered as a meaningless value due to an error, and may be converted to 0 (that is, no signal) during post-processing of the digital signal CV8.

FIG. 28B illustrates DDS when the first bit signal D[0] of the first count is logic high. In that case, the clock control signal ST is maintained to be logic low as initialized even as the rising edge of the first inversion control signal INV1 is applied on the clock terminal CK of the clock control circuit 750a. In response to the clock control signal ST that is logic low, the clock signal CLKC is output as the input clock signal CLKI (that is, the input clock signal CLKI is maintained similarly as the first counting operation) by the clock input circuit 760a for the second counting operation. Accordingly, the second counting operation begins by toggling the second bit signal D[1] at the second edge (i.e., a falling edge) of the input clock signal CLKI.

In this manner, bit errors of DDS is prevented by inverting the input clock signal CLKI by the clock control circuit 750a and the clock input circuit 760a depending on the first bit signal D[0] after the first counting operation and before the second counting operation.

FIG. 29 is a timing diagram of signals during a correlated double sampling (CDS) operation of the image sensor 600 of FIG. 22 with each MDR counter 700 being implemented similarly to the counter 100k of FIG. 24. FIG. 29 illustrates the DDS operation with respect to one column of the pixel array 610.

At time t11 (i.e., a first start time point), the count enable signal CNT_EN from the control circuit 630 is activated to logic high, and the reference signal generator 640 begins to ramp down the voltage level of the ramp signal RAMP. Accordingly, the first counting operation begins column by column in the respective counters 700. A pixel voltage signal Vpix generated from a respective pixel of a column of the pixel array 610 is provided to the comparator 661. At time point t11, the pixel voltage signal Vpix is at the level representing the reset signal.

At time t12, the voltage levels of the ramp signal RAMP and the pixel voltage signal Vpix become equal to each other such that the comparison signal CMP of the comparator 661 transitions to logic low from logic high for indicating a first termination time point Te of the first counting operation. In response to the falling edge of the comparison signal CMP, the first count (Vrst=3) corresponding to the reset signal is stored in the counter 100k.

At time t13, the count enable signal CNT_EN is deactivated to logic low, and the reference signal generator 640 is disabled. The time interval from t11 to t13 corresponds to a maximum time for counting for the reset signal which may be determined as a number of clock cycles according to characteristics of the image sensor 600.

At time t14, the second inversion control signal INV2 transitions to logic low from logic high while the first inversion control signal INV1 is activated to logic high. Accordingly, the most significant bit signals D[1], D[2] and D[3] are inverted by the inversion control unit including the inversion multiplexers 722 to generate an inverted count (for example, −4) that is stored in the counter 100k. Similarly as described above, the clock control circuit 750a and the clock input circuit 760a determine inversion or non-inversion of the input clock signal CLKI for the second counting operation at the rising edge of the first inversion control signal INV1.

At time t15 (i.e., a second start time point), the count enable signal CNT_EN from the control circuit 630 is activated again to logic high, and the reference signal generator 640 ramps down the voltage level of the ramp signal RAMP. The slope of the ramp signal RAMP during the first and second counting operations are the same, according to an example embodiment of the present invention. Accordingly, the second counting operation begins column by column in the respective counters 700. The pixel voltage signal Vpix having a voltage level that represents the measured image signal is provided to the comparator 661.

At time t16, the voltage levels of the ramp signal RAMP and the pixel voltage signal Vpix become equal to each other such that the comparison signal CMP of the comparator 661 transitions to logic low for indicating a second termination time point of the second counting operation. In response to the falling edge of the comparison signal CMP, the difference (Vsig−1=3) between the first and second count is generated by the counter 700 for representing the final image signal that is the difference between the rest signal (Vrst=3) and the measured image signal (Vrst+Vsig=7).

The final count value (Vsig−1=3) is output as the first through fourth bit signals D[0], D[1], D[2] and D[3]. The final image signal Vsig is determined by a digital signal processor (DSP) that adds 1 to such a final count value (Vsig−1) during post-processing.

At time t17, the count enable signal CNT_EN is deactivated to logic low and the reference signal generator 640 is disabled. The time interval from t15 to t17 corresponds to a maximum time for counting with the level of the measured image signal which may be determined as the appropriate number of clock cycles according to characteristics of the image sensor 600.

In this manner, the image sensor 600 performs DDS using the DDR counter 100k having the inversion function, with enhanced operation speed and operation margin of the image sensor 600 and reduced power consumption. Furthermore, the DDR counter 100k having the inversion function has reduced bit errors due to DDS for further enhanced performance of the image sensor 600.

FIG. 30 is a circuit diagram of a counter 100m similar to the counter 700 of FIG. 23 having an up-down conversion function according to an example embodiment of the present invention. The counter 100m includes a first counting unit 110m, a second counting unit 120m, a third counting unit 130m, and a fourth counting unit 140m. The first counting unit 110m corresponds to a buffer unit 10m. The second, third, and fourth counting units 120m, 130m and 140m correspond to a ripple counter 30m. For convenience of description, the clock control circuit 750 and the clock input circuit 760 are omitted in FIG. 30, and will be described later in reference to FIG. 32.

Similarly as described above, the first counting unit 110m is configured as a clock buffer having a data terminal D receiving an input clock signal CLKI, a clock terminal CK receiving an input signal INP indicating the termination time point Te of the counting operation, and an output terminal Q outputting a first bit signal D[0]. The ripple counter 30m with the second, third, and fourth counting units 120m, 130m and 140m generates the most significant bit signals D[1], D[2] and D[3] that are sequentially toggling.

The second, third, and fourth counting units 120m, 130m and 140m are implemented with a plurality of flip-flops that are cascade-coupled and that are configured similarly to each other. For simplicity of illustration and description, FIG. 31 shows the first counting unit 110m and the second counting unit 120m for the up-down conversion operation.

Figure 31:
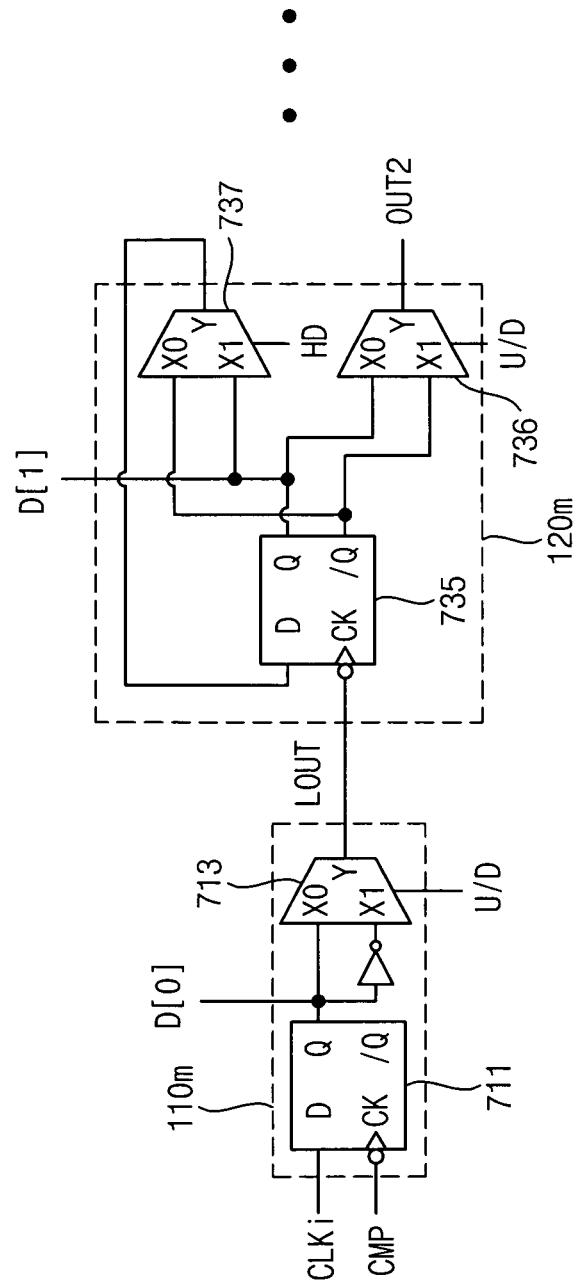
FIG. 31 is a circuit diagram of a first counting unit and a second counting unit in the counter of FIG. 30, according to an example embodiment of the present invention.

In FIG. 31, the first counting unit 110m includes a clock buffer 711 and an output multiplexer 713, and the second counting unit 120m includes a flip-flop 735, an output multiplexer 736, and a feedback multiplexer 737. The output multiplexer 713 of the first counting unit 110m selects one of the first bit signal D[0] or an inversion /D[0] of the first bit signal D[0] in response to an up-down control signal U/D to generate the latch output signal LOUT to the second counting unit 120m of the ripple counter 30m.

The output multiplexer 736 of the second counting unit 120m selects one of the non-inversion output terminal Q and the inversion output terminal /Q of the flip-flop 735 in response to the up-down control signal U/D to generate the output signal OUT2 to the third counting unit 130m. As such, the first counting unit 110m, the second counting unit 120m, the third counting unit 130m, and the fourth counting unit 140m each includes a respective output multiplexer.

Such output multiplexers form an up-down control unit that controls the up-counting and the down-counting of the counter 100m. The up-down control unit selects one of the non-inversion output terminal Q and the inversion output terminal /Q of the previous counting unit to generate the respective output signal used by the next counting unit for controlling the up-counting and the down-counting of the counter 100m.

For example, when the up-down control signal U/D is logic high, the inversion /D[0] of the first bit signal D[0] is provided as the latch output signal LOUT, and the respective inverted output terminals /Q are selected for the output signals OUT2, OUT3 and OUT4. Accordingly, the counter 100m performs the down-counting operation.

When the up-down control signal U/D is logic low, the first bit signal D[0] is provided as the latch output signal LOUT, and the respective non-inverted output terminals Q are selected for the output signals OUT2, OUT3 and OUT4. Accordingly, the counter 100m performs the up-counting operation.

The feedback multiplexer 737 selectively connects one of the inverted output terminal /Q and the non-inverted output terminal Q to the data terminal D of the flip-flop 735 in response to a hold signal HD. For example, when the hold signal HD is logic low, the inverted output terminal /Q is connected to the data terminal D such that the flip-flop 735 toggles in response to falling edges of the latch output signal LOUT.

When the hold signal HD is logic high, the non-inverted output terminal Q is connected to the data terminal D such that the flip-flop 735 maintains its latched value regardless of the edges of the latch output signal LOUT. The feedback multiplexer is included for preventing errors that may be caused during the up-down conversion operation.

The flip-flop 735 generates the second bit signal D[1] toggling in response to the latch output signal LOUT during a counting operation. The flip-flop 735 of FIG. 31 is negative-edge triggered, and the output signal OUT2 corresponds to the second bit signal D[1]. The present invention may also be practiced with the flip-flop being positive-edge triggered with the output signal OUT2 corresponding to an inversion /D[1] of the second bit signal D[1].

Figures 32, 33:
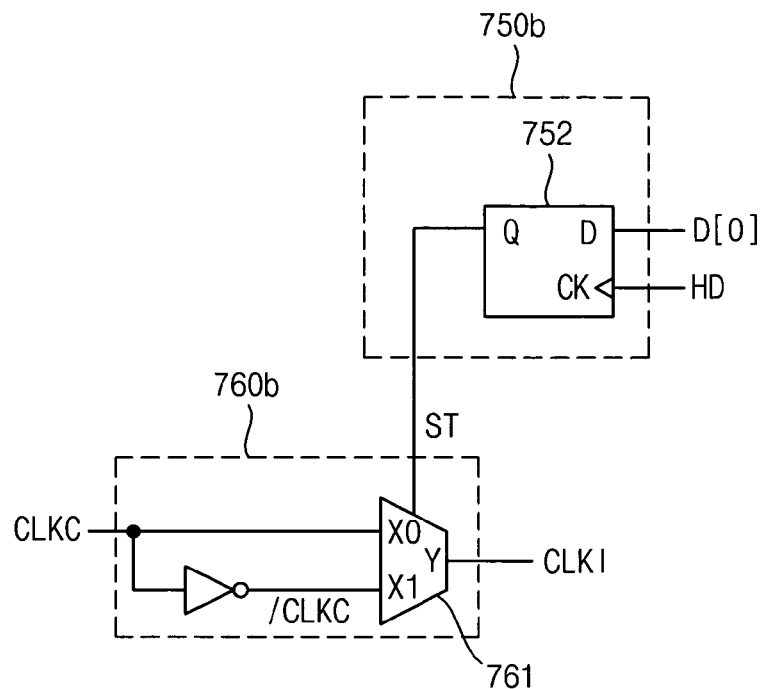
FIG. 32 is a circuit diagram of a clock control circuit and a clock input circuit in the counter of FIG. 30, according to an example embodiment of the present invention.
FIG. 33 shows a table of bit values of the count during a counting operation with an up-down conversion function in the counter of FIG. 30, according to an example embodiment of the present invention.

FIG. 32 is a circuit diagram of a clock control circuit 750b and a clock input circuit 760b included in the counter 100m of FIG. 30, according to an example embodiment of the present invention. The clock control circuit 750b generates a clock control signal ST based on the first bit signal D[0], and the clock input circuit 760b selects one of the clock signal CLKC or an inversion /CLKC of the clock signal to generate the input clock signal CLKI in response to the clock control signal ST.

The clock control circuit 750b includes a latch 752 with a data terminal D receiving the first bit signal D[0], a clock terminal CK receiving the hold signal HD, and an output terminal Q outputting the clock control signal ST. The latch 752 performs the latch operation in response to the hold signal HD such that the logic level of the clock control signal ST is determined by the logic level of the first bit signal D[0] after the first counting operation is terminated and before the up-down conversion operation. The clock input circuit 760b includes a multiplexer 761 that generates the input clock signal CLKI by selecting one of the clock signal CLKC or an inversion /CLKC of the clock signal in response to the clock control signal ST.

Figure 34A:
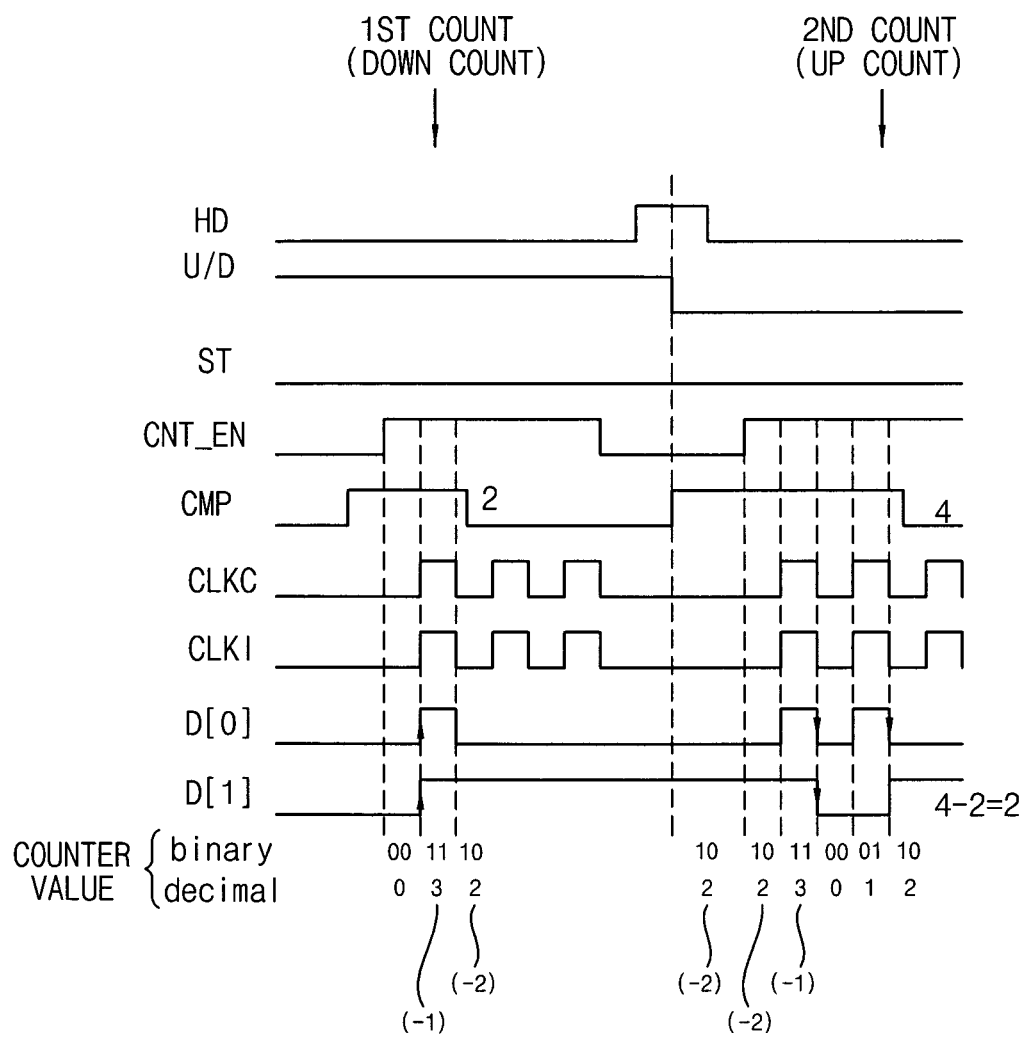

FIG. 33 shows a table of bit values for describing a counting operation with the up-down conversion function of the counter 100m of FIG. 30. FIGS. 34A and 34B are timing diagrams of signals during the counting operation in the counter 100m with the up-down conversion function.

Referring to FIGS. 34A and 34B, the counter 100m first performs a first counting operation for counting the analog reset signal to generate a first count. The counter 100m subsequently performs a second counting operation to generate a second count for counting the analog measured image signal based on the first count. In addition, the first counting operation is a down-counting operation, and the second counting operation is an up-counting operation, as illustrated in FIGS. 34A and 34B.

FIG. 33 shows bit values of the first bit signal D[0] and the second bit signal D[1] for the first counting operation (e.g., the down-count result). FIG. 33 also shows bit values of the first bit signal D[0] and the second bit signal D[1] for a first edge counting and a second edge counting during the second counting operation (e.g., the up-counting operation).

When the counter 100m is a DDR counter, bit errors may be caused if the second counting operation is performed simply based on the first count. To prevent such bit errors, the input clock signal CLKI applied to the first counting unit 110m is selected between CLKC and /CLKC depending on the first count so that the second counting operation begins by counting the first edge of the input clock signal CLKI for all cases of the first count.

Referring to FIG. 33, when the first bit signal D[0] of the first count is logic low (i.e., 0), the second bit signal D[1] is desired to be toggled at the second edge of the input clock signal CLKI for the second counting operation. When the first bit signal D[0] of the first count is logic high (i.e., 1), the second bit signal D[1] is desired to be toggled at the first edge of the input clock signal CLKI for the second counting operation.

FIG. 34A illustrates DDS when the first bit signal D[0] of the first count is logic low. In FIG. 34A, the clock control signal ST is maintained at logic low as initialized even though the rising edge of the hold signal HD is applied to the clock terminal CK of the clock control circuit 750b of FIG. 32.

In response to the clock control signal ST of logic low, the clock signal CLKC is output as the input clock signal CLKI (that is, the input clock signal CLKI is maintained with respect to the first counting operation) by the clock input circuit 760b for the second counting operation. Accordingly the second counting operation begins by toggling the second bit signal D[1] at the second edge (i.e., a falling edge of the input clock signal CLKI).

For convenience of illustration, the two least significant bits D[0] and D[1] of the count from the counter 100m are shown in the bottom of FIG. 34A. As an example, the 6-bit binary code generated by the counter 100m is shown in Table 2 below.

TABLE 2

| | decimal | binary | | | | | |
| --- | --- | --- | --- | --- | --- | --- | --- |
| | | D[5] | D[4] | D[3] | D[2] | D[1] | D[0] |
| CV1 | 0 | 0 | 0 | 0 | 0 | 0 | 0 |
| CV2 | −1 | 1 | 1 | 1 | 1 | 1 | 1 |
| CV3 | −2 | 1 | 1 | 1 | 1 | 1 | 0 |
| CV4 | −1 | 1 | 1 | 1 | 1 | 1 | 1 |
| CV5 | 0 | 0 | 0 | 0 | 0 | 0 | 0 |
| CV6 | 1 | 0 | 0 | 0 | 0 | 0 | 1 |
| CV7 | 2 | 0 | 0 | 0 | 0 | 1 | 0 |

In Table 2, a first value CV1 is an initialized value of the count, and second and third values CV2 and CV3 are the counts as down-counting is performed two times from the initialized value. Fourth though seventh values CV4 through CV7 are the counts as up-counting is performed four times from the third value CV3 corresponding to the result of the down-counting. Accordingly, the seventh value CV7 (4−2=2) represents the final result of DDS with the reset signal being 2 and the measured image signal being 4.

FIG. 34B illustrates DDS when the first bit signal D[0] of the first count is logic high. In that case, the clock control signal ST transitions to logic high in response to the rising edge of the hold signal HD, since the first bit signal D[0] is applied to the data terminal D of the clock control circuit 750b of FIG. 32.

In response to the clock control signal ST of logic high, the clock signal CLKC is selected as the input clock signal CLKI (that is, the input clock signal CLKI is inverted with respect to the first counting operation) by the clock input circuit 760b for the second counting operation. Accordingly the second counting operation begins by toggling the second bit signal D[1] at the first edge (i.e., the falling edge of the input clock signal CLKI).

In this manner, bit errors of DDS is prevented by inverting the input clock signal CLKI using the clock control circuit 750b and the clock input circuit 760b based on the first bit signal D[0] after the first counting operation is terminated and before the second counting operation is performed.

FIG. 35 is a timing diagram of signals during a CDS operation in the image sensor 600 of FIG. 22 with each MDR counter 700 being the counter 100m of FIG. 30. FIG. 35 illustrates DDS operation for one column of the pixel array 610.

At time t21, the count enable signal CNT_EN from the control circuit 630 is activated to logic high, and the reference signal generator 640 ramps down the voltage level of the ramp signal RAMP. As such, the first counting operation begins column by column for the pixel array 610 in the respective counters 700. The pixel voltage signal Vpix from a respective column is provided to the comparator 661 and has a voltage level indicating the analog reset signal.

At time t22, the voltage levels of the ramp signal RAMP and the pixel voltage signal Vpix become equal to each other with the comparison signal CMP of the comparator 661 transitioning to logic low for indicating the termination time point of the first counting operation. In response to the falling edge of the comparison signal CMP, the first count result (−3) corresponding to the reset signal (Vrst=3) is stored in the counter 100m.

At time t23, the count enable signal CNT_EN is deactivated to logic low, and the reference signal generator 640 is disabled. The time interval from t21 to t23 corresponds to a maximum time for counting the reset signal which may be determined as the appropriate number of clock cycles according to characteristics of the image sensor 600.

At time t24, the up-down (U/D) control signal transitions to logic low. Thus, the up-down control unit with the output multiplexers 713 and 736 sets the output terminal to one of Q or /Q oppositely from the first counting operation to perform the up-down conversion operation. As described above, the clock control circuit 750b and the clock input circuit 760b determine the input clock signal CLKI for the second counting operation at the rising edge of the hold signal HD.

At time t25, the count enable signal CNT_EN is activated again to logic high, and the reference signal generator 640 ramps down the voltage level of the ramp signal RAMP. The slopes of the ramp signal RAMP during the first and second counting operations are the same, in an example embodiment of the present invention. As such, the second counting operation begins for each column in the respective counters 700. The pixel voltage signal Vpix has a voltage level that is the measured image signal and is provided to the comparator 661.

At time t26, the voltage levels of the ramp signal RAMP and the pixel voltage signal Vpix become equal such that the comparison signal CMP of the comparator 661 transitions to logic low for indicating the termination time point of the second counting operation. In response to the falling edge of the comparison signal CMP, the difference (Vsig=4) between the reset signal (Vrst=3) and the measured image signal (Vrst+Vsig=7) is generated and stored in the counter 100m as the digital signal represented by the first, second, third, and fourth bit signals D[0], D[1], D[2] and D[3].

At time t27, the count enable signal CNT_EN is deactivated to logic low, and the reference signal generator 640 is disabled. The time interval from t25 to t27 corresponds to a maximum time for counting with the measured image signal, which may be determined as the appropriate number of clock cycles according to characteristics of the image sensor 600.

In this manner, the image sensor 600 performs DDS using the DDR counter 100m having the up-down conversion function for enhanced operation speed and operation margin of the image sensor 600 with reduced power consumption. Furthermore, the DDR counter 100m is capable of preventing bit errors due to DDS for further enhanced performance of the image sensor 600.

Figure 36:
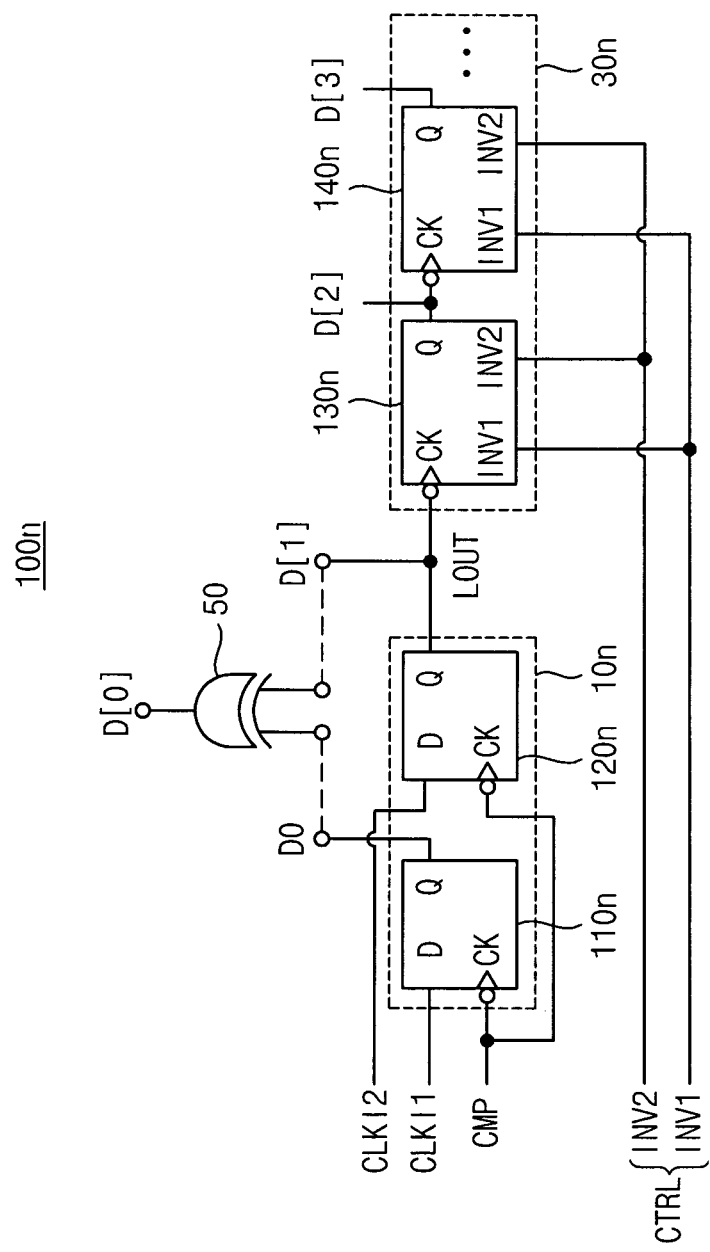
FIG. 36 is a circuit diagram of the counter of FIG. 23 having an inversion function, according to an example embodiment of the present invention.

FIG. 36 is a circuit diagram of a counter 100n having an inversion function such as for use in the apparatus 700 of FIG. 23, according to an example embodiment of the present invention. In FIG. 36, the counter 100n includes a first counting unit 110n, a second counting unit 120n, a third counting unit 130n, and a fourth counting unit 140n.

The first and second counting units 110n and 120n correspond to a buffer unit 10n. The third and fourth counting units 130n and 140n correspond to a ripple counter 30n. For convenience of description, the clock control circuit 750 and the clock input circuit 760 are omitted in FIG. 36, and will be described later with reference to FIG. 38.

The first counting unit 110n is a first clock buffer and the second counting unit 120n is a second clock buffer. The first clock buffer 110n has a data terminal D receiving a first input clock signal CLKI1, a clock terminal CK receiving a comparison signal CMP indicating the termination time point Te of the counting operation, and an output terminal Q outputting a first buffered clock signal D0. The second clock buffer 120n has a data terminal D receiving a second input clock signal CLKI2, a clock terminal CK receiving the comparison signal CMP indicating the termination time point Te of the counting operation, and an output terminal Q outputting a second buffered clock signal that is also the second bit signal D[1].

The third and fourth counting units 130n and 140n of the ripple counter 30n generate the most significant bit signals D[2] and D[3] that are sequentially toggling. The third and fourth counting units 130n and 140n are implemented with a plurality of flip-flops that are cascade-coupled and are configured similar to each other.

Figure 37:
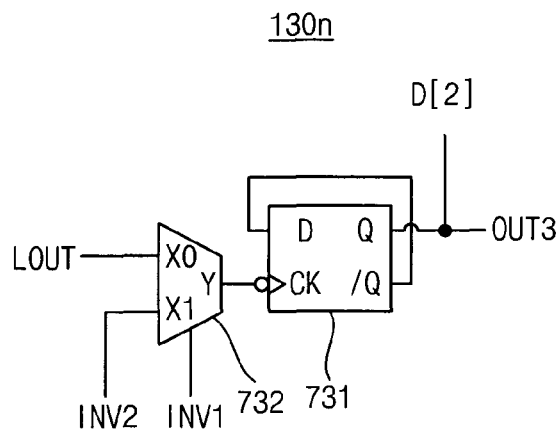
FIG. 37 is a circuit diagram of a third counting unit in the counter of FIG. 36, according to an example embodiment of the present invention.

As an example, the third counting unit 130n including a flip-flop 731 and an inversion multiplexer 732 is described in reference to FIG. 37. The inversion multiplexer 732 selects one of an output of the previous counting unit (i.e., the latch output signal LOUT) and a second inversion control signal INV2 in response to a first inversion control signal INV1 to generate an output signal OUT3 to the next counting unit (i.e., the fourth counting unit 140n). The flip-flop 731 performs the above-described toggling operation when the output of the previous counting unit is selected, and performs the inversion operation for inverting its latched value when the second inversion control signal INV2 is selected.

Each of the third and fourth counting units 130n and 140n includes a respective inversion multiplexer 732 and a respective flip-flop 731. Such inversion multiplexers 732 form an inversion control unit that inverts the most significant bit signals D[2] and D[3] based on the inversion control signals INV1 and INV2.

The flip-flop 731 is negative-edge triggered, and the output signal OUT3 corresponds to the third bit signal D[2]. The present invention may also be practiced with the flip-flop being positive-edge triggered with the output signal OUT3 corresponding to the inversion /D[2] of the third bit signal D[2].

Figure 38:
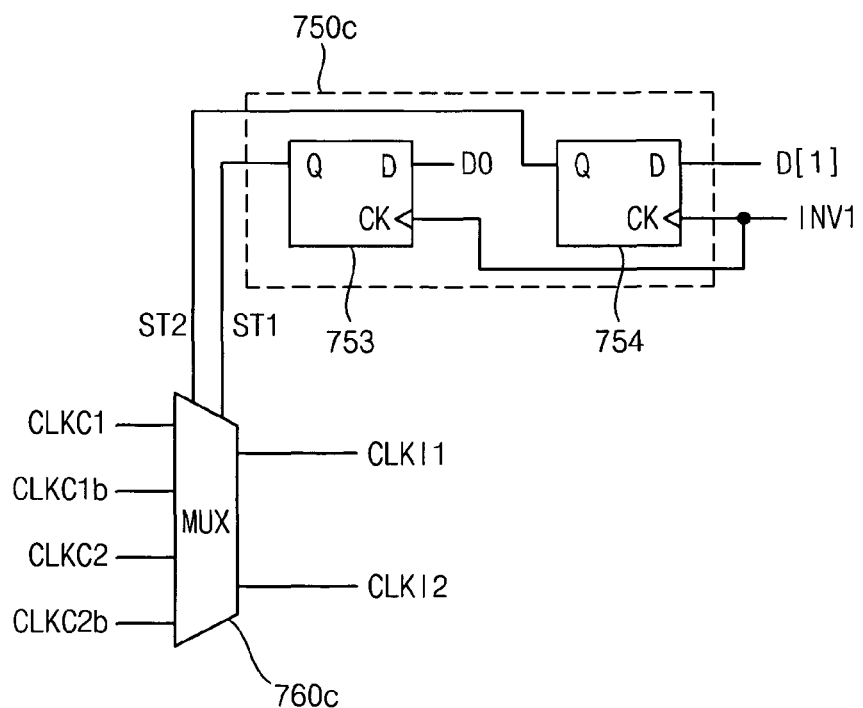
FIG. 38 is a circuit diagram of a clock control circuit and a clock input circuit in the counter of FIG. 36, according to an example embodiment of the present invention.

FIG. 38 is a circuit diagram of a clock control circuit 750c and a clock input circuit 760c included in the counter 100n of FIG. 36, according to an example embodiment of the present invention. In FIG. 38, the clock control circuit 750c generates a first clock control signal ST1 and a second clock control signal ST2 based on the first buffered clock signal D0 and the second buffered clock signal D[1]. The clock input circuit 760c generates the first and second input clock signals CLKI1 and CLKI2 by selecting among a plurality of clock signals CLKC1, CLKC1b, CLKC2 and CLKC2b, in response to the first and second clock control signals ST1 and ST2.

The clock control circuit 750c includes a first latch 753 and a second latch 754. The first latch 753 has a data terminal D receiving the first buffered clock signal D0, a clock terminal CK receiving the first inversion control signal INV1, and an output terminal Q outputting the first clock control signal ST1. The second latch 754 has a data terminal D receiving the second buffered clock signal D[1], a clock terminal CK receiving the first inversion control signal INV1, and an output terminal Q outputting the second clock control signal ST2.

The latches 753 and 754 perform a latch operation in response to the first inversion signal INV1 such that logic levels of the first and second clock control signals ST1 and ST2 are determined by the logic levels of the first and second buffered clock signals D0 and D[1] after the first counting operation is terminated and before the inversion operation is performed.

The clock input circuit 760c is a four-to-two multiplexer that receives the four clock signals CLKC1, CLKC1b, CLKC2 and CLKC2b and selects among such clock signals to generate the two input clock signals CLKI1 and CLKI2. The four clock signals CLKC1, CLKC1b, CLKC2 and CLKC2b have phases different from each other. An example configuration of the clock input circuit 760c is later described with reference to FIG. 42.

Figures 39, 40:
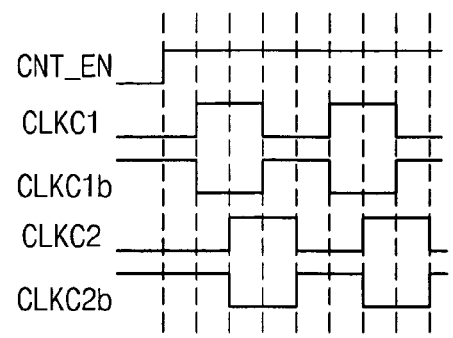
FIG. 39 illustrates example clock signals provided to the clock input circuit of FIG. 38, according to an example embodiment of the present invention.
FIG. 40 shows a table of bit values of a count during a counting operation with an inversion function in the counter of FIG. 36, according to an example embodiment of the present invention.

FIG. 39 illustrates an example of the clock signals CLKC1, CLKC1b, CLKC2 and CLKC2b of FIG. 38. FIG. 39 shows a first clock signal CLKC1, a first inversion clock signal CLKC1b, a second clock signal CLKC2, and a second inversion clock signal CLKC2b, having phases different from each other as illustrated in FIG. 39.

For example, the first and second clock signals CLKC1 and CLKC2 are phase shifted by 90 degrees, and the first and second inversion clock signals CLKC1b and CLKC2b are phase shifted by 90 degrees. The first clock signal CLKC1 and the first inversion clock signal CLKC1b are phase shifted by 180 degrees. The second clock signal CLKC2 and the second inversion clock signal CLKC2b are phase shifted by 180 degrees.

Such clock signals CLKC1, CLKC1b, CLKC2 and CLKC2b may be provided from an external device or may be generated in the counter by delaying or inverting one clock signal. Hereinafter, the selection of the input clock signals CLKI1 and CLKI2 using the clock signals of FIG. 39 for performing DDS will be described with respect to counters having an inversion function or an up-down conversion function according to example embodiments of the present invention.

FIG. 40 shows a table of bit values during a counting operation with an inversion function in the counter 100n of FIG. 36. FIGS. 41A, 41B, 41C and 41D are timing diagrams of signals during a counting operation with an inversion function in the counter 100n of FIG. 36.

Referring to FIGS. 41A, 41B, 41C and 41D, the counter 100n of FIG. 36 with an inversion function first performs a first counting operation for counting according to the reset signal to generate a first count. Then, the counter 100n performs an inversion operation for inverting the first count. Subsequently, the counter 100n performs a second counting operation from the inverted first count according to the measured image signal. For example, both of the first and second counting operations are up-counting operations as illustrated in FIGS. 41A, 41B, 41C and 41D.

FIG. 40 shows bit values of the first buffered clock signal D0, the least significant bit signal D[0], and the second buffered clock signal that is also the second bit signal D[1]. Such bit values are shown for the first count operation, the inversion operation, a first edge counting in the second counting operation, and a second edge counting in the second counting operation. As described above for the QDR counter, the least significant bit D[0] is generated from performing an XOR operation on the first and second buffered clock signals D0 and D[1].

In the QDR counter 100n, bit errors may occur if the second counting operation is performed simply from the inversion of the first count. To prevent such bit errors, the first and second counting units 110n and 120n of FIG. 36 do not include the inversion multiplexer as illustrated in FIG. 25. Instead of direct inversion of the first and second buffered clock signals D0 and D[1], the first and second input clock signals CLKI1 and CLKI2 applied to the first and second counting units 110n and 120n are selected according to the first count such that the second counting operation starts by counting the first edge of the input clock signals CLKI1 and CLKI2 for all cases of the first count.

Referring to FIG. 40, when the first buffered clock signal D0 and the second bit signal D[1] of the first count are logic low (i.e., 0), such signals D0 and D[1] are desired to be maintained similarly as from the first count at the first edge counting while the first buffered clock signal D0 is desired to be toggled at the second edge counting during the second counting operation. When the first buffered clock signal D0 of the first count is logic high (i.e., 1) and the second bit signal D[1] of the first count is 0, the first and second buffered clock signals D0 and D[1] are desired to be toggled at the first edge counting, and the second bit signal D[1] is desired to be toggled at the second edge counting during the second counting operation.

When the first buffered clock signal D0 of the first count is 1 and the second bit signal D[1] of the first count is 1, the first and second buffered clock signals D0 and D[1] are desired to be maintained similarly as the first count at the first edge counting, and the first buffered clock signal D0 is desired to be toggled at the second edge counting during the second counting operation. When the first buffered clock signal D0 of the first count is 0 and the second bit signal D[1] of the first count is 1, the first and second buffered clock signals D0 and D[1] are desired to be toggled at the first edge counting, and the second bit signal D[1] is desired to be toggled at the second edge counting during the second counting operation.

Referring to FIG. 38, the first clock control signal ST1 is initialized to logic low (i.e., 0), and the second clock control signal ST2 is initialized to logic high (i.e., 1) before the first counting operation is performed. The latches 753 and 754 of FIG. 38 each may include a respective reset switch similarly as illustrated in FIG. 6B for such initialization. With such initialized logic levels of the first and second clock control signals ST1 and ST2, the clock input circuit 760c of FIG. 38 selects the first clock signal CLKC1 as the first input clock signal CLKI1 and the second clock signal CLKC2 as the second input clock signal CLKI2 for the first counting operation.

FIG. 41A illustrates DDS when the first buffered clock signal D0 of the first count is 0 and the second bit signal D[1] of the first count is 0. With such logic levels of the first and second buffered clock signals D0 and D[1] latched at the termination time point of the first counting operation, the first clock control signal ST1 is latched to 0, and the second clock control signal ST2 is latched to 0, at the rising edge of the first inversion signal INV1.

In response to such latched logic levels of the first and second clock control signals ST1 and ST2, the clock input circuit 760c of FIG. 38 selects the second clock signal CLKC2 as the first input clock signal CLKI1 and the first inversion clock signal CLKC1b as the second input clock signal CLKI2 for the second counting operation. With such first and second input clock signals CLKI1 and CLKI2, the DDS (8−4−1=3) is performed without bit errors for the example of the reset signal being 4 and the measured image signal being 8, as illustrated in FIG. 41A. An offset of 1 between the DDS result (3) and the desired final image signal (4) is due to the inversion operation that is common for all cases of the reset and measured image signals and may be corrected during post processing.

Figure 41B:
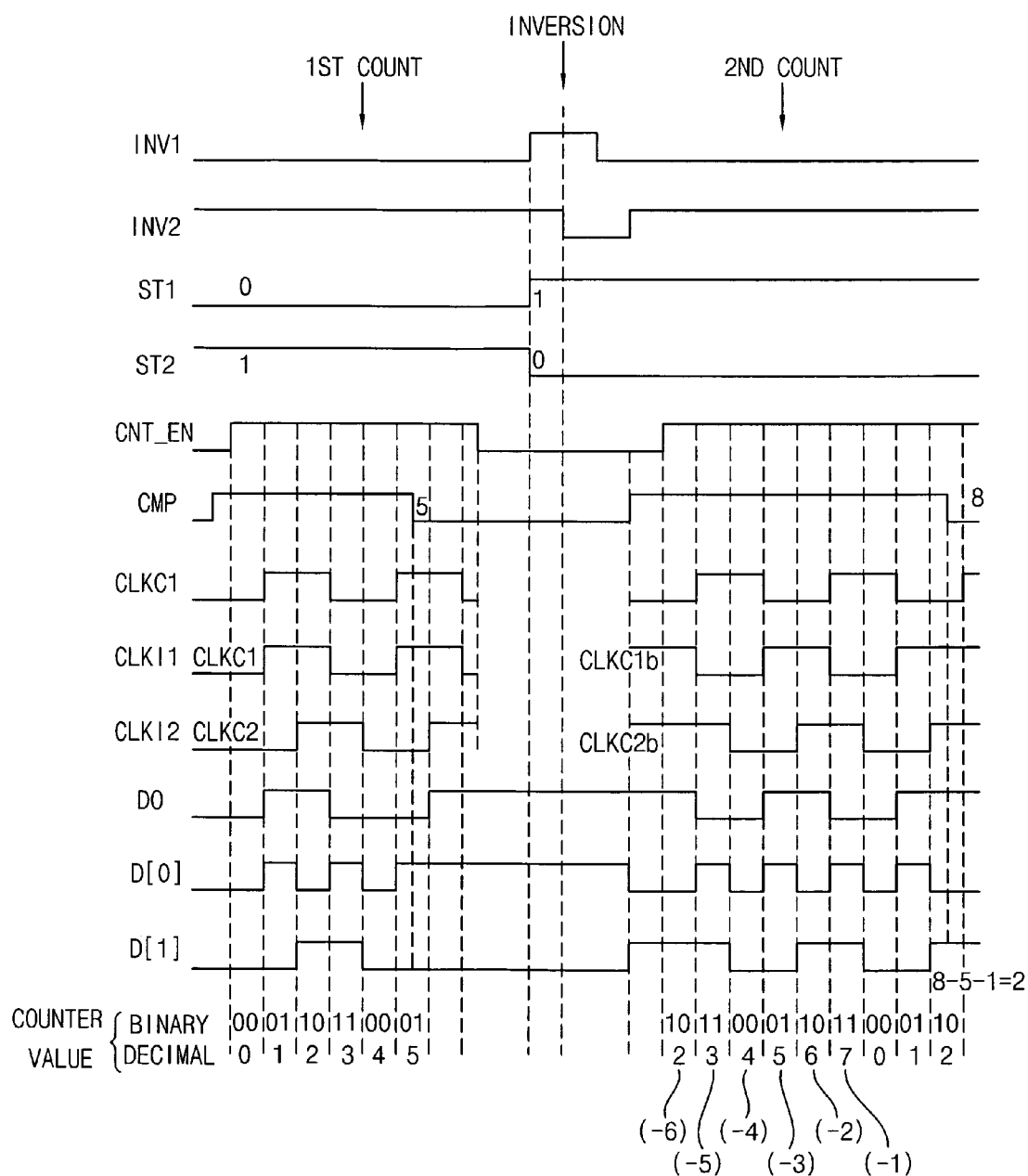

FIG. 41B illustrates DDS when the first buffered clock signal D0 of the first count is 1 and the second bit signal D[1] of the first count is 0. With such logic levels of the first and second buffered clock signals D0 and D[1] latched at the termination time point of the first counting operation, the first clock control signal ST1 is latched to 1, and the second clock control signal ST2 is latched to 0 at the rising edge of the first inversion signal INV1.

In response to such latched logic levels of the first and second clock control signals ST1 and ST2, the clock input circuit 760c of FIG. 38 selects the first inversion clock signal CLKC1b as the first input clock signal CLKI1 and the second inversion clock signal CLKC2b as the second input clock signal CLKI2 for the second counting operation. With such first and second input clock signals CLKI1 and CLKI2, the DDS (8−5−1=2) is performed without error for the example of the reset signal being 5 and the measured image signal being 8 with the common offset of 1, as illustrated in FIG. 41B.

Figure 41C:
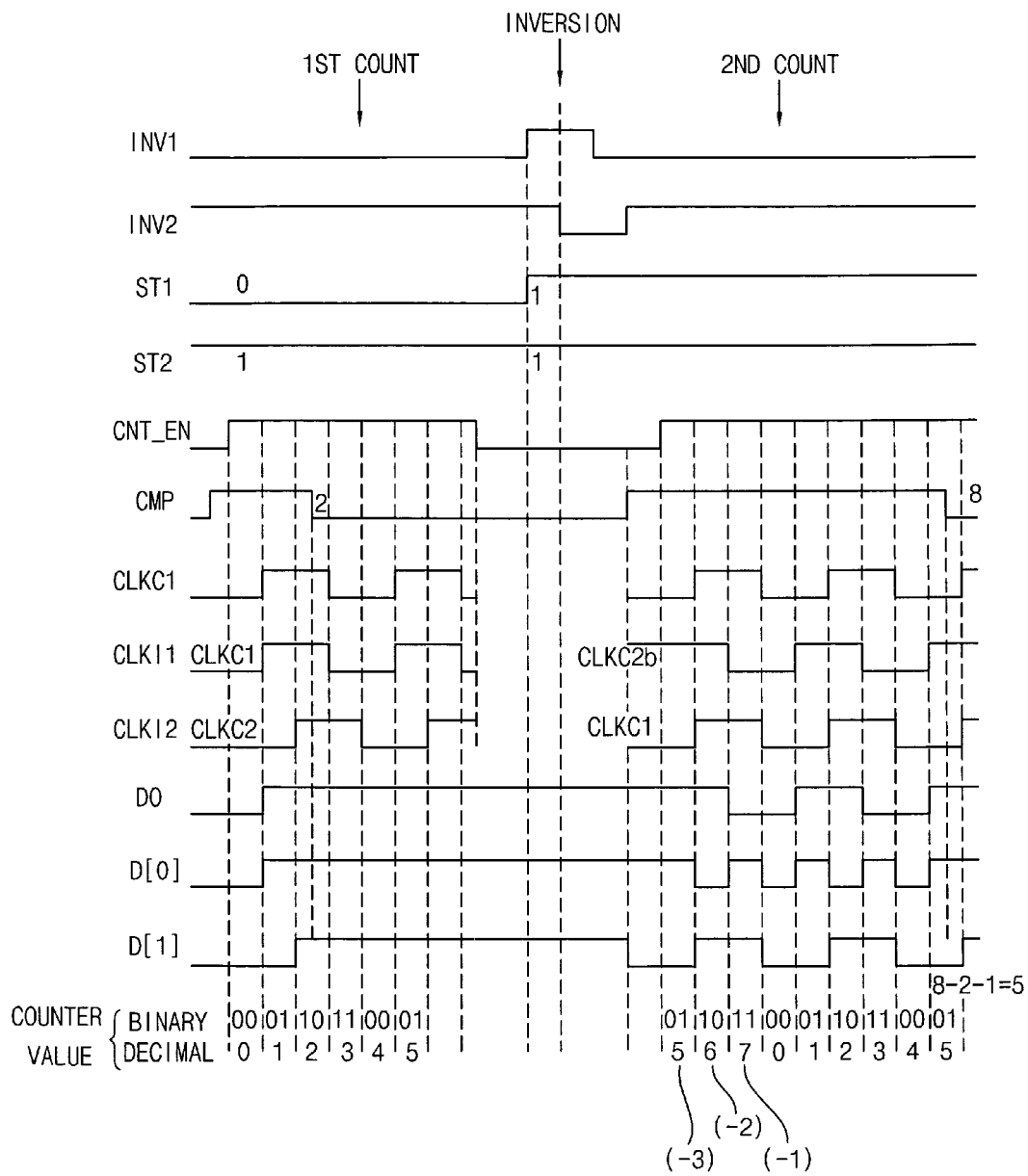

FIG. 41C illustrates DDS when the first buffered clock signal D0 of the first count is 1 and the second bit signal D[1] of the first count is 1. According to such logic levels of the first and second bit signals D0 and D[1] which are latched at the termination time point of the first counting operation, the first clock control signal ST1 is latched to 1 and the second clock control signal ST2 is latched to 1 at the rising edge of the first inversion signal INV1.

In response to the latched logic levels of the first and second clock control signals ST1 and ST2, the clock input circuit 760c of FIG. 38 selects the second inversion clock signal CLKC2b as the first input clock signal CLKI1 and the first clock signal CLKC1 as the second input clock signal CLKI2 for the second counting operation. With such first and second input clock signals CLKI1 and CLKI2, the DDS (8−2−1=5) is performed without error for the example of the reset signal being 2 and the measured image signal being 8, as illustrated in FIG. 41C.

Figure 41D:
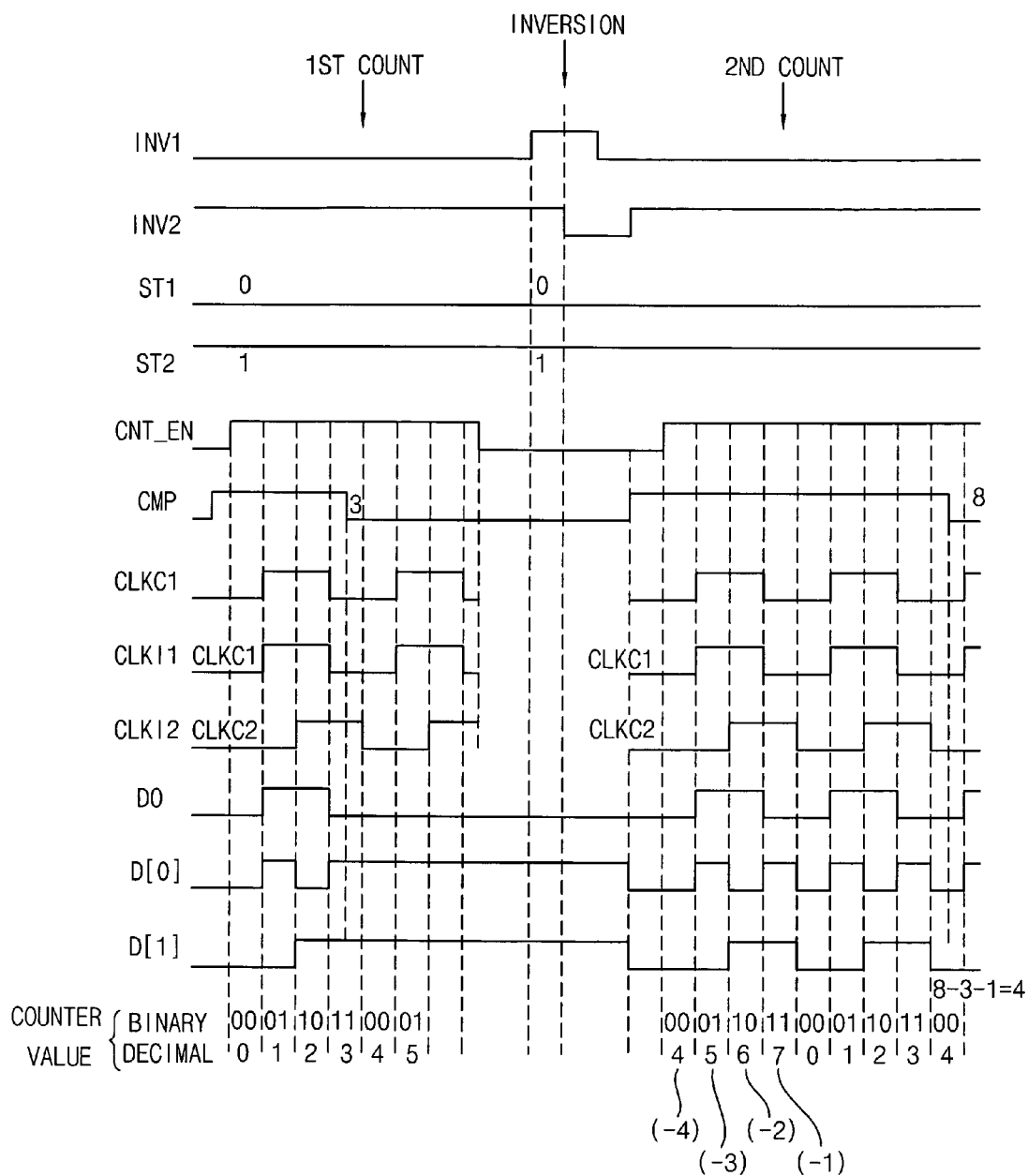

FIG. 41D illustrates DDS when the buffered clock signal D0 of the first count is 0 and the second bit signal D[1] of the first count is 1. According to such logic levels of the first and second buffered clock signals D0 and D[1] which are latched at the termination time point of the first counting operation, the first clock control signal ST1 is latched to 0 and the second clock control signal ST2 is latched to 1 at the rising edge of the first inversion signal INV1.

In response to the latched logic levels of the first and second clock control signals ST1 and ST2, the clock input circuit 760c of FIG. 38 selects the first clock signal CLKC1 as the first input clock signal CLKI1 and the second clock signal CLKC2 as the second input clock signal CLKI2 for the second counting operation. With such first and second input clock signals CLKI1 and CLKI2, the DDS (8−3−1=4) is performed without error for the example of the reset signal being 3 and the measured image signal being 8 as illustrated in FIG. 41D.

In this manner, the bit errors of DDS due to the inversion of the gray code D0 and D[1] is prevented when the clock control circuit 750c and the clock input circuit 760c select the first and second input clock signals CLKI1 and CLKI2 among the clock signals CLKC1, CLKC1b, CLKC2 and CLKC2b based on the first and second buffered clock signals D0 and D[1] after the first counting operation is terminated and before the second counting operation begins.

Figure 42:
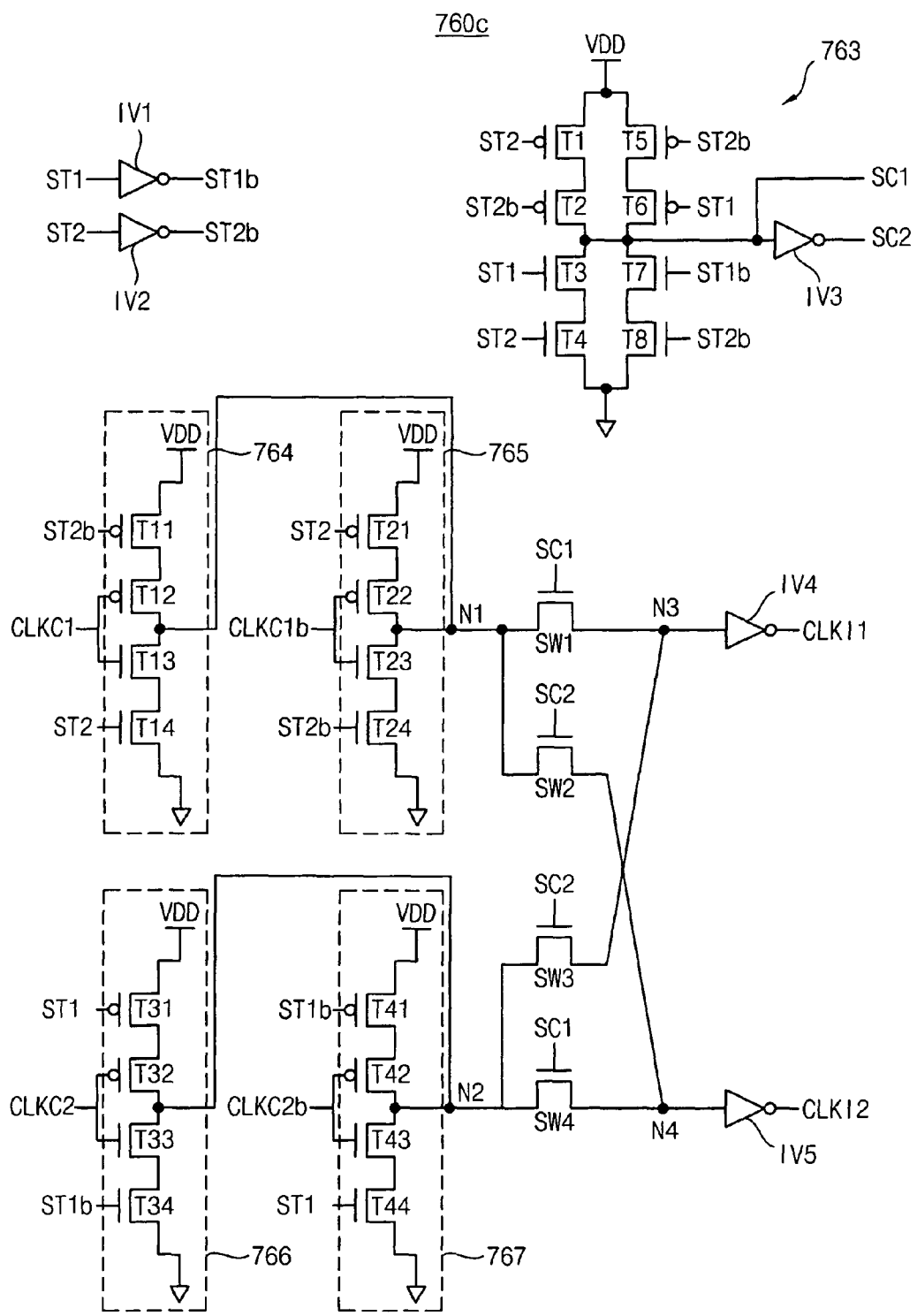
FIG. 42 is a circuit diagram of the clock input circuit of FIG. 38, according to an example embodiment of the present invention.

FIG. 42 is a circuit diagram of the clock input circuit 760c of FIG. 38, according to an example embodiment of the present invention. Referring to FIG. 42, the clock input circuit 760c includes an XOR gate 763 and first, second, third, and fourth input units 764, 765, 766 and 767 respectively receiving the clock signals CLKC1, CLKC1b, CLKC2 and CLKC2b. The clock input circuit 760c also includes first, second, third, and fourth switches SW1, SW2, SW3 and SW4, and inverters IV1, IV2, IV3, IV4 and IV5.

The XOR gate 763 performs an XOR operation on the first clock control signal ST1 and the second clock control signal ST2 to generate a first switch control signal SC1. Accordingly the first switch control signal SC1 is logic low when the logic levels of the first and second clock control signals ST1 and ST2 are same. Alternatively, the first switch control signal SC1 is logic high when the logic levels of the first and second clock control signals ST1 and ST2 are different. A second switch control signal SC2 is an inversion of the first switch control signal SC1.

For example, when the initialized first clock signal ST1 is 0 and the initialized second clock signal ST1 is 1 as illustrated in the first counting operation of FIGS. 41A, 41B, 41C and 41D, the output of the first input unit 764 is transferred to a first node N1, and the output of the third input unit 766 is transferred to a second node N2. In that case, since the first switch control signal SC1 is 1, the first switch SW1 and the fourth switch SW4 are turned on, and the second switch SW2 and the third switch SW3 are turned off.

In other words, the first node N1 and a third node N3 are electrically coupled, and the second node N2 and a fourth node N4 are electrically coupled. As a result, the first clock signal CLKC1 input to the first input unit 764 is selected as the first input clock signal CLKI1, and the second clock signal CLKC2 input to the third input unit 766 is selected as the second input clock signal CLKI2, for the first counting operation as illustrated in FIGS. 41A, 41B, 41C and 41D.

When the latched first clock signal ST1 is 0 and the latched second clock signal ST1 is 0 as illustrated in the second counting operation of FIG. 41A, the output of the second input unit 765 is transferred to the first node N1, and the output of the third input unit 766 is transferred to the second node N2. In that case, since the first switch control signal SC1 is 0, the first switch SW1 and the fourth switch SW4 are turned off, and the second switch SW2 and the third switch SW3 are turned on.

In other words, the first node N1 and the fourth node N4 are electrically coupled, and the second node N2 and the third node N3 are electrically coupled. As a result, the second clock signal CLKC2 input to the third input unit 766 is selected as the first input clock signal CLKI1, and the first inversion clock signal CLKC1b input to the second input unit 765 is selected as the second input clock signal CLKI2, for the second counting operation as illustrated in FIG. 41A.

In this manner, the clock input circuit 760c generates the first and second input clock signals CLKI1 and CLKI2 by selecting among the clock signals CLKC1, CLKC1b, CLKC2 and CLKC2b, as illustrated in FIGS. 41A, 41B, 41C and 41D, depending on the logic levels of the first and second clock control signals ST1 and ST2.

Figure 43:
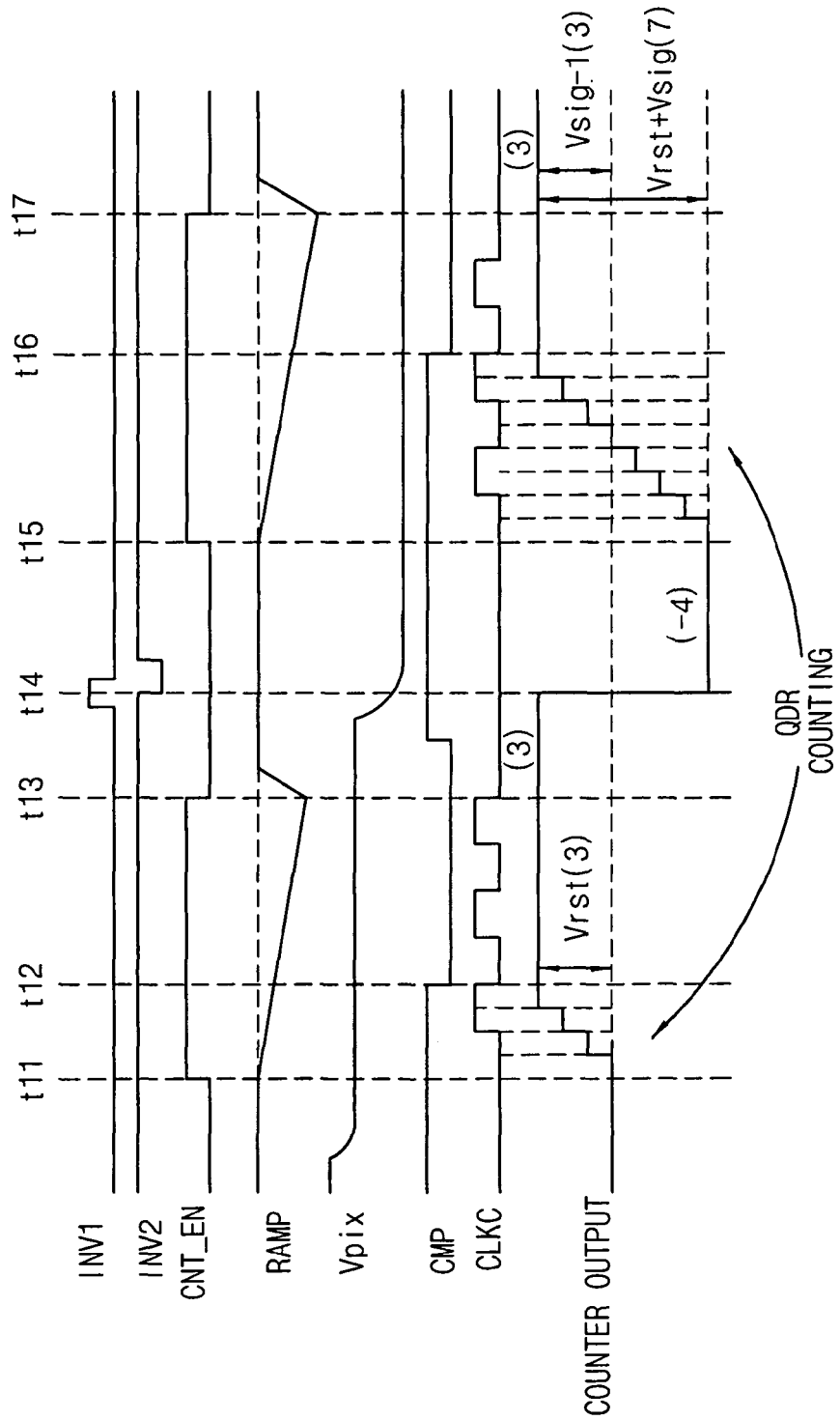
FIG. 43 is a timing diagram of signals during a CDS operation in the image sensor of FIG. 22 including the counter of FIG. 36, according to an example embodiment of the present invention.

FIG. 43 is a timing diagram of signals during a CDS operation in the image sensor 600 of FIG. 22 with each MDR counter 700 being similar to the counter 100*n* of FIG. 36. FIG. 43 illustrates a DDS operation for one column of the pixel array 610. Descriptions of operations in FIG. 43 that are similar to FIG. 29 are omitted herein.

In FIG. 43, the image sensor 600 performs DDS using the QDR counter 100*n* having the inversion function for enhanced operation speed and operation margin with reduced power consumption. Each of the first counting operation (t11 to t12 in FIG. 43) and the second counting operation (t15 to t16 in FIG. 43) is performed by respective QDR counting with the count being updated four times per cyclic period of the clock signal CLKC. Furthermore, the QDR counter 100*n* having the inversion function is configured to prevent bit errors due to DDS for further enhanced performance of the image sensor 600.

Figure 44:
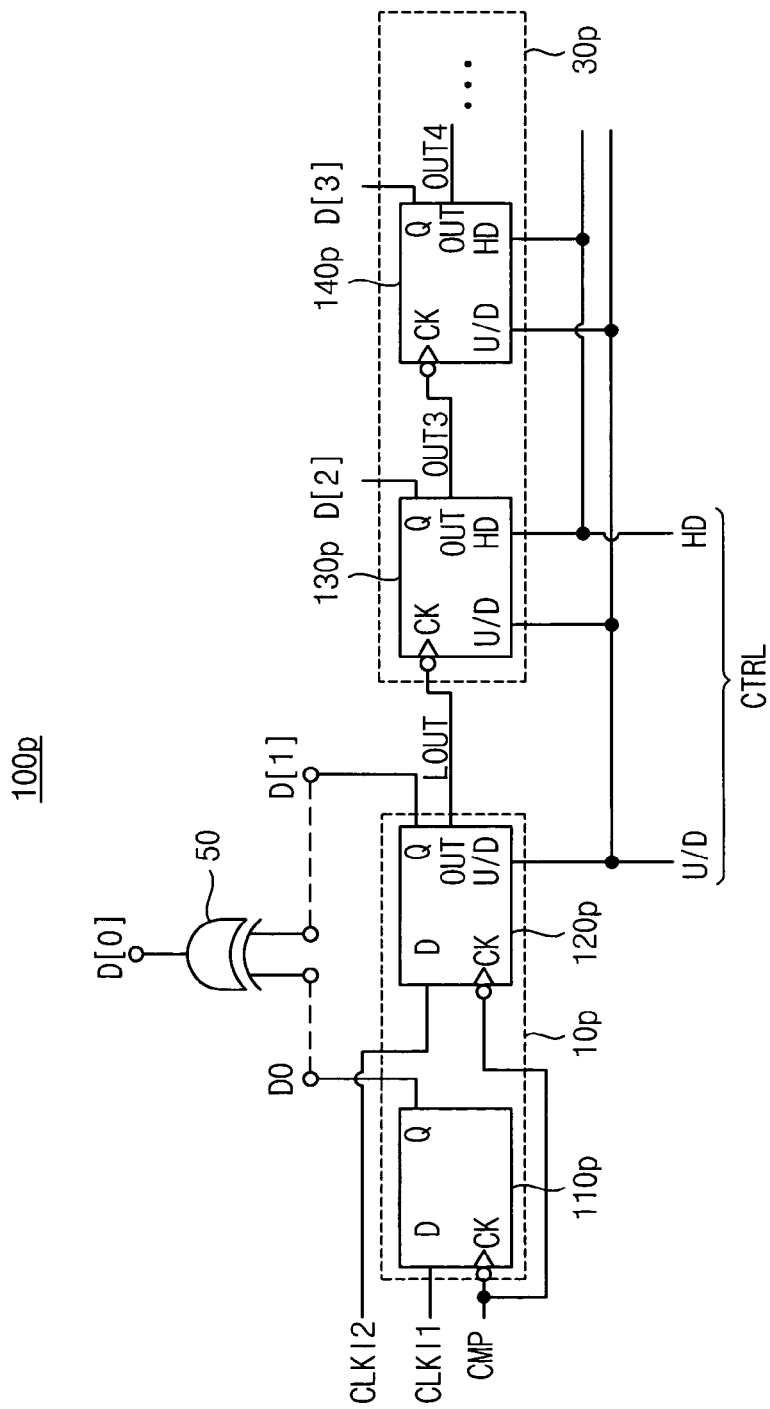
FIG. 44 is a circuit diagram of the counter of FIG. 23 having an up-down conversion function, according to an example embodiment of the present invention.

FIG. 44 is a circuit diagram of a counter 100*p* (similar to the counter 700 of FIG. 23) with an up-down conversion function according to an example embodiment of the present invention. In FIG. 44, the counter 100*p* includes a first counting unit 110*p*, a second counting unit 120*p*, a third counting unit 130*p*, and a fourth counting unit 140*p*. The first and second counting units 110*p* and 120*p* correspond to a buffer unit 10*p*. The third and fourth counting units 130*p* and 140*p* correspond to a ripple counter 30*p*.

For convenience of description, the clock control circuit 750 and the clock input circuit 760 are omitted in FIG. 44 but may be implemented similarly as described in reference to FIGS. 38, 39, 40 41, and 42. Alternatively, the present invention may also be practiced with other configurations so that the first and second input clock signals CLKI1 and CLKI2 are appropriately selected among the clock signals CLKC1, CLKC1*b*, CLKC2 and CLKC2*b*.

As described in above embodiments, the first counting unit 110*p* is a first clock buffer, and the second counting unit 120*p* is a second clock buffer. The first clock buffer 110*p* has a data terminal D receiving the first input clock signal CLKI1, a clock terminal CK receiving the comparison signal CMP indicating the termination time point Te of the counting operation, and an output terminal Q outputting the first buffered clock signal D0.

The second clock buffer 120*p* has a data terminal D receiving the second input clock signal CLKI2, a clock terminal CK receiving the comparison signal CMP indicating the termination time point Te of the counting operation, and an output terminal Q outputting the second bit signal D[1]. The ripple counter 30*p* including the third and fourth counting units 130*p* and 140*p* generates the most significant bit signals D[2] and D[3] that are sequentially toggling.

The third and fourth counting units 130*p* and 140*p* of the ripple counter 30*p* are implemented with a plurality of flip-flops that are cascade-coupled. Each of such flip-flops are configured similarly in an example embodiment of the present invention. As an example, a circuit diagram of the second and third counting units 120*p* and 130*p* in the counter 100*p* of FIG. 44 with the up-down conversion operation is described in reference to FIG. 45.

Figures 45, 46:
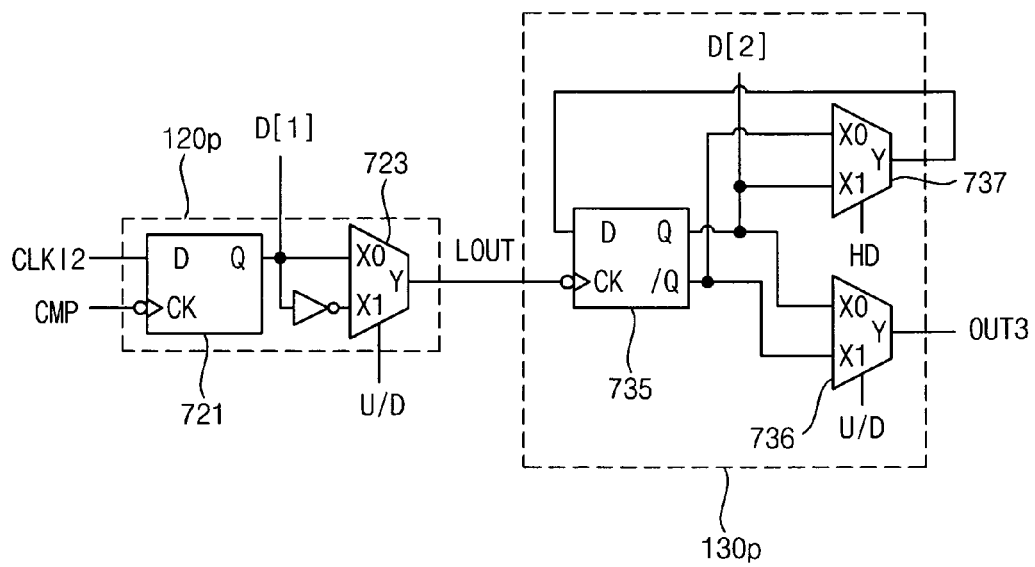
FIG. 45 is a circuit diagram of a second counting unit and a third counting unit in the counter of FIG. 44, according to an example embodiment of the present invention.
FIG. 46 is a table illustrating a counting operation with an up-down conversion function of the counter of FIG. 44, according to an example embodiment of the present invention.

In FIG. 45, the second counting unit 120*p* includes a second clock buffer 721 and an output multiplexer 723. The third counting unit 130*p* includes a flip-flop 735, an output multiplexer 736, and a feedback multiplexer 737. The output multiplexer 723 of the second counting unit 120*p* selects one of the second bit signal D[1] and the inversion /D[1] of the second bit signal D[1] in response to the up-down control signal U/D to generate the latch output signal LOUT to the third counting unit 130*p* of the ripple counter 30*p*.

The output multiplexer 736 of the third counting unit 130*p* selects one of the non-inversion output terminal Q and the inversion output terminal /Q in response to the up-down control signal U/D to generate the output signal OUT3 to the fourth counting unit 140*p*. Each of the second, third, and fourth counting units 120*p*, 130*p*, and 140*p* includes a respective output multiplexer.

Such multiple output multiplexers of the counting units 120*p*, 130*p*, and 140*p* form an up-down control unit that controls the up-counting and the down-counting of the counter 100*p*. The up-down control unit selects one of the non-inversion output terminal Q and the inversion output terminal /Q of the previous counting unit to generate an output signal to the next counting unit, thereby controlling the up-counting and the down-counting of the counter 100*p*.

For example, when the up-down control signal U/D is logic high, the inversion /D[1] of the second bit signal D[1] is selected as the latch output signal LOUT, and the signals of the inversion output terminals /Q are selected as the output signals OUT3 and OUT4. As a result, the counter 100*p* performs the down-counting operation. When the up-down control signal U/D is logic low, the first bit signal D[1] is selected as the latch output signal LOUT, and the signals of the non-inversion output terminals Q are selected as the output signals OUT3 and OUT4. As a result, the counter 100*p* performs the up-counting operation.

The feedback multiplexer 737 selectively connects one of the inversion output terminal /Q and the non-inversion output terminal Q to the data terminal D in response to the hold signal HD. For example, when the hold signal HD is logic low, the inversion output terminal /Q is connected to the data terminal D such that the flip-flop toggles in response to falling edges of the latch output signal LOUT.

When the hold signal HD is logic high, the non-inversion output terminal Q is connected to the data terminal D such that the flip-flop 735 maintains the stored value regardless of the edges of the latch output signal LOUT. The feedback multiplexer is included for preventing bit errors that occur during the up-down conversion operation.

The flip-flop 735 generates the third bit signal D[2] toggling in response to the latch output signal LOUT. The flip-flop 735 of FIG. 45 is negative-edge triggered, and the output signal OUT3 corresponds to the third bit signal D[2]. The present invention may also be practiced with the flip-flop 735 being positive-edge triggered such that the output signal OUT3 corresponds to the inversion /D[2] of the third bit signal D[2].

FIG. 46 shows a table of bit values of the count for describing a counting operation with an up-down conversion function in the counter 100*p* of FIG. 44. FIG. 46 shows bit values of the first buffered clock signal D0, the second bit signal D[1], and the least significant bit D[0] of the count for a first count (e.g., the down-counting operation) and for a first edge counting of a second count (e.g., the up-counting operation). As mentioned above, the least significant bit D[0] is generated by performing an XOR operation on the first buffered clock signal D0 and the second bit signal D[1].

Also FIG. 46 shows selection of the first and second input clock signals CLKI1 and CLKI2 depending on the result of the first count, for preventing bit errors due to up-down conversion. When the first counting operation is a down-counting operation, the phase of the first input clock signal CLKI1 lags behind the phase of the second input clock signal CLKI2 as described in reference to FIG. 14. Accordingly, the second clock signal CLKC2 is selected as the first input clock signal CLKI1, and the first clock signal CLKC1 is selected as the second input clock signal CLKI2, for the down counting operation.

When the first buffered clock signal D0 is 0 and the second bit signal D[1] is 0 at the termination time point of the down counting operation, the clock selection for the subsequent up-counting operation is the same as the second counting operation of FIG. 41D. Accordingly, the first clock signal CLKC1 is selected as the first input clock signal CLKI1, and the second clock signal CLKC2 is selected as the second input clock signal CLKI2, for the up-counting operation.

When the first buffered clock signal D0 is 0 and the second bit signal D[1] is 1 at the termination time point of the down counting operation, the clock selection for the subsequent up-counting operation is the same as the second counting operation of FIG. 41A. Accordingly, the second clock signal CLKC2 is selected as the first input clock signal CLKI1, and the first inversion clock signal CLKC1b is selected as the second input clock signal CLKI2, for the up-counting operation.

When the first buffered clock signal D0 is 1 and the second bit signal D[1] is 1 at the termination time point of the down counting operation, the clock selection for the subsequent up-counting operation is the same as the second counting operation of FIG. 41B. Accordingly, the first inversion clock signal CLKC1b is selected as the first input clock signal CLKI1, and the second inversion clock signal CLKC2b is selected as the second input clock signal CLKI2, for the up-counting operation.

When the first buffered clock signal D0 is 1 and the second bit signal D[1] is 0 at the termination time point of the down counting operation, the clock selection for the subsequent up-counting operation is the same as the second counting operation of FIG. 41C. Accordingly, the second inversion clock signal CLKC2b is selected as the first input clock signal CLKI1, and the first clock signal CLKC1 is selected as the second input clock signal CLKI2, for the up-counting operation.

In this manner, the bit errors of DDS due to the up-down conversion is prevented by selecting the first and second input clock signals CLKI1 and CLKI2 among the clock signals CLKC1, CLKC1b, CLKC2 and CLKC2b, based on the first and second buffered clock signals D0 and D[1] after the first counting operation is terminated and before the second counting operation is performed.

Figure 47:
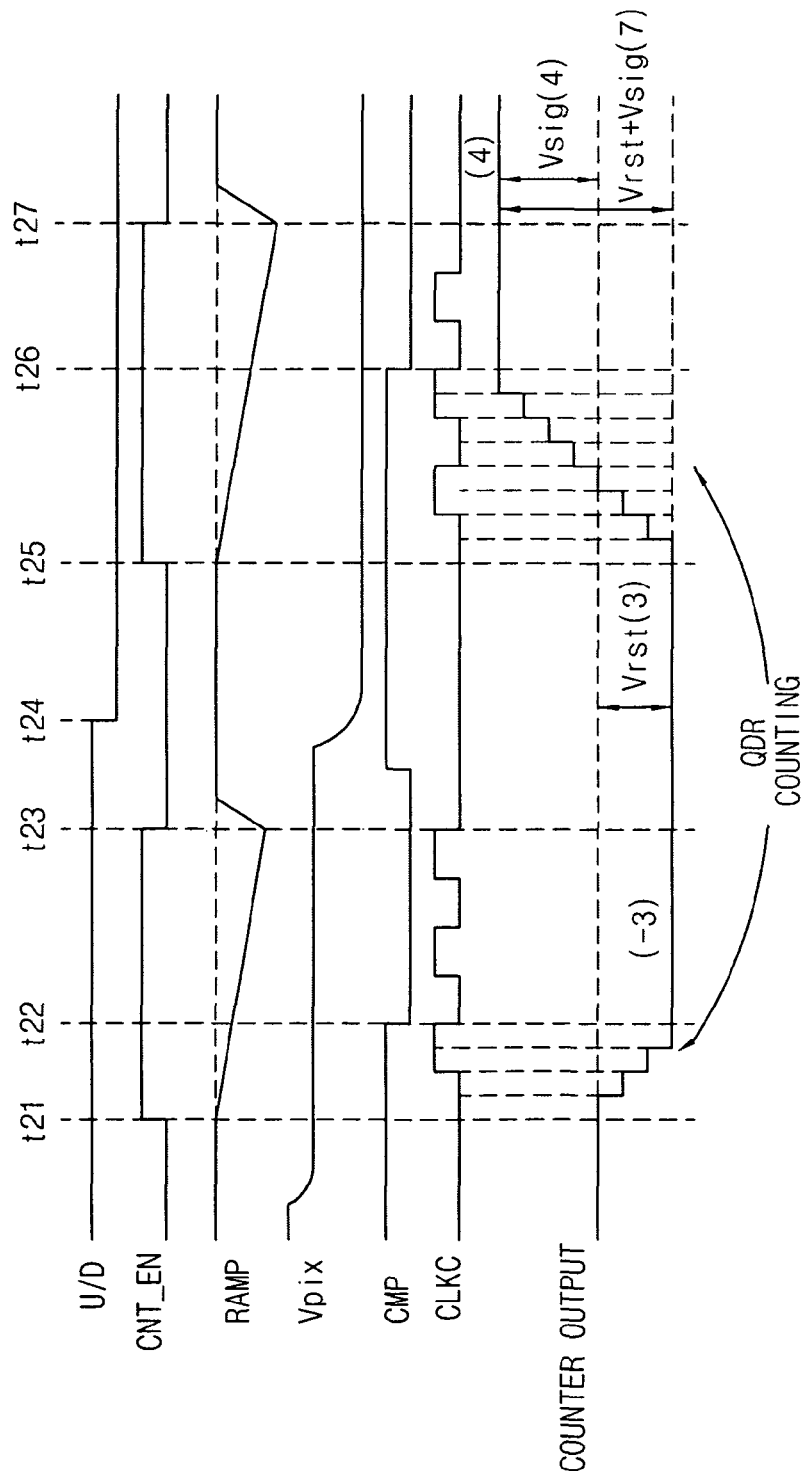
FIG. 47 is a timing diagram of signals during a CDS operation in the image sensor of FIG. 22 including the counter of FIG. 44, according to an example embodiment of the present invention.

FIG. 47 is a timing diagram of signals during a CDS operation in the image sensor 600 of FIG. 22 with the MDR counter 700 being implemented similarly as the counter 100p of FIG. 44. FIG. 47 illustrates each MDR counter performing a DDS operation for a respective column. Descriptions of similar operations as already described in reference to FIG. 35 are omitted.

In FIG. 47, the image sensor 600 performs DDS using the QDR counter 100p with the up-down conversion function for enhanced operation speed and operation margin of the image sensor 600 with reduced power consumption. Each of the first counting operation (t21 to t22) and the second counting operation (t25 to t26) is performed by QDR counting such that counting is executed four times per cyclic period of the clock signal CLKC. Furthermore, the QDR counter 100p with the up-down conversion function is configured to prevent bit errors due to DDS for further enhanced performance of the image sensor 600.

In this manner, the MDR counter of example embodiments of the present invention enhances operation speed and operation margin and reduces power consumption in any device and/or system using such a MDR counter. For example, such an MDR counter is amenable for use in electronic devices such as an image sensor, a digital camera, etc., which requires fast operation speed and low power consumption.

The foregoing is by way of example only and is not intended to be limiting. Any number of elements as illustrated and described herein is by way of example only. For example, an octuplet data rate counter may be implemented by buffering and latching three different clock signals until a termination time point. Such variations are not to be regarded as a departure from the intended spirit and scope of example embodiments, and all such modifications as would be obvious to one skilled in the art are intended to be included within the scope of the following claims. The present invention is limited only as defined in the following claims and equivalents thereof.

What is claimed is:

1. A counter comprising:
a buffer unit configured to generate a least significant signal of a count by buffering at least one clock signal until a termination time point, wherein said buffer unit includes a buffer circuit that is configured to generate said least significant signal having a same frequency as said at least one clock signal and that is configured as a latch to be controlled by an input signal that is different from said at least one clock signal,
wherein said least significant signal is not fed back for controlling a logic level of said least significant signal; and
a ripple counter configured to generate at least one other signal of the count by sequentially toggling in response to said least significant signal.

2. The counter of claim 1, wherein the buffer unit includes:
a clock buffer configured to buffer a clock signal to generate said least significant signal of the count.

3. The counter of claim 2, wherein the ripple counter includes:
at least one flip flop configured to sequentially toggle in response to said least significant signal to generate said other signal of the count.

4. The counter of claim 3, wherein each flip flop of the ripple counter is one of a negative edge-triggered flip flop or a positive edge-triggered flip flop.

5. The counter of claim 1, wherein the count is up-counting or down-counting.

6. The counter of claim 1, wherein the buffer unit includes:
a first clock buffer configured to buffer a first clock signal to generate a first buffered clock signal; and
a second clock buffer configured to buffer a second clock signal to generate a second buffered clock signal, wherein the first clock signal is phase-shifted from the second clock signal;
and wherein the counter further includes:
a logic unit configured to generate said least significant signal from the first and second buffered clock signals;
and wherein one of the first and second buffered clock signals is said other signal of the count.

7. The counter of claim 6, wherein the ripple counter includes:
at least one flip flop configured to sequentially toggle in response to said other signal of the count to generate another signal of the count.

8. The counter of claim 7, wherein each flip flop of the ripple counter is one of a negative edge-triggered flip flop or a positive edge-triggered flip flop.

9. The counter of claim 6, wherein the count is up-counting with said other signal of the count lagging one of the first and second buffered clock signals.

10. The counter of claim 6, wherein the count is down-counting with said other signal of the count preceding one of the first and second buffered clock signals.

11. A counter comprising:
a buffer unit configured to generate a least significant signal of a count by buffering at least one clock signal having a frequency; and
a ripple counter configured to generate at least one other signal of the count by sequentially toggling in response to said least significant signal,
wherein said buffer unit includes a latch circuit configured to generate said least significant signal having a same frequency as said at least one clock signal and controlled by an input signal that is different from said at least one clock signal,
wherein said least significant signal is not fed back for controlling a logic level of said least significant signal; and
wherein the count is updated multiple times every period of the clock signal to form a multiple data rate (MDR) counter.

12. The counter of claim 11, wherein the buffer unit includes:
a clock buffer configured to buffer a clock signal to generate said least significant signal of the count;
and wherein the ripple counter includes:
at least one flip flop configured to sequentially toggle in response to said least significant signal to generate the other signal of the count,
and wherein the count is updated twice every period of the clock signal to form a double data rate (DDR) counter.

13. The counter of claim 11, wherein the buffer unit includes:
a first clock buffer configured to buffer a first clock signal to generate a first buffered clock signal; and
a second clock buffer configured to buffer a second clock signal to generate a second buffered clock signal, wherein the first clock signal is phase-shifted from the second clock signal;
and wherein the counter further includes:
a logic unit configured to generate said least significant signal from the first and second buffered clock signals;
and wherein one of the first and second buffered clock signals is said other signal of the count;
and wherein the ripple counter includes:
at least one flip flop configured to sequentially toggle in response to said other signal of the count to generate another signal of the count.

14. The counter of claim 13, wherein the first and second buffered clock signals are phase-shifted by 90° with the count being updated four-times every period of the clock signal to form a quadruple data rate (QDR) counter.

15. A data converter comprising:
a reference generator for generating a reference signal indicating a start time point;
a comparator for comparing the reference signal with a measured image signal to generate a termination signal indicating a termination time point; and
a counter for counting from the start time point to the termination time point, the counter including:
a buffer unit configured to generate a least significant signal of a count by buffering at least one clock signal from the start time point until the termination time point, wherein said buffer unit includes a buffer circuit that is configured to generate said least significant signal having a same frequency as said at least one clock signal and that is configured as a latch to be controlled by an input signal that is different from said at least one clock signal,
wherein said least significant signal is not fed back for controlling a logic level of said least significant signal; and
a ripple counter configured to generate another signal of the count by sequentially toggling in response to said least significant signal.

16. The data converter of claim 15, wherein the buffer unit includes:
a clock buffer configured to buffer a clock signal to generate said least significant signal of the count;
and wherein the ripple counter includes:
at least one flip flop configured to sequentially toggle in response to said least significant signal to generate said other signal of the count,
and wherein the count is updated twice every period of the clock signal to form a double data rate (DDR) counter.

17. The data converter of claim 15, wherein the buffer unit includes:
a first clock buffer configured to buffer a first clock signal to generate a first buffered clock signal; and
a second clock buffer configured to buffer a second clock signal to generate a second buffered clock signal;
and wherein the counter further includes:
a logic unit configured to generate said least significant signal from the first and second buffered clock signals;
and wherein one of the first and second buffered clock signals is said other signal of the count;
and wherein the ripple counter includes:
at least one flip flop configured to sequentially toggle in response to said other signal of the count to generate another signal of the count;
and wherein the first and second buffered clock signals are phase-shifted by 90° with the count being updated four-times every period of the clock signal to form a quadruple data rate (QDR) counter.

18. An image sensor comprising:
a pixel array having an plurality of pixels, each pixel generating a respective pixel signal;
an analog-to-digital converter for converting the respective pixel signal into a digital signal; and
an image signal processor for processing said digital signal;
wherein the analog-to-digital converter includes:
a reference generator for generating a reference signal indicating a start time point;
a comparator for comparing the reference signal with the pixel signal to generate a termination signal indicating a termination time point; and
a counter for counting from the start time point to the termination time point to generate the digital signal, the counter including:
a buffer unit configured to generate a least significant signal of the digital signal by buffering at least one clock signal from the start time point until the termination time point;
wherein said buffer unit includes a latch circuit configured to generate said least significant signal having a same frequency as said at least one clock signal and controlled by an input signal that is different from said at least one clock signal,
wherein said least significant signal is not fed back for controlling a logic level of said least significant signal; and a ripple counter configured to generate another signal of the digital signal by sequentially toggling in response to said least significant signal.

19. The image sensor of claim 18, further comprising:
an analog correlated double sampling (CDS) unit that generates the pixel signal that is a difference between a respective reset signal and a respective measured image signal generated by the pixel; and
a latch that stores the digital signal output by the counter at the termination time point.

20. The image sensor of claim 18, further comprising:
a first latch that stores a first digital signal output by the counter at a first termination time point generated when the pixel signal is a reset signal; and
a second latch that stores a second digital signal output by the counter at a second termination time point generated when the pixel signal is a measured image signal,
wherein the image signal processor determines a difference between the first and second digital signals for digital correlated double sampling.

21. The image sensor of claim 18, wherein said counter is formed for a respective column of said pixel.

22. The image sensor of claim 18, wherein the counter is configured to count from a first start time point to a first termination time point to generate a first digital signal that is inverted after the first termination time point to generate a negative digital signal, and wherein the counter is configured to count during a second start time point to a second termination time point starting from the inverted digital signal to generate a second digital signal, and wherein the first termination time point corresponds to the pixel signal being a reset signal and the second termination time point corresponds to the pixel signal being a measured image signal.

23. The image sensor of claim 22, further comprising:
a clock input circuit that generates said at least one clock signal buffered by the buffer unit depending on said least significant signal and according to time periods defined by the first and second termination time points for preventing bit error.

24. The image sensor of claim 22, wherein the buffer unit includes:
a clock buffer configured to buffer a clock signal to generate said least significant signal of the count;
and wherein the ripple counter includes:
at least one flip flop configured to sequentially toggle in response to said least significant signal to generate the other signal of the count,
and wherein the count is updated twice every period of the clock signal to form a double data rate (DDR) counter.

25. The image sensor of claim 22, wherein the buffer unit includes:
a first clock buffer configured to buffer a first clock signal to generate a first buffered clock signal; and
a second clock buffer configured to buffer a second clock signal to generate a second buffered clock signal;
and wherein the counter further includes:
a logic unit configured to generate said least significant signal from the first and second buffered clock signals;
and wherein one of the first and second buffered clock signals is said other signal of the count;
and wherein the ripple counter includes:
at least one flip flop configured to sequentially toggle in response to said other signal of the count to generate another signal of the count;
and wherein the first and second buffered clock signals are phase-shifted by 90° with the count being updated four-times every period of the clock signal to form a quadruple data rate (QDR) counter.

26. The image sensor of claim 18, wherein the counter is configured to count up or down from a first start time point to a first termination time point to generate a first digital signal, and wherein the counter is configured to count in an opposite direction after the first termination time point to a second termination time point from the first digital signal to generate a second digital signal, and wherein the first termination time point corresponds to the pixel signal being a reset signal and the second termination time point corresponds to the pixel signal being a measured image signal.

27. The image sensor of claim 26, further comprising:
a clock input circuit that generates said at least one clock signal buffered by the buffer unit depending on said least significant signal and according to time periods defined by the first and second termination time points for preventing bit error.

28. The image sensor of claim 26, wherein the buffer unit includes:
a clock buffer configured to buffer a clock signal to generate said least significant signal of the count;
and wherein the ripple counter includes:
at least one flip flop configured to sequentially toggle in response to said least significant signal input by the ripple counter to generate said other signal of the count,
and wherein the count is updated twice every period of the clock signal to form a double data rate (DDR) counter.

29. The image sensor of claim 26, wherein the buffer unit includes:
a first clock buffer configured to buffer a first clock signal to generate a first buffered clock signal; and
a second clock buffer configured to buffer a second clock signal to generate a second buffered clock signal;
and wherein the counter further includes:
a logic unit configured to generate said least significant signal from the first and second buffered clock signals;
and wherein one of the first and second buffered clock signals is said other signal of the count;
and wherein the ripple counter includes:
at least one flip flop configured to sequentially toggle in response to said other signal of the count to generate another signal of the count;
and wherein the first and second buffered clock signals are phase-shifted by 90° with the count being updated four-times every period of the clock signal to form a quadruple data rate (QDR) counter.

30. The image sensor of claim 18, wherein the image sensor is a CIS (CMOS image sensor).

* * * * *